United States Patent [19]

Miyata et al.

[11] Patent Number: 5,200,967
[45] Date of Patent: Apr. 6, 1993

[54] OPTICAL FREQUENCY DEVIATION MEASURE AND CONTROL DEVICE FOR LASER LIGHT

[75] Inventors: Hideyuki Miyata; Hiroshi Onaka, both of Kawasaki, Japan

[73] Assignee: Fujitsu Limited, Kawasaki, Japan

[21] Appl. No.: 763,513

[22] Filed: Sep. 20, 1991

[30] Foreign Application Priority Data

Sep. 20, 1990 [JP] Japan ................... 2-248955
Mar. 14, 1991 [JP] Japan ................... 3-049712
Mar. 14, 1991 [JP] Japan ................... 3-049930

[51] Int. Cl.⁵ ............................................. H01S 3/13
[52] U.S. Cl. ................................. 372/32; 372/28
[58] Field of Search ................ 372/32, 26, 29, 31, 372/28, 33

[56] References Cited

U.S. PATENT DOCUMENTS

| | | | |
|---|---|---|---|
| 3,898,583 | 8/1975 | Shuey | 372/29 |
| 4,237,427 | 12/1980 | Holland | 372/29 |
| 4,243,952 | 1/1981 | Patterson | 372/29 |

FOREIGN PATENT DOCUMENTS 0336308 10/1989 Italy .
55-95384 7/1980 Japan .
1-164135 6/1989 Japan .

OTHER PUBLICATIONS

Kamey, et al., "Stabilisation of Oscillation Frequency of an AlGaAs/GaAs Ridge Waveguides Distributed Feedback Laser," Electronic Letters, vol. 23, No. 5, pp. 245-246, Feb. 26, 1987.
Nakamura, et al., "Frequency-Stabilised LD Module With A Z-Cut Quartz Fabry-Perot Resonator For Coherent Communication," Electronic Letters, vol. 26, No. 6, pp. 405-406, Mar. 15, 1990, GB.
Hong, et al., "Simultaneously Stabilization of the Frequency and Output Power of Semiconductor Laser for Coherent Optical Fiber Communication Systems", Proceedings of the Tencon 87 (1987 IEEE Region 10 Conference), vol. 2, pp. 739-743, Aug. 28-29, 1987, Seoul, Korea.
Glance, et al., "Frequency Stabilisation of FDM Optical Signals," Electronics Letters, vol. 23, No. 14, pp. 750-751, Jul. 2, 1987, Stevenage, GB.
Nosu, et al., "Optical FDM Transmission Technique," Journal of Lightwave Technology, vol. 5, No. 9, pp. 1301-1308, Sep. 1981, New York, USA.

Primary Examiner—Léon Scott, Jr.
Attorney, Agent, or Firm—Staas & Halsey

[57] ABSTRACT

The operating point is stabilized at the MAX or the MIN of its optical frequency discriminating characteristic. Under the stabilized operating point, the detected difference between the average of the light intensity and a set value is fed back to a data modulator so that the average value converges on a set value when a predetermined optical frequency deviation is produced. The operating point is also stabilized at the MED of said characteristic. Under the stabilized operating point, a low-frequency signal component is extracted from an electric signal output by means of synchronous detection. The operating point is stabilized at the MAX or the MIN of said characteristic. Under the stabilized operating point, a low-frequency signal component is twice in frequency by means of synchronous detection. In the fourth and fifth aspects, means such as synchronous detection is not required for the stabilization control of an operating point.

41 Claims, 38 Drawing Sheets $\Delta f < \dfrac{FSR}{2}$ $\Delta f = \dfrac{FSR}{2}$ $\Delta f > \dfrac{FSR}{2}$ MAGNITUDE OF THE OPTICAL FREQUENCY
DEVIATION $\Delta f$ in 12A < 12B < 12C

OPTICAL FREQUENCY DEVIATION MEASURE AND CONTROL DEVICE FOR LASER LIGHT

BACKGROUND OF THE INVENTION

The present invention relates to an optical frequency deviation measure and control device for a laser light which is used in the field s of communication and measurement utilizing modulation of laser light and controls the semiconductor laser so that the optical frequency deviation of laser light subjected to frequency or phase modulation with an input modulating signal.

DESCRIPTION OF THE RELATED ART

Direct optical frequency modulation of semiconductor a laser light has come into use recently for communication and measurement. For example, in the field of communication, optical communication systems in which optical data for transmitting to a transmission line is produced by direct frequency modulation of laser light are being put into practice. One of the systems is a coherent optical communication system based on frequency shift keying (FSK) using coherent light. In the FSK system, data modulation (FSK modulation) is performed so that the optical output frequency of a semiconductor laser is shifted to a first optical frequency f1 or a second optical frequency f2 by two logic values 1 and 0 of data to be transmitted. In this case, in order to obtain a high reception sensitivity, it is required to make the optical frequency deviation constant.

The FM modulation efficiency (the variation of optical frequency per unit current of a semiconductor laser) varies with aging change of the bias current of a semiconductor laser itself or aging deterioration of an optical module containing the laser. In the case of optical frequency-division multiplex (FDM) transmission, in particular, in which the bias of a semiconductor laser at the transmitting end is controlled for automatic frequency control (AFC), the FM modulation efficiency varies to a large extent as a result of a change of the bias. Thus, the modulation index, i.e., the deviation of the first and second optical frequencies f1 and f2 from the central optical frequency f0, will deviate from its initial set value even if the semiconductor laser is modulated with an equal drive current. The deviation of the modulation index will considerably deteriorate the reception sensitivity at the receiving end in the optical communication system.

The present invention is directed to an optical frequency deviation measure and control device for a laser light which causes no such deviation. The present invention is also applicable to an optical measurement system using coherent light.

The technique of performing direct optical frequency modulation on a semiconductor laser has appeared quite recently. There is no concept of measurement and control of the optical frequency deviation of a semiconductor laser. No established prior art therefor has been known yet.

SUMMARY OF THE INVENTION

It is an object of the present invention to provide an optical frequency deviation measure and control device for a laser light which is simple in construction, small in size and inexpensive.

It is the other object of the present invention to provide an optical frequency deviation measure and control device for a laser light which permits automatic frequency control (AFC) and automatic output control (APC) simultaneously at a transmitting end and also permits more than one laser to be controlled at the transmitting end. The device does not depend on the mark factor, needs no high-speed circuit and is useful for FDM transmission in particular.

According to a first aspect of the present invention, an optical frequency deviation measure and control device for a laser light comprises: an interferometer responsive to output light of a semiconductor laser for outputting interference light depending on its optical frequency discriminating characteristic;

an optical receiver responsive to application of the interference light for converting it to an electric signal;

operating point setting means responsive to application of the electric signal for setting the operating point of the interferometer to correspond to an optical frequency corresponding to a maximum value or a minimum value of its optical frequency discriminating characteristic; and deviation detecting means responsive to application of the electric signal from the optical receiver for detecting the average value of the light intensity and feeding a component indicating the difference between the average value and a constant optical frequency deviation back to a data modulator.

According to a second aspect of the present invention, an optical frequency deviation measure and control device for a laser light comprises: an interferometer responsive to application of output light from the semiconductor laser for outputting interference light depending on its optical frequency discriminating characteristic;

operating point setting means responsive to application of an electric signal for setting the operating point of the interferometer to correspond to an optical frequency corresponding to the median of its optical frequency discriminating characteristic; and optical frequency deviation detecting means for extracting a low-frequency signal component of the average light output intensity of the interference light which has been low-frequency modulated beforehand under the operating point from the electric signal by means of synchronous detection to detect an optical frequency deviation.

According to a third aspect of the present invention, an optical frequency deviation measure and control device for a laser light comprises:

an interferometer responsive to application of output light of the semiconductor laser for outputting interference light depending on its optical frequency characteristic;

an optical receiver responsive to application of the interference light for converting its light intensity to an electric signal;

operating point setting means for extracting a low-frequency component of the interference light which has been low-frequency modulated from the electric signal by means of synchronous detection to detect the operating point of the interferometer and setting the operating point to correspond to an optical frequency corresponding to a maximum value or a minimum value of the optical frequency discriminating characteristic;

and optical frequency deviation detecting means for extracting the low-frequency signal component produced under the operating point from the electric signal by means of synchronous detection to detect an optical frequency deviation.

According to the fourth aspect of the present invention, an optical frequency deviation measure and control device for a laser light comprises:

a light interference unit responsive to laser light subjected to frequency or phase modulation based on input data and inserted with first polarizer for outputting interference light dependent on the optical frequency discriminating characteristic;

a first λ/4 plate and a second polarizer both responsive to reflected light from said light interference unit and positioned sequentially;

a first and second optical receivers each responsive to two types of light emitted from said second polarizer for converting light intensity to an electrical signal;

a feedback unit for permitting the oscillating frequency of the interfering characteristic of said light interference unit to be fed back so that the operating point of said laser light corresponds to the optical frequency corresponding to the maximum or minimum value of said optical frequency discriminating characteristic according to the information of the difference in electrical signals between said first and second optical receivers;

a third optical receiver responsive to transmitted light from said light interference unit for converting the light intensity to an electrical signal;

and under the stabilizing control of the operating point of said laser light by said feedback unit, an optical frequency deviation measure for detecting the deviation of optical frequency from an average value of the light intensity of said transmitted light obtained based on the electrical signal provided by said third optical receiver; and an optical frequency deviation stabilizer for calculating the difference between said average value and predetermined value and feeding the result back to the modulation factor of said laser light.

According to the fifth aspect of the present invention, a modulation an optical frequency deviation measure and control unit for a laser light comprises:

a light interference unit responsive to laser light subjected to frequency or phase modulation based on input data and inserted with a secondary λ/4 plate for outputting interference light dependent on the optical frequency discriminating characteristic;

a first λ/4 plate and a second polarizer both responsive to reflected light from said light interference unit and positioned sequentially;

a first and second optical receivers each responsive to two types of light emitted from said second polarizer for converting light intensity to an electrical signal;

a feedback unit for permitting the oscillation frequency of the interfering characteristic of said light interference unit to be fed back so that the operating point of said laser light corresponds to the optical frequency corresponding to the maximum or minimum value of said optical frequency discriminating characteristic according to the information of the difference in electrical signals between said first and second optical receivers;

a third optical receiver responsive to transmitted light from said light interference unit;

a third optical receiver responsive to at least one type of light from said third polarizer for converting the light intensity of said light to a electrical signal;

and under the stabilizing control of the operating point of said laser light by said feedback unit, an optical frequency deviation measure for detecting the deviation of optical frequency from an average value of the light intensity of said transmitted light obtained based on the electrical signal provided by said third optical receiver; and an optical frequency deviation stabilizer for calculating the difference between said average value and predetermined value and feeding the result back to the modulation factor of said laser light.

According to above these aspects of the present invention, there is no need for wideband optical receiver and electronic circuits. Thus, the optical frequency deviation measure and control device for a laser light can be made small in size, simple in construction and inexpensive.

In addition, as a result of the feedback to the bias or the temperature of the laser and the stabilization of the operating point, APC and AFC can be performed simultaneously at the transmitting end and two or more semiconductor lasers at the transmitting end can be controlled. And, the dependence on mark rate and the need for high-speed circuits are eliminated. Further, using a signal having a steep gradient, this permits a considerable measure of the S/N ratio in the optical frequency deviation control.

In the fourth and fifth aspects of the present invention, the stabilization of the operating point of laser light can be controlled without other controlling operation such as synchronous detection, etc.

The above described aspects of the present invention can be applicable to an optical communication system in an FDM method. In this case, each operating point of each laser light (central optical frequency) can be assigned as a maximum or minimum value of a plurality of points in optical frequency discriminating characteristics. As a result, an operating point of laser light in the FDM transmission system can be positioned at exact and equal intervals on the optical frequency axis.

BRIEF DESCRIPTION OF THE DRAWINGS

Further objects and advantages of the present invention will be apparent from the following description of preferred embodiments of the present invention with reference to the accompanying drawings, in which.

DESCRIPTION OF THE PREFERRED EMBODIMENTS

Explaining of the Principles

Figure 1:
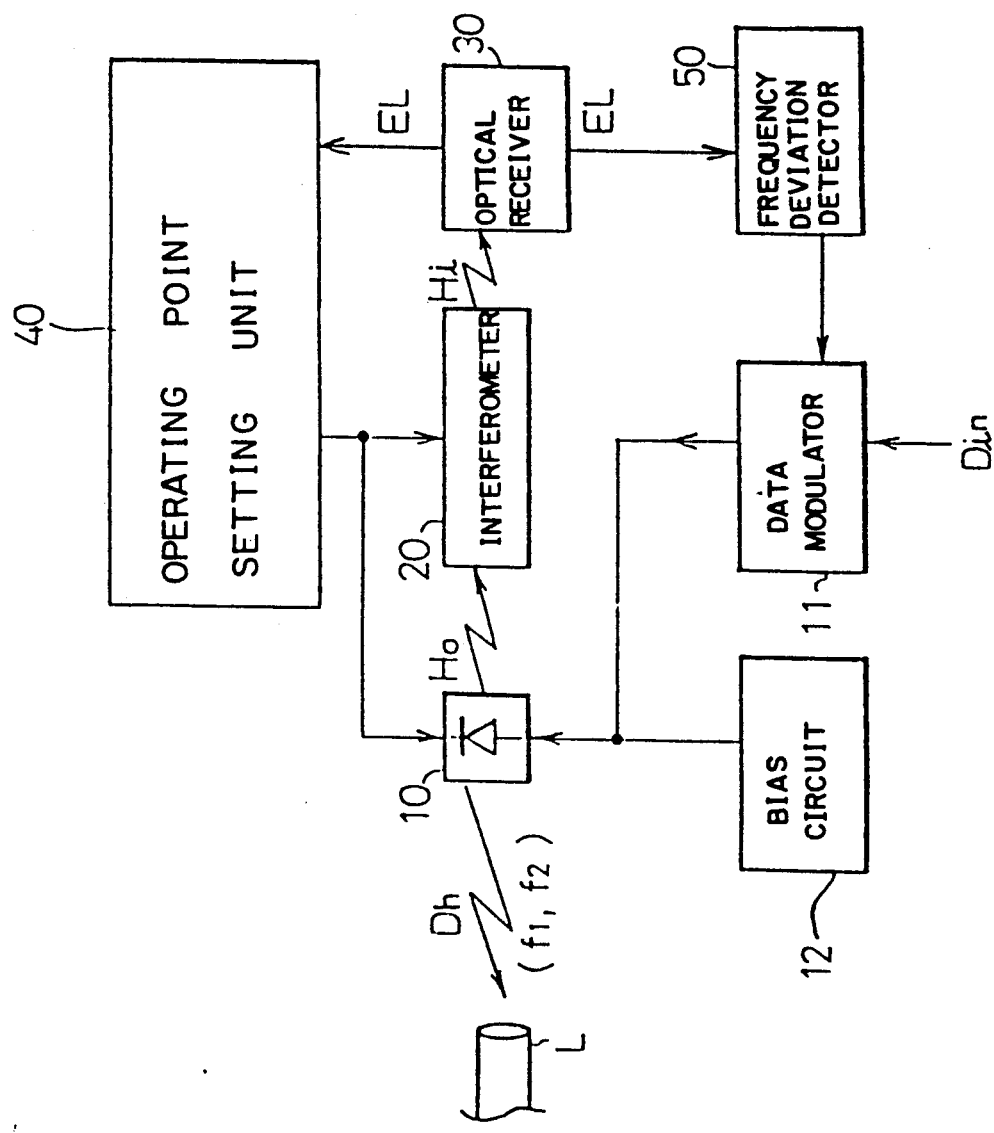
FIG. 1 is a basic block diagram of a first aspect of the present invention.

FIG. 1 is a basic block diagram of a an optical frequency deviation measure and control device for a laser light according to a first aspect of the present invention.

In FIG. 1, the forward light of a semiconductor laser 10 is transmitted to a transmission line L as light data Dh. A control signal may be extracted from the forward light. The light data Dh is subjected to optical frequency modulation (f1, f2) or phase modulation in accordance with logic levels 1 and 0 of data Din to be transmitted. The modulation with data Din is performed by a data modulator 11. A well-known bias circuit 12 is provided for performing the modulation under the optimum drive conditions.

Constituent elements 20, 30, 40 and 50 other than the elements 10, 11 and 12 constitute the measure and control device of the present invention. The measure and control device operates in response to reception of output light Ho of the semiconductor laser 10, for example, its backward light. As shown, the measure and control device is comprised of an interferometer 20, an optical receiver 30, an operating point setting means 40 and a frequency deviation detector 50.

The interferometer 20 receives the output light Ho of the semiconductor laser 10 and outputs interference light Hi in accordance with its optical frequency discriminating characteristics.

The optical receiver 30 receives the interference light Hi and converts its intensity to an electric signal EL.

The operating point setting means 40 receives the electric signal EL and sets the operating point of the interferometer 20 in such a way that the operating point always corresponds with the maximum value or the minimum value of the optical frequency discriminating characteristics.

The deviation detector 50 receives the electric signal EL output from the optical receiver 30 under the stabilized operating point and detects the average value of the light intensity. A difference between the average value and a set value corresponding to the fixed optical frequency deviation is fed back to the data modulator 11.

The principle of the operation of the optical frequency deviation and control device for a laser light according to the first aspect of the present invention is based on the two following points:

(1) stabilizing the operating point of the interferometer to correspond with the maximum optical frequency or the minimum optical frequency of the optical frequency discriminating characteristics of the interferometer; and (2) under the stabilized operating point, detecting the average value of the light intensity of the interference light Hi and feeding the average value back to the data modulator 11 so as to allow the average value to converge to a set value of the light intensity when a predetermined optical frequency deviation is produced.

The operations of (1) and (2) are mainly performed by the operating setting means 40 and the deviation detector 50, respectively.

Figure 2:
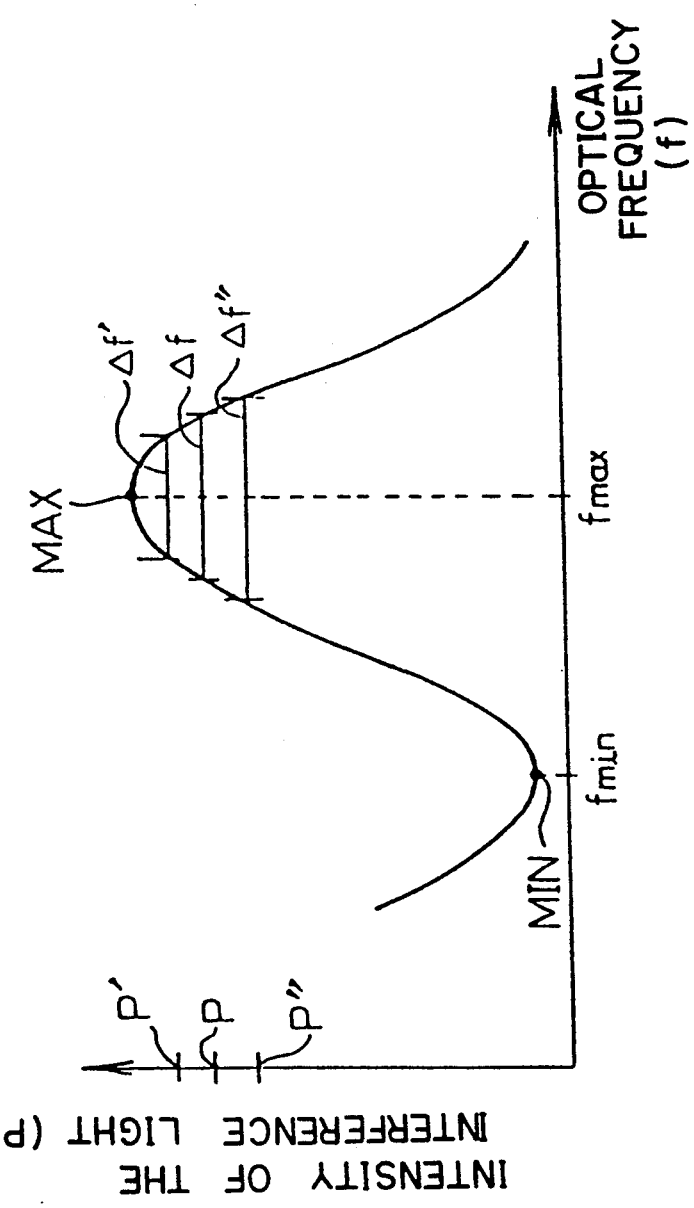
FIG. 2 is a graph of optical frequency discriminating characteristics of the optical interferometer of FIG. 1.

FIG. 2 is a graph of the optical frequency discriminating characteristic of the interferometer. In the graph, the abscissa indicates the optical frequency, i.e., the operating frequency of the interferometer 20 and the ordinate indicates the intensity P of the interference light Hi from the interferometer 20. As the interferometer 20, any of Fabry-Perot interferometer, Michelson interferometer and Mach-Zehnder interferometer, etc., are applicable which are all well known. The graph indicates the frequency discriminating characteristic observed by the Mach-Zehnder interferometer.

In general, the optical frequency discriminating characteristic displays a sinusoidal variation of the light intensity with the variation of the optical frequency. The graph in FIG. 2 indicates part of the characteristic. As shown, the light intensity assumes the maximum value MAX and the minimum value MIN. The optical frequencies which allow the light intensity to assume the maximum value MAX and the minimum value MIN are fmax and fmin, respectively. In the present invention, the operating point (the central optical frequency f0 between the first and second optical frequencies f1 and f2) is set so as to always maintain either of the maximum and minimum values of the light intensity. That is, the operating frequency of the interferometer 20 is set to fmax or fmin.

Now, let us consider the optical frequency deviation Δf of the first and second optical frequencies f1 and f2 from the central optical frequency f0 with the operating frequency as fmax. When Δf, like Δf' in FIG. 2, is smaller than the predetermined deviation Δf, the light intensity P' of the interference light Hi resulting from Δf' is greater than the predetermined light intensity P resulting from Δf. Conversely, when Δf, like Δf'' in FIG. 2, is larger than Δf, the light intensity P'' resulting from Δf'' is smaller than the predetermined light intensity P from Δf.

In this case, both ends of Δf, Δf' and Δf'' correspond to the first and second frequencies f1 and f2. Actually, each of the transitions from f1 to f2 and f2 to f1 takes place along the curve of the graph of FIG. 2. Thus, it becomes possible to monitor the optical frequency deviation in terms of the average value Pav of the light intensity P.

Figure 3:
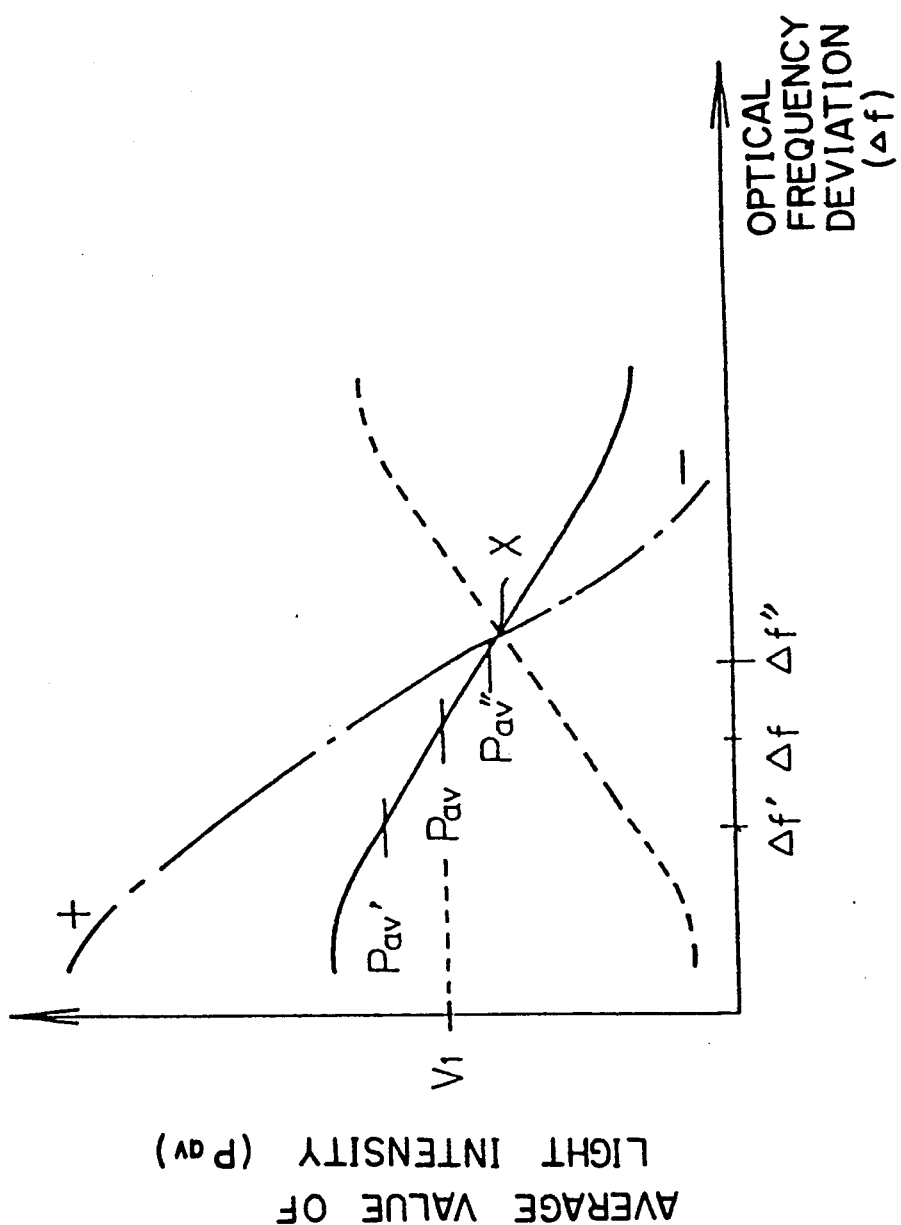
FIG. 3 is a graph illustrating a relationship between average value of light intensity and optical frequency deviation.

FIG. 3 is a graph illustrating average value of light intensity versus optical frequency deviation. In the graph, a solid line indicates the relationship when the operating point is set at the maximum value MAX as in the above example, while the chain line indicates the relationship when the operating point is set as the minimum value MIN. In the case where the operating point is set at the maximum value MAX as in the above example in FIG. 2, while the optical frequency deviation Δf becomes smaller (Δf') or larger (Δf''), the average value Pav of the light intensity becomes larger (Pav'') or smaller (Pav').

Figure 4:
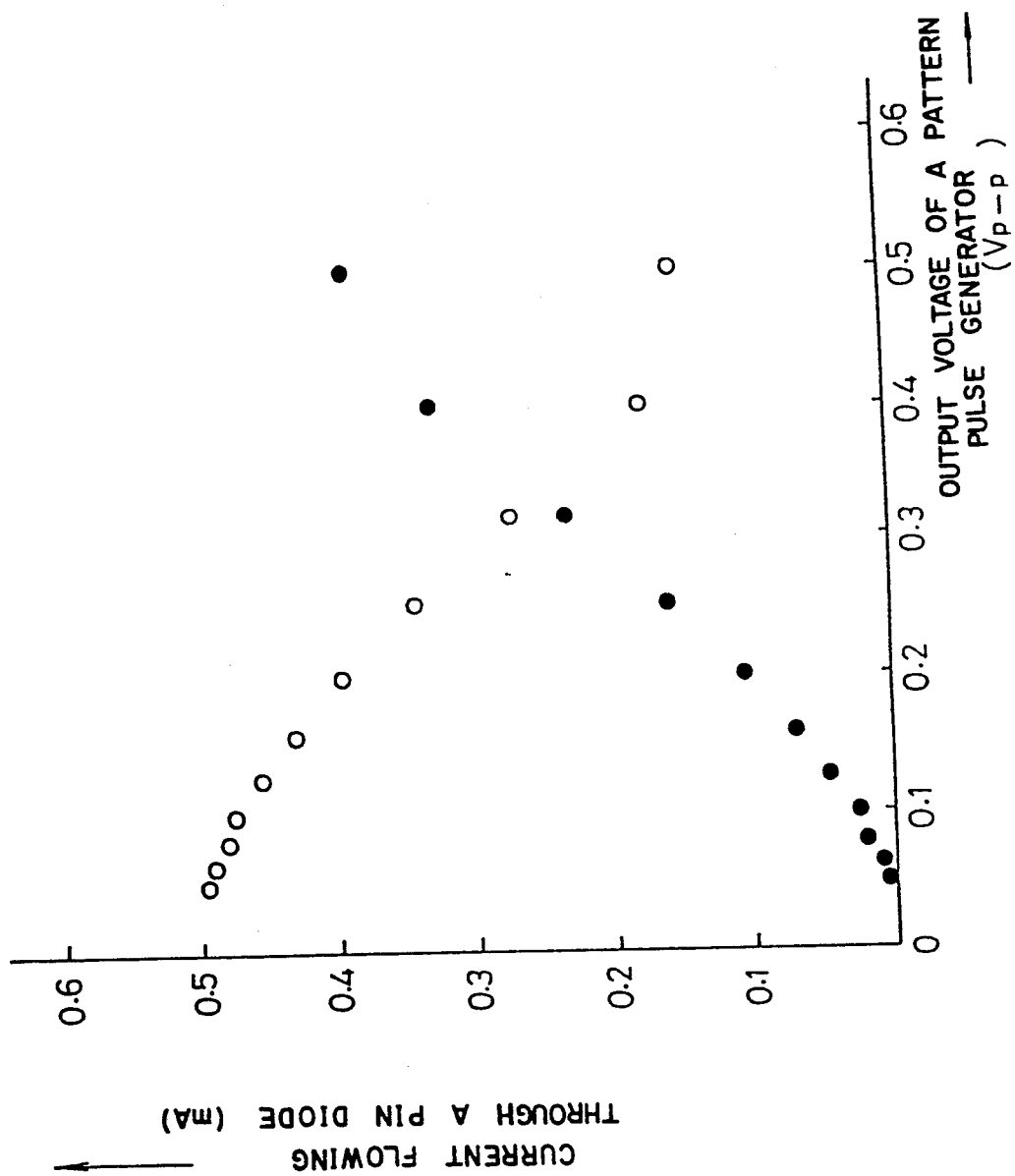
FIG. 4 illustrates experimental data for substantiating that the graph of FIG. 3 can be obtained.

FIG. 4 shows experimental data for substantiating that the graph of FIG. 3 can be obtained. In the graph, the abscissa indicates the output voltage of a pattern pulse generator which corresponds to the modulation current to a laser diode for simulating the optical frequency deviation, while the ordinate indicates the current flowing through a PIN diode for simulating the average value of the light intensity. In this graph, the curve plotted by white dots corresponds to the characteristic indicated by the solid line in FIG. 3, while the curve indicated by black dots corresponds to the characteristic indicated by the broken line in FIG. 3.

In the device of FIG. 1, the operating point setting means 40 is provided by taking account of the graph of FIG. 2, while the deviation detector 50 is provided by taking account of the graph of FIG. 3. The feature of the present invention is to use the light intensity of the interference light Hi as a control variable and treat only low-frequency components of the light intensity. Thus, the measure and control device according to the first aspect of the present invention may be a device which is simple in construction and operates at a very low frequency.

Figure 5:
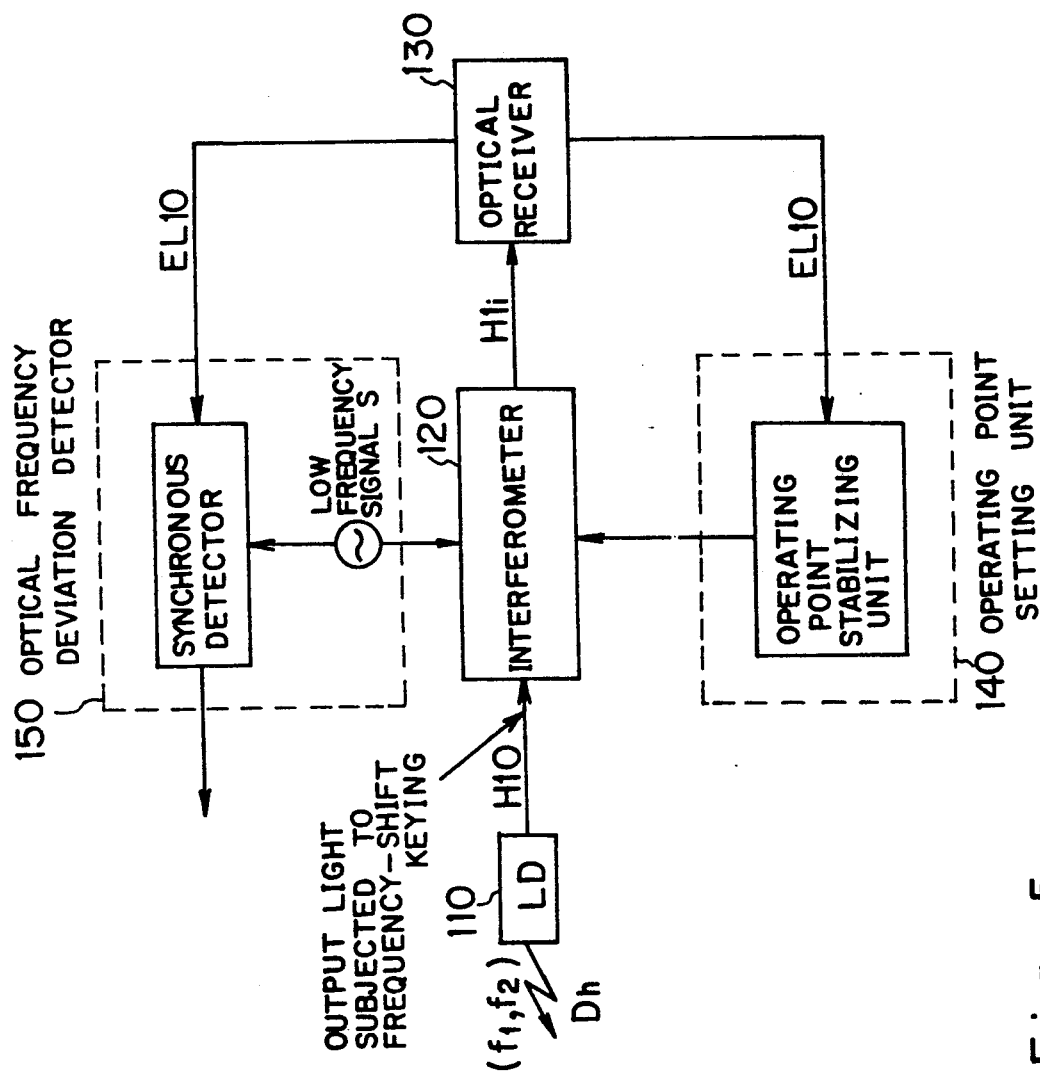
FIG. 5 is a basic block diagram of a second aspect of the present invention.

FIG. 5 is a basic block diagram of an optical frequency deviation measure and control device for a laser light according to a second aspect of the present invention.

In the figure, a semiconductor laser 110 outputs output light H10 having its optical frequency shifted to a first optical frequency f1 and a second optical frequency f2 in accordance with logic levels 1 and 0 of a high-rate modulating signal. That is, the output light of the semiconductor laser is subjected to frequency-shift keying.

The optical frequency deviation measure and control device for a laser light according to the second aspect of the present invention operates in response to reception of FSK modulated output light H10 from the semiconductor laser 110 and, as shown, comprises an interferometer 120, an optical receiver 130, an operating point setting means 140 and an optical frequency deviation detector 150.

The interferometer 120 is responsive to the output light H10 of the semiconductor laser 110 to output interference light H1i depending on its optical frequency discriminating characteristics.

The optical receiver 1 30 receives the interference light H1i and converts its light intensity to an electric signal EL10.

The operating point setting means 140 receives the electric signal EL10 and sets the operating point of the interferometer 120 so that it corresponds to the optical frequency corresponding to the value which is midway between the maximum value and the minimum value of the optical frequency discriminating characteristic.

The optical frequency deviation detector 150 extracts a low frequency signal component of the average light output intensity of the interference light H1i which has been modulated with a low frequency in advance under the operating point from the electric signal EL10 by means of synchronous detection and detects an optical frequency deviation.

The principle of the operation of the optical frequency deviation measure and control device for a laser light according to the second aspect of the present invention is based on the two following points:

(1) stabilizing the operating point of the interferometer 120 at the optical frequency corresponding to the value which is the median value between the maximum value and the minimum value of its optical frequency discriminating characteristic; and (2) under the stabilized operating point, extracting a low-frequency signal component of the average light output intensity of the interference light H1i which is output modulated with a low frequency in advance from the interferometer by means of synchronous detection of the electric signal EL10 from the optical receiver 130 with a low frequency signal and detecting an optical frequency deviation from the synchronous-detected output signal.

The operations (1) and (2) are mainly performed by the operating point setting means 140 and the optical frequency deviation detector 1 50, respectively, as will be described below in more detail.

First, of the operating point will be described.

Figure 6A:
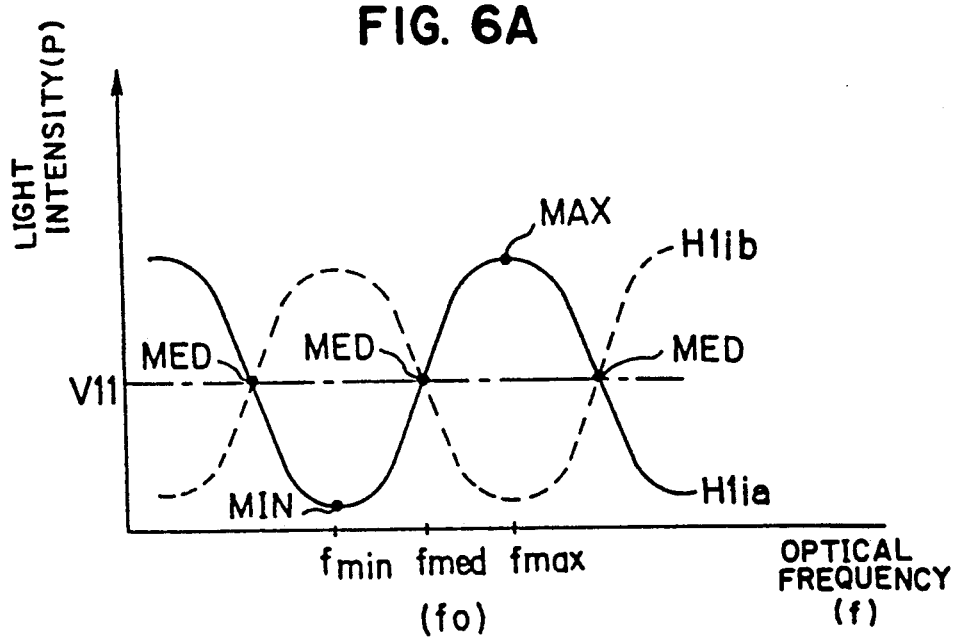
FIGS. 6(a)-6(b) illustrate optical frequency discriminating characteristics of the Mach-Zehnder interferometer, more specifically, A illustrates optical frequency discriminating characteristics of two interference light waves and B is a graph illustrating the result of subtraction of the two interference light waves.

FIG. 6A is a graph illustrating the optical frequency discriminating characteristic of the interferometer 120. In the graph, the abscissa indicates the operating frequency of the interferometer and the ordinate indicates the light intensity P of the interference light H1i from the interferometer 120. The interference light H1i contains two components H1i-a and H1ib which are complementary to each other. In FIG. 6A, the solid curve indicates the optical frequency discriminating characteristic of the interference light component H1ia and chain line indicates the same characteristic of the interference light component H1ib. As the interferometer 120 in the device according to the second aspect, any of the Fabry-Perot interferometer, the Michelson interferometer, the Mach-Zehnder interferometer, etc. are applicable, which are all well known. The graph of FIG. 6A indicates the optical frequency discriminating characteristic of the Mach-Zehnder interferometer.

As shown, the light intensity assumes the maximum value MAX and the minimum value MIN. The optical frequency producing the maximum value MAX is fmax, while the optical frequency producing the minimum value MIN is fmin. In the present invention, the operating point (the central optical frequency f0 between the first and second optical frequencies f1 and f2) is set to correspond to the median value MED (frequency fmed) of the maximum and minimum values at all times.

Figure 6B:
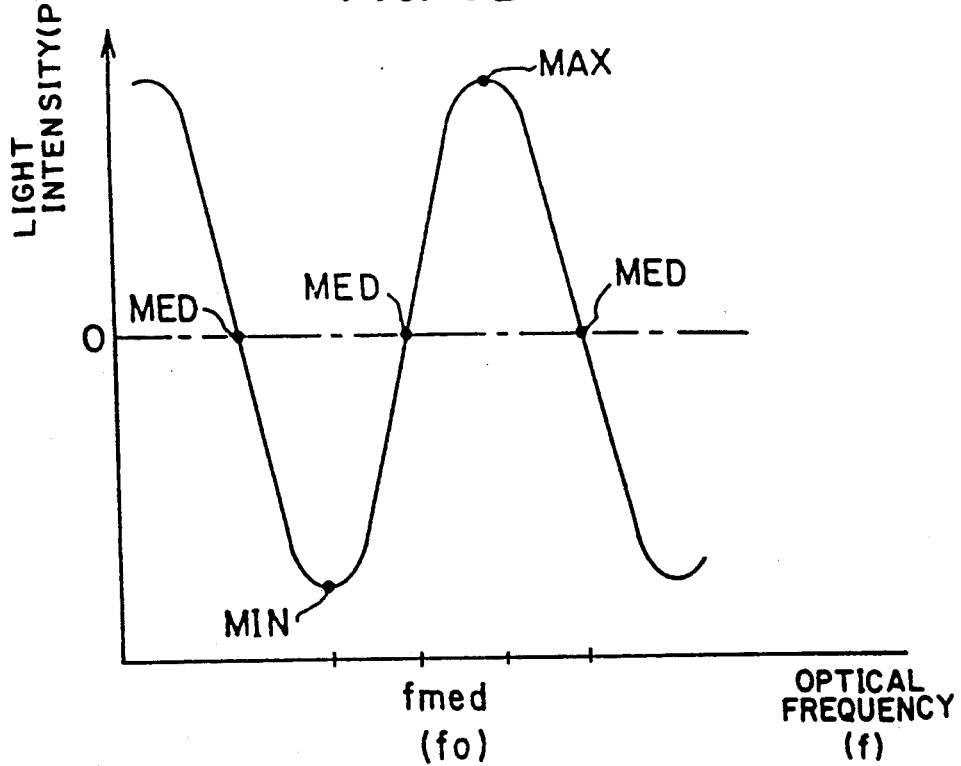

The addition of the two interference light components H1ia and H1ib, which are complementary to each other, will produce a flat output as indicated by a chain line in FIG. 6A. The flat output is proportional to the light output of the semiconductor laser 110. On the other other hand, the subtraction of the two complementary components H1ia and H1ib will double the amplitude as shown in FIG. 6B and the resultant output crosses the zero point at the median value MED, i.e., the operating point. Thus, by controlling the bias or temperature of the semiconductor laser 110 or the interferometer 120 so that the signal resulting from the subtraction of the complementary interference light components H1ia and H1ib becomes zero at all times, the operating point is allowed to stay at the median value MED of the optical frequency discriminating characteristic.

Next, the detection of the optical frequency deviation will be described.

It is supposed here for the purpose of simplifying description that the output light H10 of the semiconductor laser 110 has been subjected to ideal FSK modulation of a mark rate of ½. The mark rate refers to the ratio between 1s and 0s in a modulating signal. If a 1 and a 0 each occur at equal probability, then the mark rate will be ½. If the ratio between 1s and 0s is 1 to 3, then the mark rate will be ¼. The ideal FSK modulation means that the transition time between the first optical frequency f1 and the second optical frequency f2 is infinitesimal.

Figure 7A:
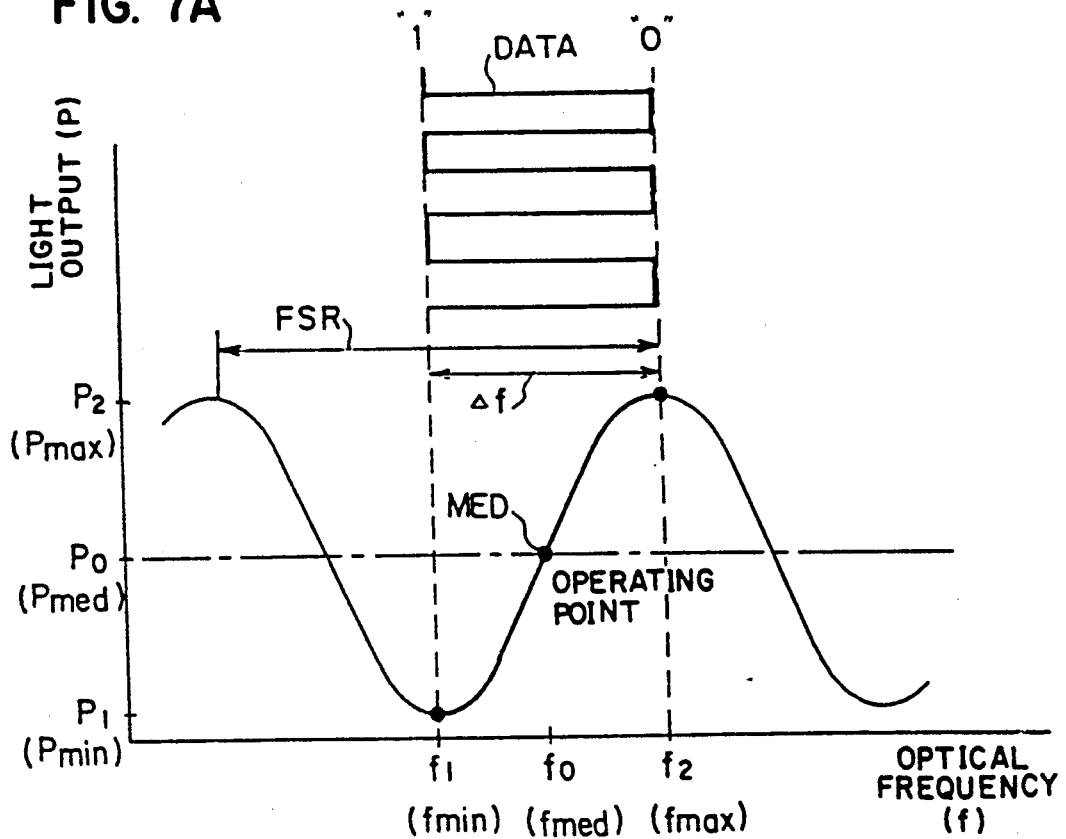
FIGS. 7(a)-7(c) illustrate optical frequency discriminating characteristics of the Mach-Zehnder interferometer, more specifically, A illustrates the characteristic when the operating point is stabilized at the central value, B illustrates the characteristics when the operating point is shifted to the right, and C illustrates the characteristics when the operating point is shifted to the left.
Figure 7B:
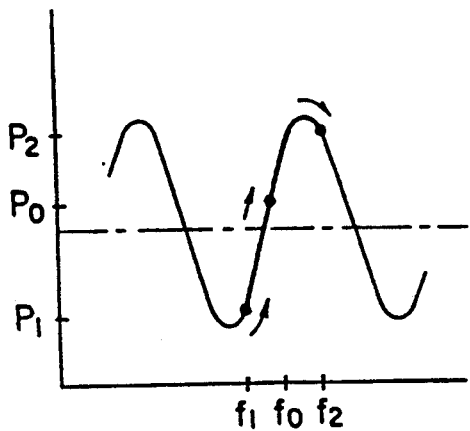
Figure 7C:
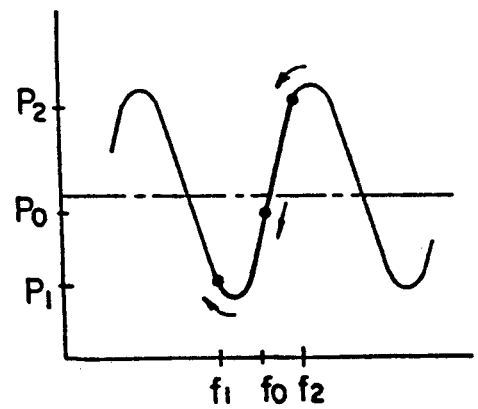

The operating point is stabilized at the median value MED of the optical frequency discriminating characteristic as described above. This state is shown in FIG. 7A. For convenience, the optical frequency deviation $\Delta f$ is set such as $\Delta f = FSR/2$. Here, FSR refers to the optical frequency difference between adjacent maximum (minimum) values of the optical frequency discriminating characteristic in a free spectral range. The light output is varied with a low-frequency signal with the operating point stabilized at the median value MED. If, as shown in FIG. 7B, the operating point shifts to the right, each of the optical frequencies f1 and f2 will also shift to the right. Consequently, the light output P1 at the optical frequency f1 increases, while the optical output P2 at the optical frequency f2 decreases. If, as shown in FIG. 7C, the operating point shifts to the left, each of the optical frequencies f1 and f2 will also shift to the left. Consequently, the light output P1 at the optical frequency f1 increases, while the optical output P2 at the optical frequency f2 decreases. The variations in the optical outputs P1 and P2 are observed as variations in the average light output intensity from the interferometer 120. Here, a variation occurs in the phase and amplitude of the varying average light output intensity from the interferometer 120, depending on the magnitude of the optical frequency deviation $\Delta f$ ($=f1-f2$), which will be described below.

Figure 8A:
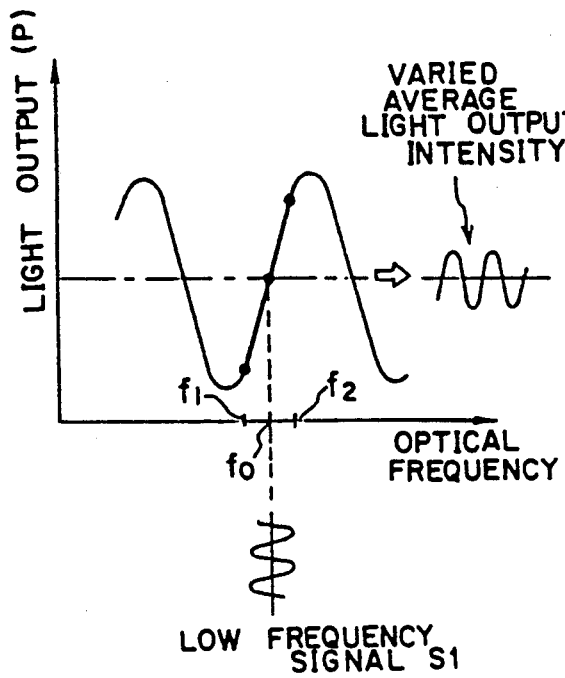
FIGS. 8(a)-8(c) illustrate variations in average light output when the operating point is shifted, A corresponds to the case where $\Delta f < FSR/2$, B corresponds to the case where $\Delta f = FSR/2$ and C corresponds to the case where $\Delta f > FSR/2$.

FIG. 8A shows the case where $\Delta f$ is smaller than FSR/2. In the figure, when the operating point is shifted to the right by a low-frequency signal S1, the optical frequencies f1 and f2 shift to the right, so that the light outputs at f1 and f2 increase. When the operating point is shifted to the left, the optical frequencies f1 and f2 shift to the left, so that the light outputs decrease. Thus, the average light output intensity will vary as shown at the right of the figure.

Figure 8B:
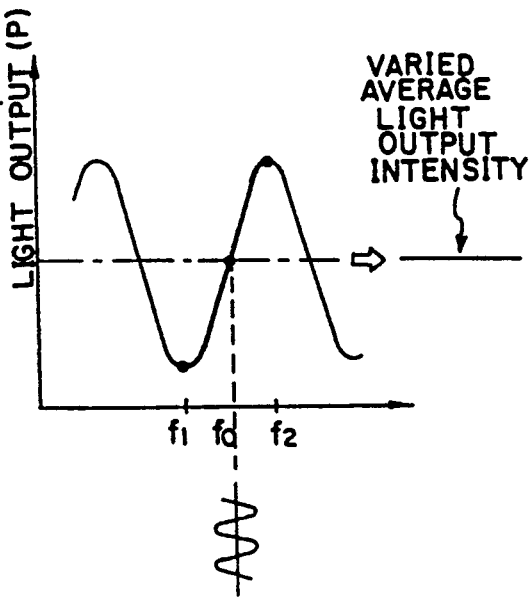

FIG. 8B shows the case where $\Delta f = FSR/2$. In this case, since f1 and f2 shift on a complementary basis as also shown in FIG. 7B, the increment and decrement of the light output are equal to each other. Thus, although the operating point is changed with a low-frequency signal S1, there is no variation in the average light output intensity as shown at the right of FIG. 8B.

Figure 8C:
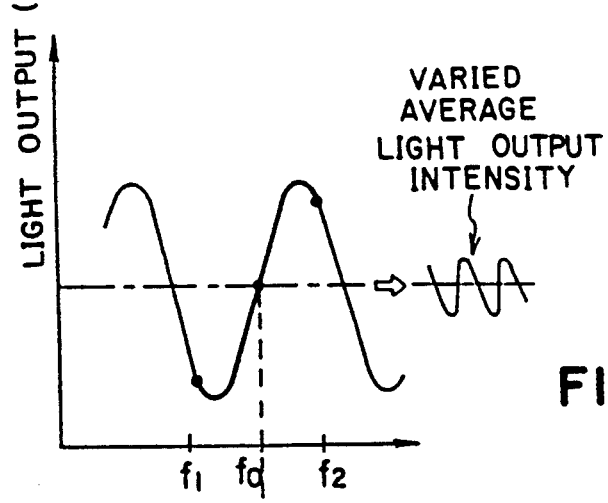

FIG. 8C shows the case where $\Delta f > FSR/2$. In the figure, when the operating point is shifted to the right by a low-frequency signal S1, the optical frequencies f1 and f2 shift to the right, so that the light outputs at f1 and f2 decrease. When the operating point is shifted to the left, on the other hand, the optical frequencies f1 and f2 shift to the left, so that the light outputs at f1 and f2 increase. Thus, the average light output intensity will vary as shown at the right of the figure. The variation in the average light output intensity in FIG. 8C in which $\Delta f > FSR/2$ is opposite in phase to that in FIG. 8A in which $\Delta f < FSR/2$.

As described above, the amplitude and phase of the variation in the average light output intensity vary according to the magnitude of the optical frequency deviation $\Delta f$. Therefore, the conversion of the average light output intensity from the interferometer 120 to an electric signal in the optical receiver 130 and the synchronous detection of the electric signal with the low-frequency signal S1 permit the magnitude of the optical frequency deviation $\Delta f$ to be obtained.

Figure 9:
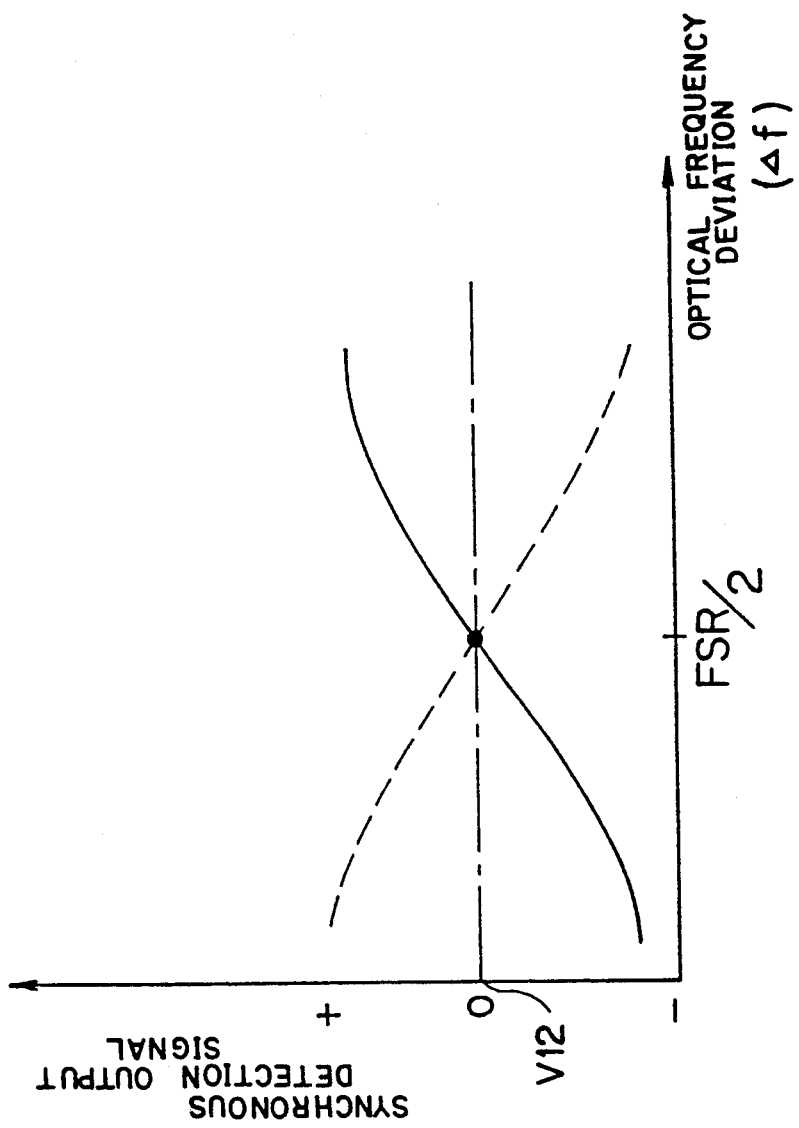
FIG. 9 is a graph illustrating optical frequency deviation versus synchronous detector output signal.

FIG. 9 shows optical frequency deviation $\Delta f$ versus synchronous detection output signal of the average light output intensity. Either the signal indicated by a solid line or the output signal indicated by a chain line is output depending on the phase of a reference signal for synchronous detection indicating which of positive and negative slopes of the optical frequency discriminating characteristic curve the operating point is set on. Here, the deviation of the synchronous detection output signal from zero represents the deviation of the optical frequency deviation $\Delta f$ from FSR/2. When $\Delta f = FSR/2$, the synchronous detection signal is zero. Thereby, if the synchronous detection output signal is measured, the value of the optical frequency deviation $\Delta f$ will be measured. Thus, it will be seen that it is possible to measure and control the optical frequency deviation.

In the device of FIG. 5, the operating point setting means 140 is provided taking account of the graph of FIG. 6 and the optical frequency deviation detector 150 is provided taking account of the graph of FIG. 9. The feature of the present invention is to use the light intensity of the interference light H1i as a control variable and handle only a low-frequency component of the light intensity. Therefore, the measure and control device according to the second aspect of the present invention may be a device which is simple in construction and operates at a very low frequency.

Figure 10:
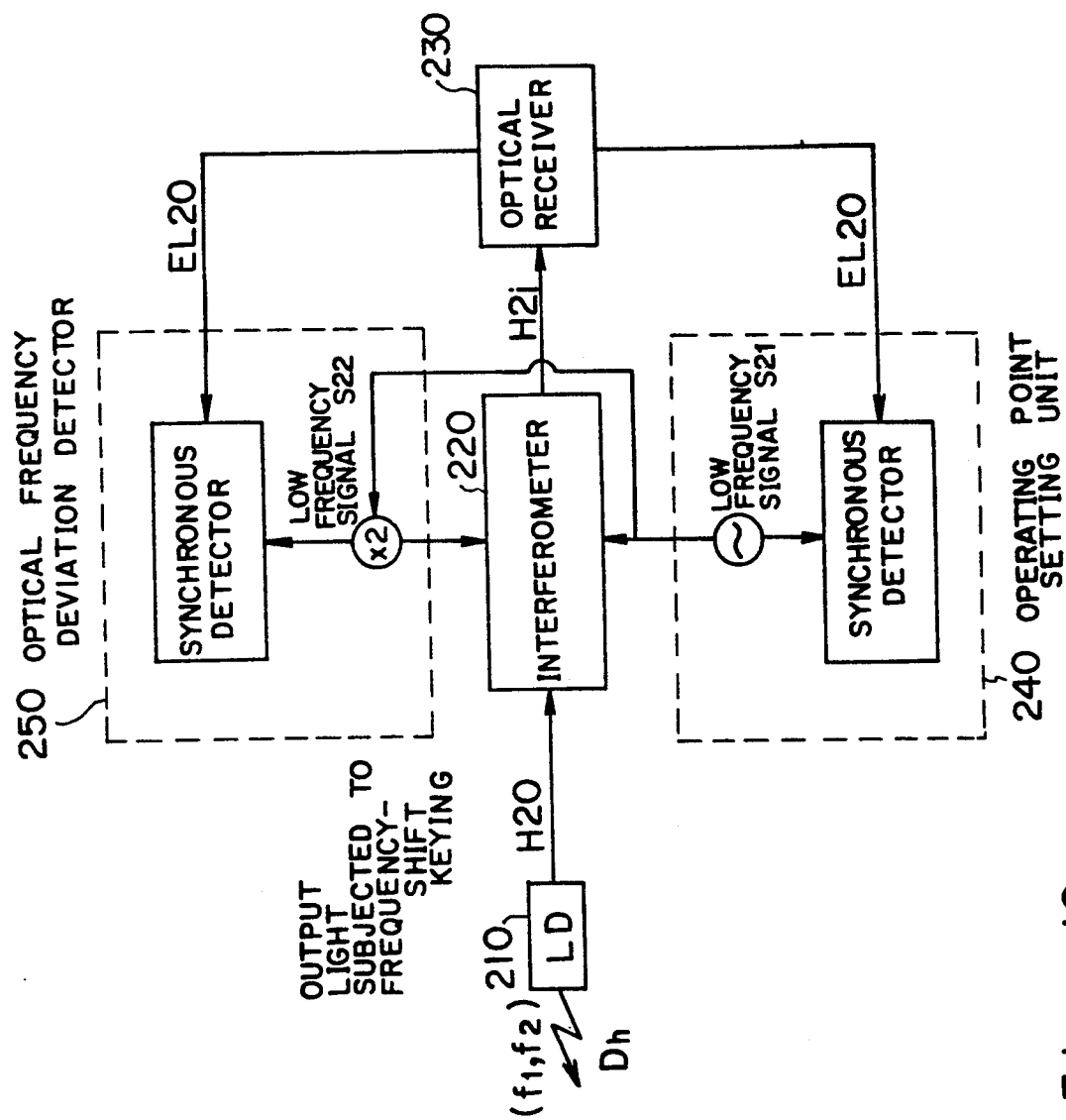
FIG. 10 is a basis block diagram of a third aspect of the present invention.

FIG. 10 is a basic block diagram of an optical frequency deviation measure and control device for a laser light according to a third aspect of the present invention.

In the figure, a semiconductor laser 210 outputs output light H20 having its optical frequency shifted to a first optical frequency f1 and a second optical frequency f2 according to logic levels 1 and 0 of a high-speed modulating signal.

The measure and control device according to the third aspect of the present invention operates in response to the FSK modulated output light H20 from the semiconductor laser 210 and, as shown, comprises an interferometer 220, an optical receiver 230, an operating point setting means 240 and an optical frequency deviation detector 250.

The interferometer 220 is responsive to the output light H20 of the semiconductor laser 210 to output interference light H2i depending on its optical frequency discriminating characteristics.

The optical receiver 230 receives the interference light H2i and converts its light intensity to an electric signal EL20.

The operating point setting means 240 detects the operating point of the interferometer 220 by extracting from the electric signal EL20 a low-frequency signal of the interference signal H2i which has been low-frequency modulated by means of synchronous detection and sets the operating point of the interferometer 220 so that it corresponds to the optical frequency corresponding to the maximum value or minimum value of the optical frequency discriminating characteristic.

The optical frequency deviation detector 250 extracts a low frequency signal component produced under the operating point from the electric signal EL20 by means of synchronous detection and detects an optical frequency deviation.

The principle of the operation of the an optical frequency deviation measure and control device for a laser light according to the third aspect of the present invention is based on the two following points:

(1) stabilizing the operating point of the interferometer 220 at the optical frequency corresponding to the maximum or minimum value of the optical frequency discriminating characteristic of the interferometer 220; and (2) under the stabilized operating point, extracting a low-frequency signal component S22 which is twice a low-frequency signal S21 of the average light output intensity of the interference light H2i which is output, modulated with a low frequency in advance, from the interferometer 220 by means of synchronous detection of the electric signal EL20 from the optical receiver 230 and detecting an optical frequency deviation from the synchronous-detected output signal.

The operations (1) and (2) are mainly performed by the operating point setting means 240 and the optical frequency deviation detector 250, respectively, as will be described below in more detail.

First, the setting of the operating point will be described.

Figure 11A:
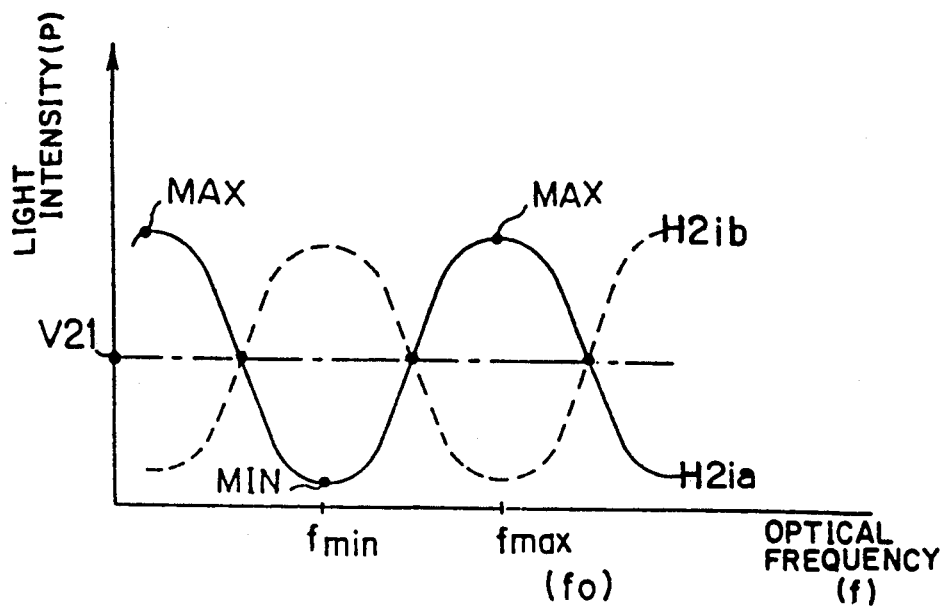
FIGS. 11(a)-11(b) illustrate optical frequency discriminating characteristics of the interferometer, more specifically, A illustrates optical frequency discriminating characteristics of two interference light waves and B is a graph illustrating the result of subtraction of the two interference light waves.

FIG. 11A is a graph illustrating the optical frequency discriminating characteristic of the interferometer 220. In the graph, the abscissa indicates the optical frequency input to the interferometer 220 and the ordinate indicates the light intensity P of the interference light H2i from the interferometer 220. The interference light H2i contains two complementary components H2i$a$ and H2i$b$. In FIG. 11A, the solid line indicates the optical frequency discriminating characteristic of the interference light component H2i$a$ and the chain line indicates the like characteristic of the interference light component H2i$b$. As the interferometer 220, any of the Fabry-Perot interferometer, the Michelson interferometer, the Mach-Zehnder interferometer, etc. are applicable, which are all well known. The graph of FIG. 11 A indicates the optical frequency discriminating characteristic of the Mach Zehnder interferometer.

As shown, the light intensity assumes the maximum value MAX and the minimum value MIN. The optical frequency producing the maximum value MAX is fmax, while the optical frequency producing the minimum value MIN is fmin. In the present invention, the operating point (the optical frequency f0 which is median value between the first and second optical frequencies f1 and f2) is set to correspond to either the maximum value or the minimum value.

Figure 11B:
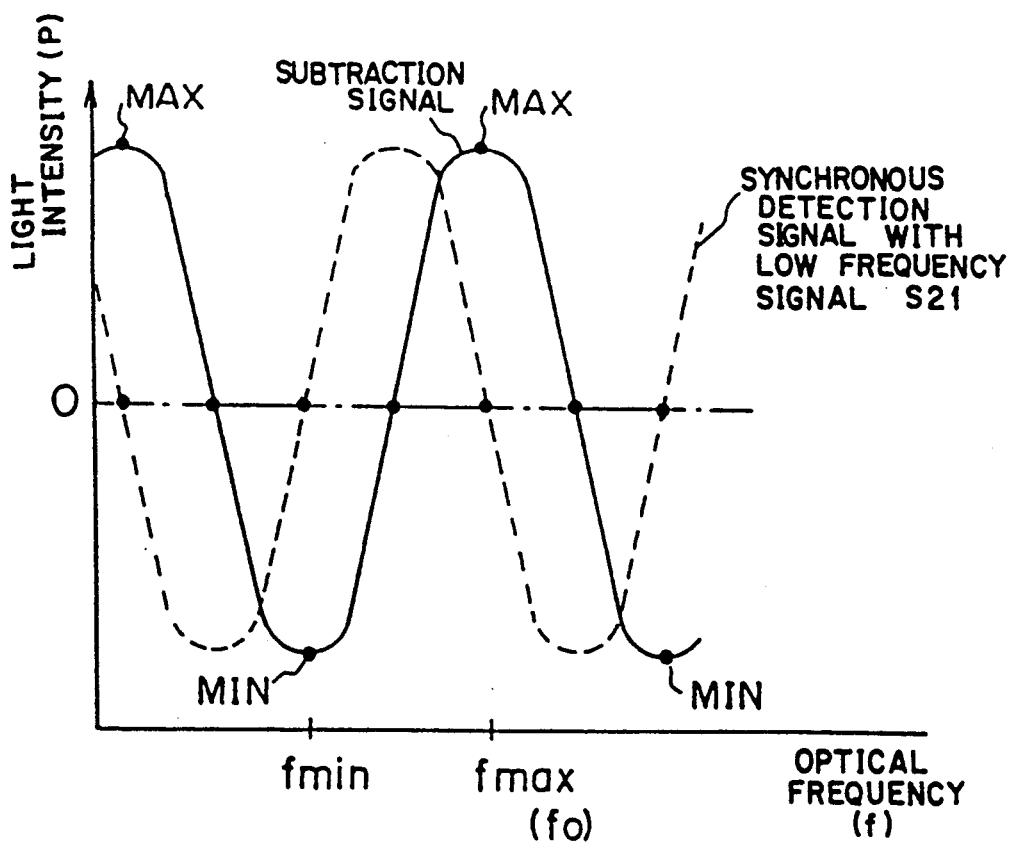

The addition of the two interference light components H2i$a$ and H2i$b$, which are complementary to each other, will produce a flat output as indicated by a chain line in FIG. 11 A. The flat output is proportional to the light output of the semiconductor laser 210. On the other hand, the subtraction of the two complementary interference components H2i$a$ and H2i$b$ will double the amplitude of the output as shown by a solid line in FIG. 11B. A signal resulting from synchronous detection of the subtraction signal with the low-frequency signal S21, which has been superimposed on the bias of the semiconductor laser 210 or the interferometer 220, is equivalent to a waveform which is obtained by differentiating the subtraction signal, or a waveform indicated by a chain line in FIG. 11B. Thus, the synchronous detection signal becomes zero at the maximum value MAX and the minimum value MIN. Therefore, by controlling the synchronous detection signal to follow the zero point at all times, the operating point can be set to correspond to the maximum value MAX or the minimum value MIN of the optical frequency discriminating characteristic.

The detection of the optical frequency deviation will be described next.

Figure 12A:
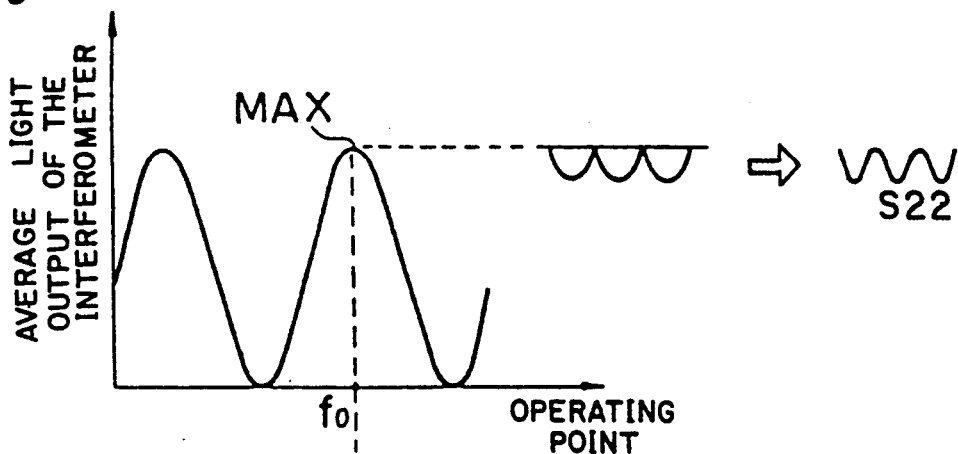
FIGS. 12(a)-12(c) illustrate spectra of light outputs of the interferometer when the operating point is swept under the conditions that $A < B < C$ in magnitude of $\Delta f$.
Figure 12B:
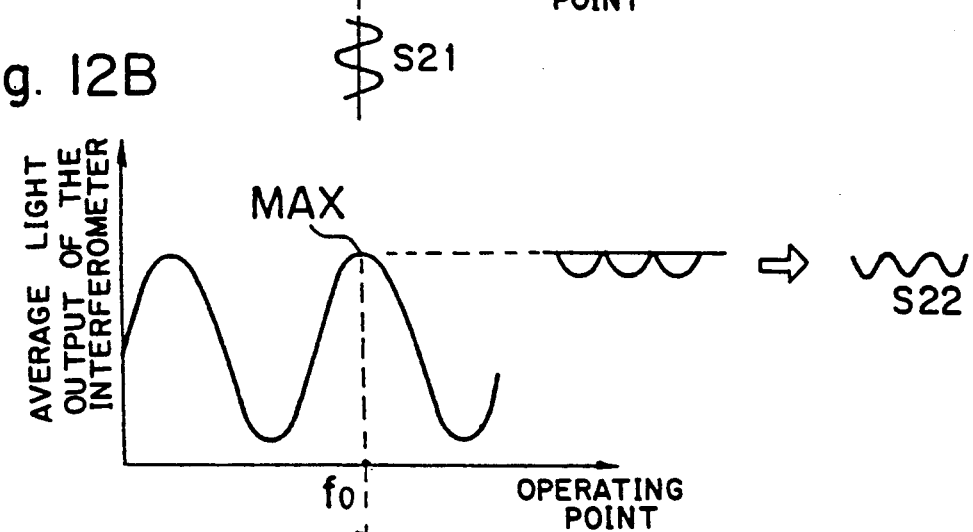
Figure 12C:
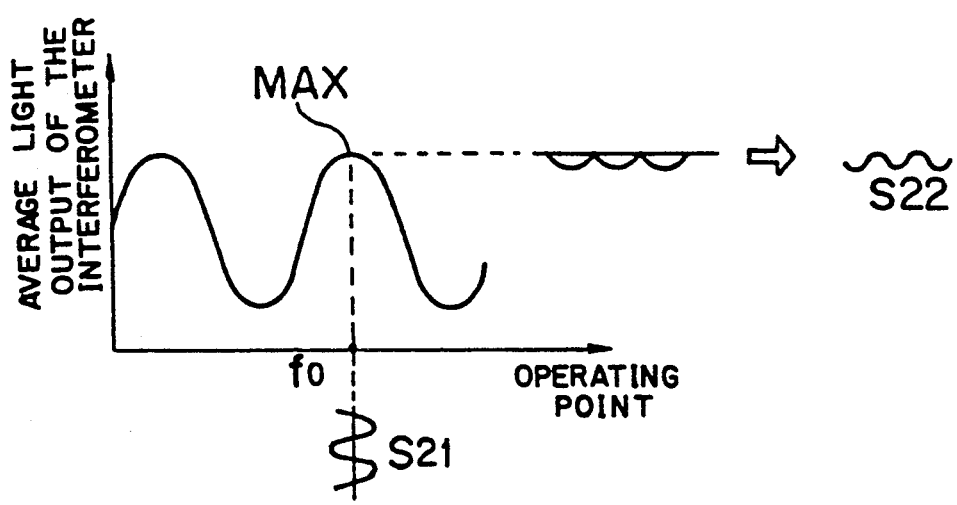

FIGS. 12 A, B, C illustrate spectra of light outputs of the interferometer 220 when an FSK modulated light signal is received and the operating point is swept. In this case, the Mach-Zehnder interferometer is used. As the optical frequency deviation &$f (modulation index) becomes greater, the spectrum of modulated light signal becomes wider. Thus, the coherence of light becomes worse, and the spectrum of light output from the interferometer 220 broadens as shown in FIG. 12. In FIG. 12, the magnitude of the optical frequency deviation $\Delta f$ becomes greater in the order A, B, and C and the spectral waveforms of the average light outputs become gentler accordingly.

The synchronous detection of the light output by the low-frequency signal S21 permits the operating point to be stabilized at the maximum value MAX or the minimum value MIN of the spectrum at all times. When the operating point is stabilized at the maximum value MAX, the average light output from the interferometer 220 is observed as a deformed waveform of the low-frequency signal S21 as shown in the center of FIGS. 12A, B, C. When the operating point is present at the maximum value MAX, the the low-frequency signal component S21 becomes minimum. Instead, the low-frequency signal component S22, whose frequency is twice that of the low-frequency component S21, is produced most strongly. The amplitude of the low-frequency signal component S22 represents the gradient of the shoulder of the spectrum. Since the gradient varies with the magnitude of $\Delta f$ as shown in FIG. 12A, B, C, the amplitude of the low-frequency signal S22 corresponds to $\Delta f$.

Figure 13:
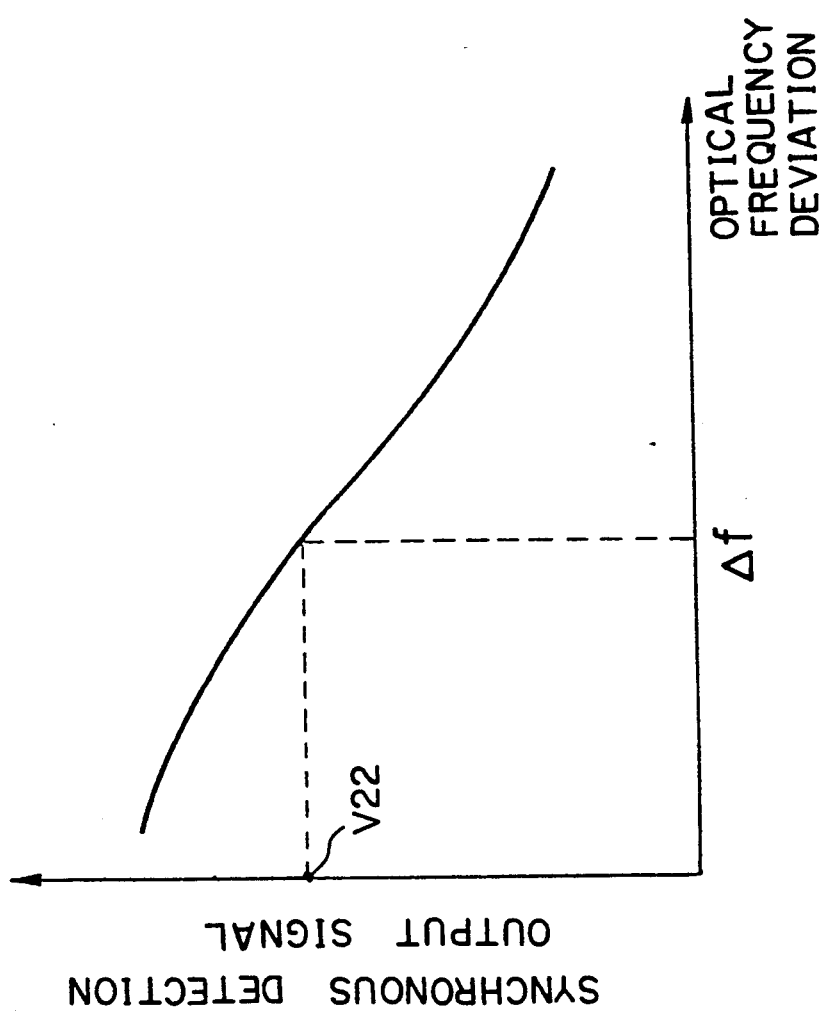
FIG. 13 is a graph illustrating optical frequency deviation versus synchronous detector output for a low-frequency signal S22.

FIG. 13 shows a relationship between a signal after synchronous detection by the low-frequency signal S22 which is twice the low-frequency signal S21 in frequency and the optical frequency deviation $\Delta f$. A value of $\Delta f$ is measured on the basis of the graph. That is, by detecting the low-frequency signal component S22 indicating variations in the average light output intensity of the interference light H2i, which is produced under the stabilized operating point, with the low-frequency signal S22 and making a comparison between the detected signal and a set value of the synchronous detection output signal which produces a predetermined optical frequency deviation $\Delta f$, $\Delta f$ can be detected. The feedback to the data modulator so that the set value of the detection signal will be reached will make stabilization of the optical frequency deviation (modulation index) possible.

In the device of FIG. 10, the operating point setting means 240 is provided taking note of the graph of FIG. 11 and the optical frequency deviation detector 250 is provided taking note of the graph of FIG. 13. The feature of the present invention is to use the light intensity of the interference light H21 as a control variable and handle only a low-frequency component of the light intensity. Therefore, the device for measuring and controlling the optical frequency deviation of the semiconductor laser according to the third aspect of the present invention may be a device which is simple in construction and operates at a very low frequency.

In the above described first to third aspects, the stabilization of an operating point of laser light is controlled by synchronous detection, etc. through a synchronous detecting circuit. On the other hand, in the fourth and fifth aspects, controlling operation such as synchronous detection, etc. is not required for the stabilization control of an operating point.

Figure 14:
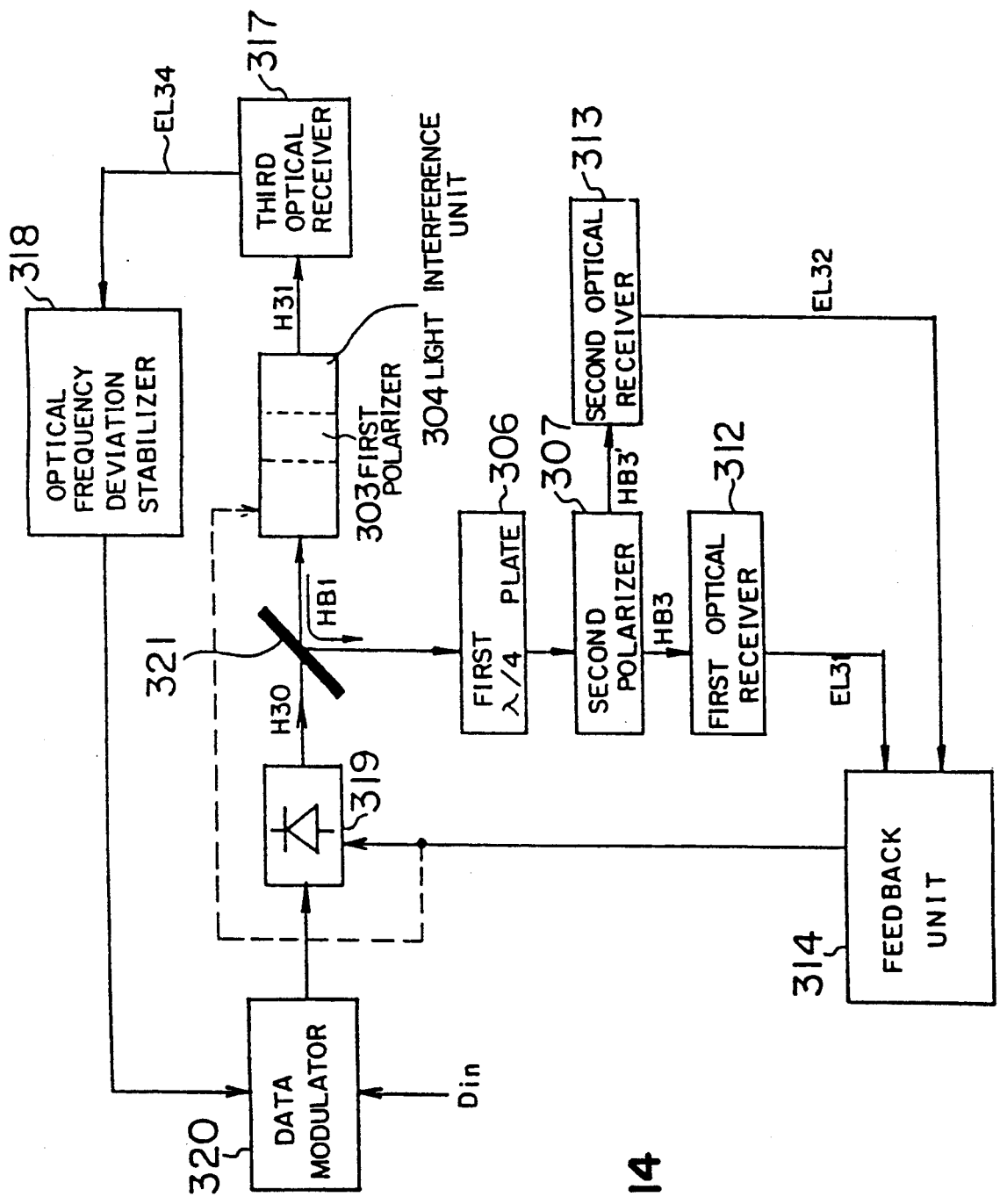
FIG. 14 is a basis block diagram of a forth aspect of the present invention.

FIG. 14 is a basis block diagram of a fourth aspect of the present invention.

In FIG. 14, laser light H30 is a backward light outputted by a semiconductor laser 319. Forward light outputted by the semiconductor laser 319 is applied to the transmission line (not shown in FIG. 14) as optical data. Then, the optical frequency of the laser light H30, is subjected to frequency or phase modulation into either a first or a second optical frequency with the predetermined central optical frequency (operating point) based on the drive current provided by a data modulator 320 according to the two logic values 0 and 1.

A light interference unit 304 responsive to the laser light H30 emits interference light depending to the optical frequency discriminating characteristics. The light interference unit 304 comprises a first polarizer 303 inserted therein.

Then, a first λ/4 plate 306 and a second polarizer 307 for accepting light HB1 reflected from the light interference unit 304 through a half mirror 321 are sequentially positioned.

A first optical receiver 312 and a second optical receiver 313 receive two types of light HB3 and HB3 respectively and convert the light intensity of each type of light to an electrical signal EL31 and EL32 respectively.

Then, a feedback unit 31 4 feeds back the oscillating frequency of the laser light H30 or the interference characteristics of the light interference unit 304 according to the information indicating the phase difference between two orthogonal directional components of the laser light H30 obtained from the difference components between the electrical signals EL31 and EL32 from the first and second optical receivers 312 and 313 so that the operating point of the laser light H30 corresponds to the optical frequency corresponding to the maximum or minimum value of the optical frequency discriminating characteristics. Namely, the feedback unit 314 feeds back, according to the signal obtained by subtracting the electrical signal EL32 from the electrical signal EL31, the bias or the temperature of the semiconductor laser 319 or of the light interference unit 304 that outputs the laser light H30.

On the other hand, a third optical receiver 317 receives transmitted light H31 from the light interference unit 304 and converts its light intensity to an electrical signal EL33.

Under the stabilization control on the operating point of the laser light H30 by the feedback unit 314, an optical frequency deviation stabilizer 318 calculates the difference between the average value of the light intensity of the transmitted light H31 obtained by the electrical signal EL33 from the third optical receiver 317 and the predetermined value, and then feeds back the difference to the modulation factor of the laser light H30. For example, the difference is fed back to a data modulator 320 for performing modulation according to input data Din.

Figure 15:
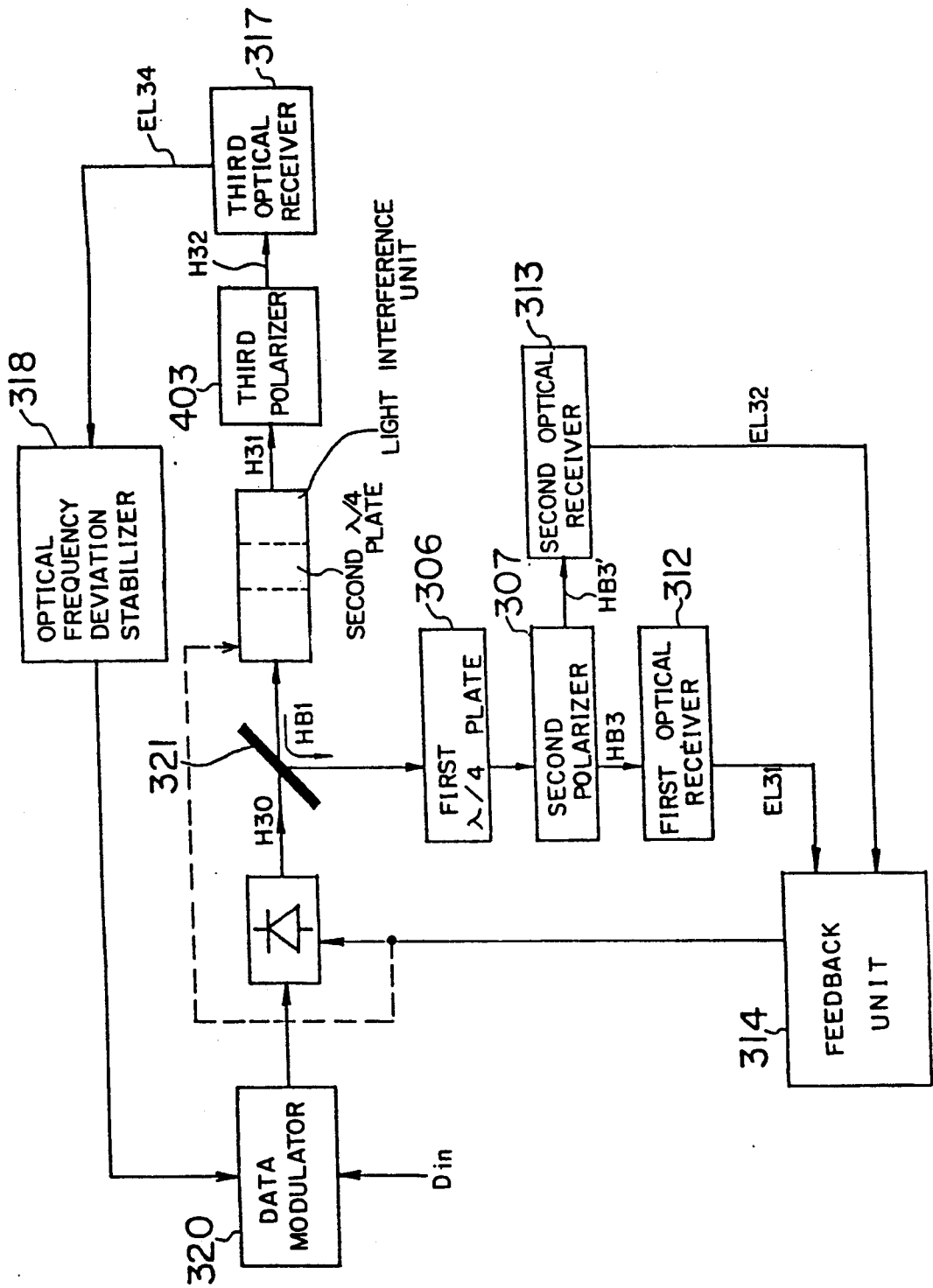
FIG. 15 is a basis block diagram of a fifth aspect of the present invention.

FIG. 15 is a basis block diagram of a fifth aspect of the present invention.

The fifth aspect shown in FIG. 15 is different from the fourth aspect shown in FIG. 14 in that not a polarizer but a second λ/4 plate 401 is inserted into a light interference unit 402 and a third polarizer 403 is inserted to between the light interference unit 402 and the third optical receiver 317.

The fourth and fifth aspects respectively shown in FIGS. 14 and 15 can be, like other aspects of the present invention, applicable to the FDM transmission system. In this case, each of light interference units 304 and 402, polarizers 303, 307, and 403, and λ/4 plates 306, and 401 operates with a plurality of the laser lights H30 each having a different operating point. The corresponding number of optical receivers 312, 313, and 317 to the number of laser lights H30 are parallelly positioned for receiving HB3, HB3', and H31 (H32) respectively. The feedback unit 314 and the optical frequency deviation stabilizer 318 shown in FIGS. 14 and 15 respectively perform parallel or time divisional operation for each laser light H30. Specifically in this case, the feedback unit 314 causes an operating point of each laser light H30 to correspond to any of optical frequency corresponding to a plurality of maximum or minimum values of one optical frequency discriminating characteristic of the light interference unit 304. Then, the frequency of each laser light H30 can be automatically controlled by feeding back the bias or temperature in each laser 319 outputting each laser light H30.

In the fourth and fifth aspects respectively shown in FIGS. 14 and 15, an automatic light output controller can be provided for feeding back the oscillation output of the laser light H30 according to the electrical signal EL33 from a part of the laser light H30 or the third optical receiver 317 so that the oscillation output of the laser light H30 can be stabilized to a predetermined value.

The operational principle of the fourth and fifth aspects of the measure and control device for a laser light as configured above is generally identical with the first aspect of the present invention and summarized as follows:

1) An operating point of laser light must be stabilized to the optical frequency corresponding to the maximum or minimum value of the optical frequency discriminating characteristics in the light interference unit.

2) Under the stabilized operating point, an average value of the interference light intensity must be detected and measured, and the modulation factor of the laser light must be fed back so that the average value can be converged towards the set value for the light intensity when a predetermined deviation of optical frequency is produced.

That is, the present invention adopts the principle that an average value of light intensity and the optical frequency deviation have a specific function relation to each other when an operating point of laser light (central optical frequency) corresponds to the optical frequency corresponding to the maximum or minimum value of the optical frequency discriminating characteristics of the light interference unit.

As described above, in the fourth and fifth aspects respectively shown in FIGS. 14 and 15, stabilization control on an operating point of laser light can be performed, as a pre-process for stabilizing the optical frequency deviation of laser light, without additional controlling operation such as synchronous detection, etc. as described in the first to third aspects of the present invention.

That is, as shown in FIGS. 14 and 15, the first λ/4 plate 306 and the second polarizer 307 are used with each of main axis slanted at predetermined degrees. Then, the information indicating the phase difference between two orthogonal polarization components of the laser light HB1 can be obtained in a format comprising an item "sin $\phi$" ($\phi$ indicates phase difference) as a difference signal between the electrical signal EL31 of the first optical receiver 312 and the electrical signal EL32 of the second optical receiver 313. Using such information of a phase difference, the maximum or minimum point in the optical frequency discriminating characteristics may correspond to the zero point (indicating that the amplitude is zero) of the above described difference signal.

Based on the fact above, an operating point can be controlled such that an operating point in the laser light H30 constantly corresponds to the optical frequency corresponding to the maximum and minimum value of the optical frequency discriminating characteristics of the light interference unit 304 using the feedback unit 314 for feeding back the bias or the temperature of the laser 309 or the light interference unit 304 according to the above described difference signal, etc..

The difference between the fourth and fifth aspects respectively shown in FIGS. 14 and 15 resides in that the lock-in-range of an operating point of the laser light H30 can be larger in the fifth aspect than in the fourth aspect.

The fourth and fifth aspects of the present invention described above can be applicable to the optical communication systems in the optical frequency-division multiplex (FDM) transmission method. Specifically in this case, as the feedback control operation in the operating point stabilization control is performed on the oscillation frequency of laser light, each operating point of each laser light (central optical frequency) is set on a plurality of maximum or minimum values respectively in one of the optical frequency discriminating characteristics of a light interference unit. Thus, automatic frequency control (AFC) of each laser light can be performed simultaneously. The interval of the optical frequency between the adjacent maximum and minimum values of one of the optical frequency discriminating characteristics is a fixed value. Therefore, as a result of the simultaneous execution of above described automatic frequency control, operating points of respective laser light in the FDM transmission system can be arranged at equal intervals on the optical frequency axis.

Figure 16:
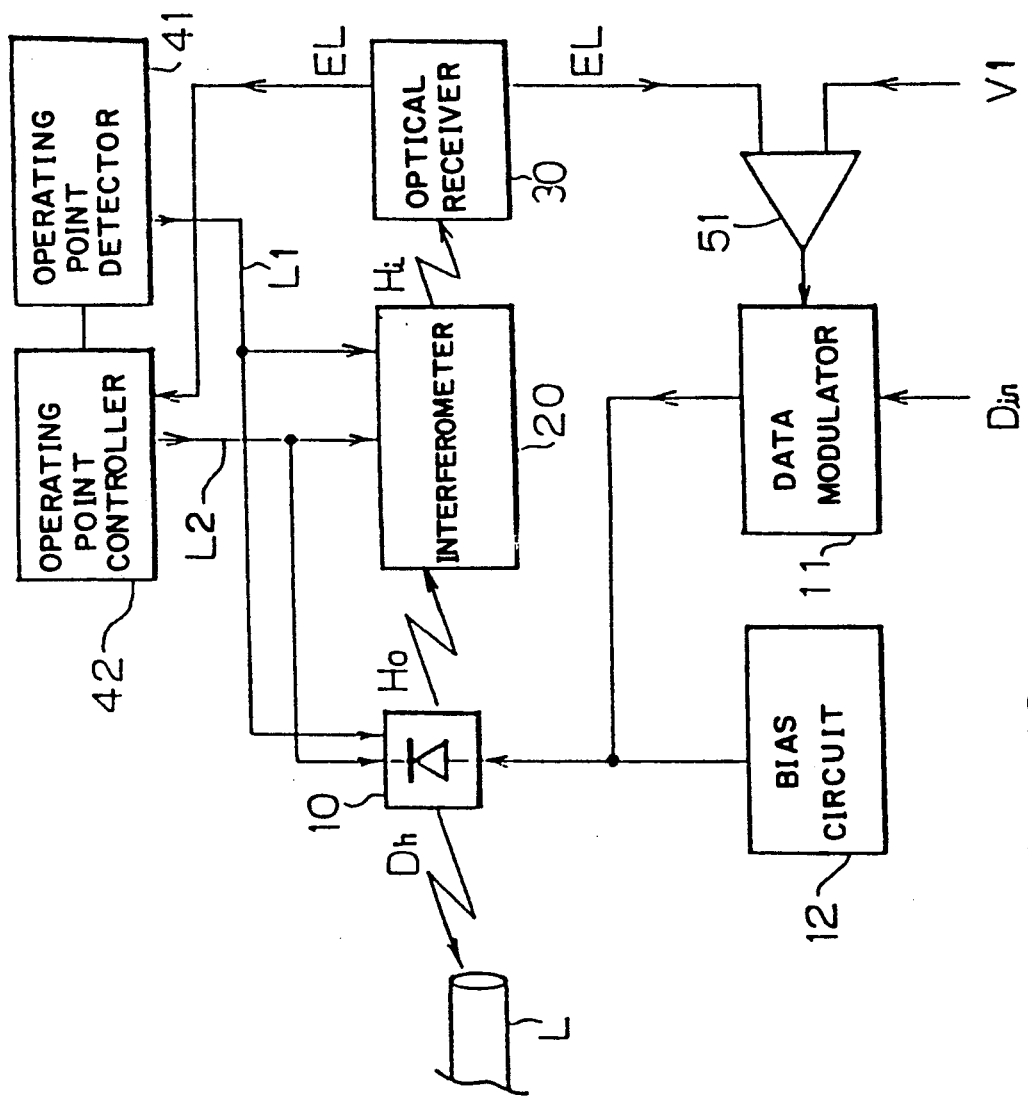
FIG. 16 is a block diagram of a first embodiment of the present invention.

FIG. 16 is a block diagram of a first embodiment of the present invention. Hereinafter, like parts are shown by corresponding reference characters throughout all the views of the drawings. The present embodiment shows a specific form of each of the operating setting points 40 (FIG. 1) and the deviation detecting means 50 (FIG. 1). First, the operating setting means 40 comprises an operating point detector 41 and an operating point controller 42.

In order to vary an oscillation frequency at the operating point in the optical frequency discriminating characteristic, the operating point detector 41 controls the oscillation frequency of the semiconductor laser 10 or the interference characteristic of the interferometer 20 by way of a control line L1. The operating point controller 42 receives an electric signal EL which varies from the optical receiver 30 with varying operating point and shifts the operating frequency according to the result of the reception so that the operating frequency converges to the maximum value MAX or the minimum value MIN. To shift the operating point, the oscillation frequency of the semiconductor laser 10 or the interference characteristic of the interferometer 21 is controlled through a control line L2.

The deviation detecting means 50 comprises a comparator 51. The comparator receives a direct current component of the electric signal at its first input terminal and a predetermined set voltage V1 at its second input terminal. The output of the comparator is fed to the data modulator 11. The set voltage V1 corresponds to V1 in the graph of FIG. 3. The optical frequency deviation Δf corresponding to V1 is to be held constant.

Figure 17:
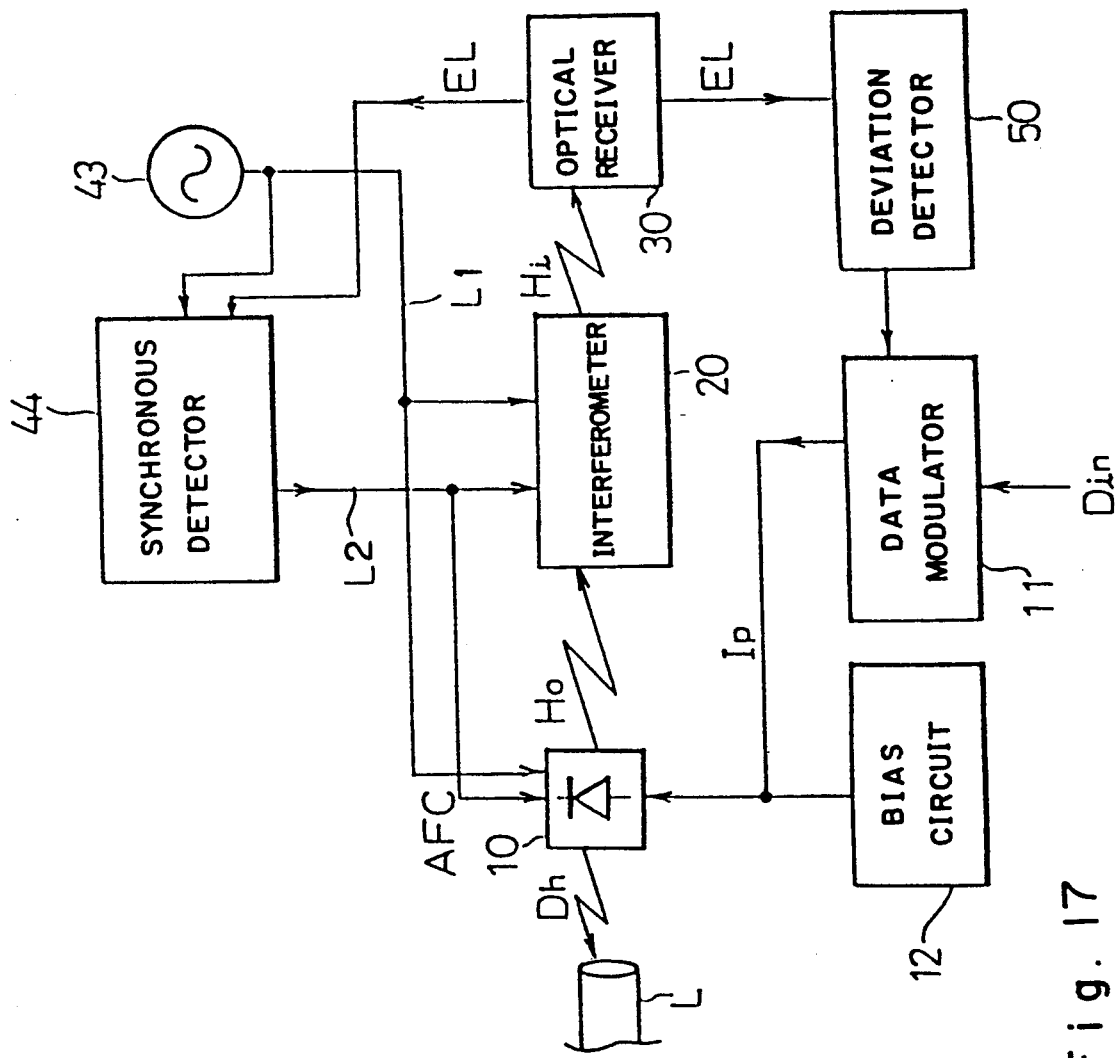
FIG. 17 illustrates specific arrangements of the operating point detector and the operating point controller of FIG. 16.

FIG. 17 illustrates a specific arrangement of each of the operating point detector and the operating point controller of FIG. 16. The operating point detector 41 (FIG. 16) consists merely of a low-frequency oscillator 43 which varies the oscillation frequency of the semiconductor laser 10 or the interference characteristic of the interferometer 20 at a low frequency. The low frequency means that it is low in comparison with the frequency of a data transmission speed, and it is, for example, 100 Hz.

On the other hand, the operating point controller 42 (FIG. 16) consists merely of a synchronous detector 44. The synchronous detector is responsive to the electric signal EL from the optical receiver 44 and the oscillator output of the low-frequency oscillator 43 to perform synchronous detection on the electric signal and extract a signal component synchronized with the oscillator output. Further, the synchronous detector controls the bias of the semiconductor laser 10 or the interferometer 20 via the control line L2 using the extracted signal component applied thereto.

It is easy to vary the interference characteristic of the interferometer at a low frequency and the bias of the interferometer. Basically, the length of the resonator of the interferometer and the delay time difference have only to be varied. Specifically, there are known the following methods of utilizing:

(1) the photoelastic effect;
(2) the electro-optical effect;
(3) mechanical external force; and
(4) the thermal optical effect.

The oscillation frequency of the semiconductor laser 10 can be varied by controlling its drive current. The bias of the semiconductor laser can be varied by controlling the bias circuit 12.

Here an additional explanation will be made of the operation of the low-frequency oscillator 43 and the synchronous detector 44.

Figure 18:
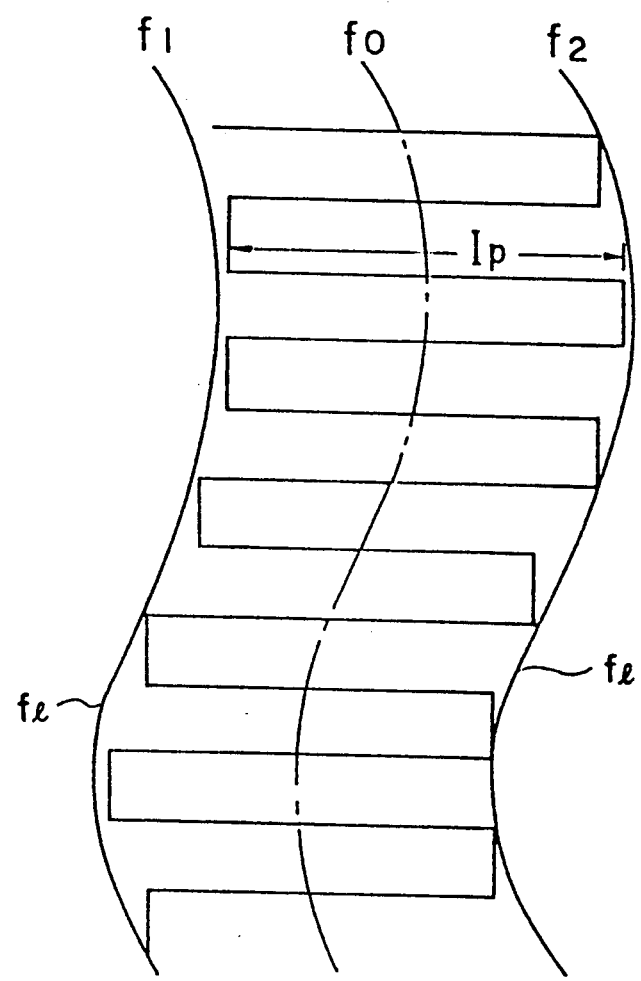
FIG. 18 is a waveform diagram for use in the operation of a low frequency oscillator.

FIG. 18 is a waveform diagram for use in explanation of the operation of the low-frequency oscillator. The figure particularly shows an example where the output of the low-frequency oscillator is superimposed on the drive current of the semiconductor laser. The drive current is indicated by Ip. By varying the drive current Ip to have two values, the frequency of the output light Ho of the semiconductor laser 10 is shifted to the first optical frequency f1 and the second optical frequency f2 with the frequency f0 centered. When, in this state, the output of the low-frequency oscillator 43 is superimposed, the drive current winds with the oscillator frequency f1 like a wave as shown. The electric signal EL containing the low-frequency component is subjected to synchronous detection in the synchronous detector 44 responsive to the output of the oscillator 43.

Figure 19A:
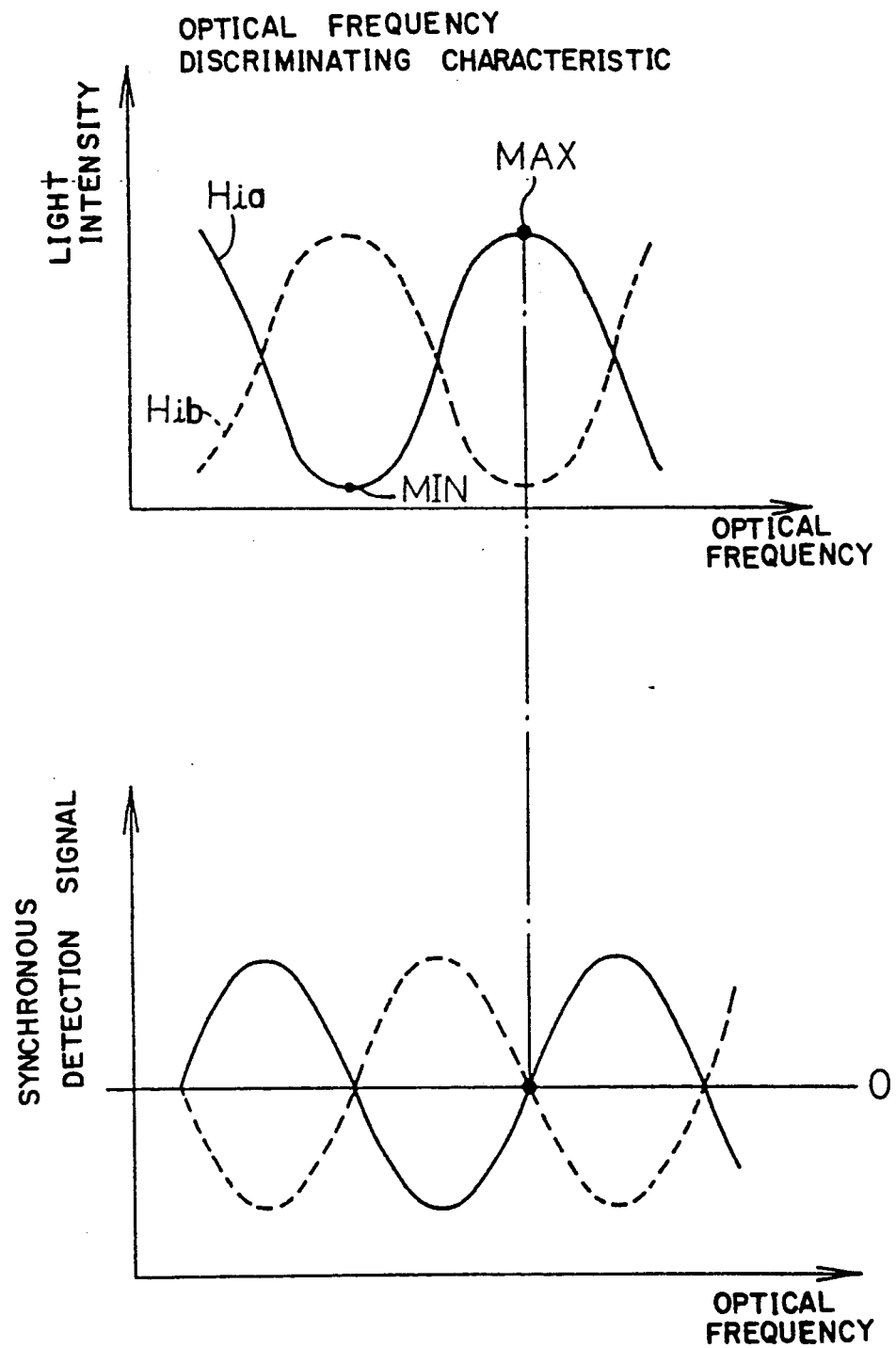
FIG. 19A is a synchronous signal waveform diagram when a Mach-Zehnder interferometer is used.

FIG. 19A is a waveform diagram of a synchronous detection signal when the Mach-Zehnder interferometer is used, while FIG. 17B is a like waveform diagram when the Fabry-Perot interferometer is used. For the purpose of better understanding, the corresponding optical frequency discriminating characteristic is shown at the top of each of the synchronous detection signal waveform diagrams. These optical frequency discriminating characteristics correspond to the graph of FIG. 2.

The signal resulting from the synchronous detection is equivalent to a waveform obtained by differentiating the optical frequency discriminating characteristic as described in connection with FIG. 11B. Thus, the synchronous detection signal becomes zero at the maximum value MAX and the minimum value MIN in the optical frequency discriminating characteristic. For this reason, if the zero point of the synchronous detection signal is always followed, the operating point will continue to be set at the maximum value MAX or the minimum value MIN.

The above description was made in connection with control for keeping the optical frequency deviation constant. The automatic frequency control (AFC) may be performed at the same time. This is realized by feeding the output of the synchronous detector 44 back only to the semiconductor laser 10 in FIG. 17, so that the center optical frequency f0 is maintained at a desired constant value.

Furthermore, the automatic light output control (APC) can be performed at the same time. To realize the APC, however, there is a need for an interferometer which splits the output light H0 of the semiconductor laser 10 into two complementary interference light components (Hia, Hib). In this case, two optical receivers (31, 32) are needed to receive the two complementary interference light components. The two optical receivers will be described later.

Figure 20A:
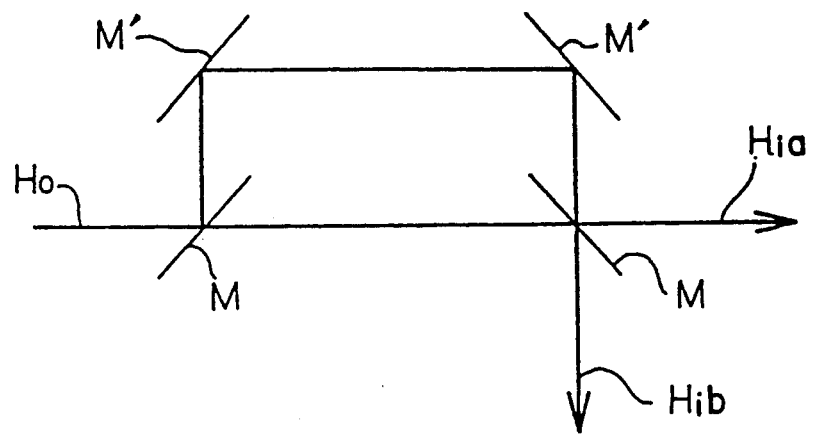
FIG. 20A illustrates the Mach-Zehnder interferometer for outputting two complementary interference light waves.
Figure 20B:
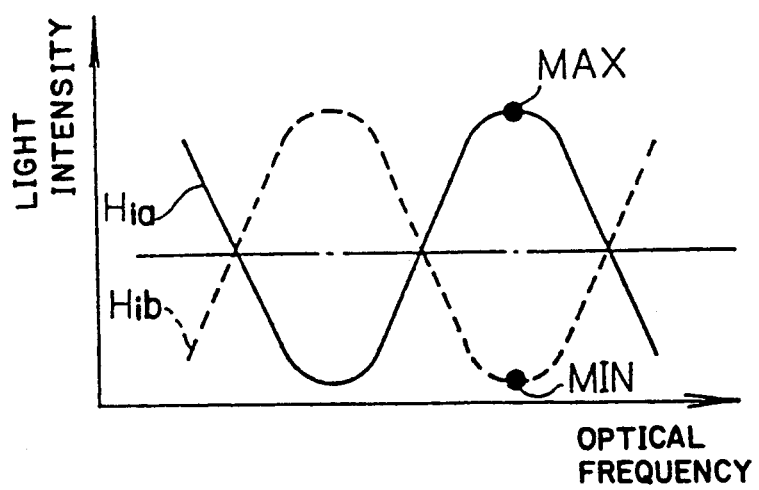
FIG. 20B illustrates the optical frequency discriminating characteristics of the two interference light waves in FIG. 20A.

FIG. 20 A illustrates the Mach-Zehnder interferometer which outputs two complementary interference light components and FIG. 20B illustrates the optical frequency discriminating characteristics of the two interference light components. In FIG. 20A, M designates half mirrors and M' designates mirrors. A predetermined difference in length is produced between two light paths to thereby produce two complementary interference light components Hia and Hib. The two complementary interference light components Hia and Hib have such optical frequency discriminating characteristics as shown in FIG. 20B.

The same analysis can be applied to the Fabry-Perot interferometer.

Figure 21A:
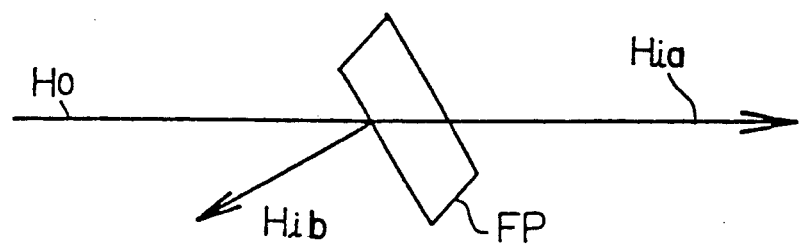
FIG. 21A illustrates the Fabry-Perot interferometer for outputting two complementary interference light waves.
Figure 21B:
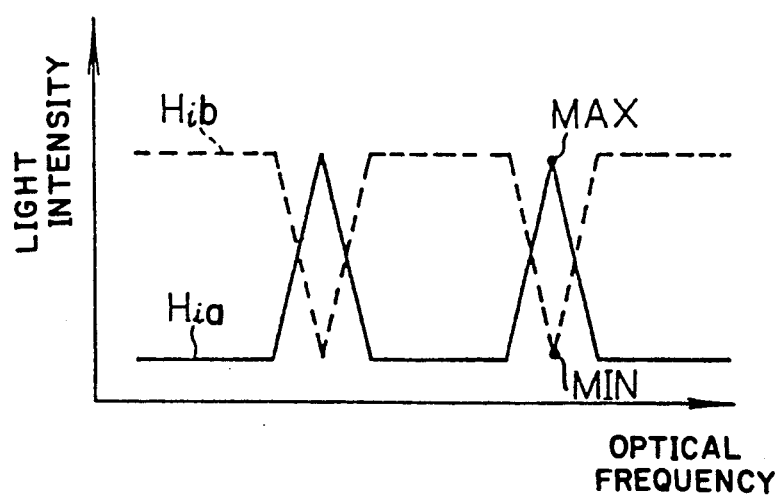
FIG. 21B illustrates the optical frequency discriminating characteristics of the two interference light waves in FIG. 21A.

FIG. 21A illustrates the Fabry-Perot interferometer which outputs two complementary interference light components and FIG. 21B illustrates the optical frequency discriminating characteristics of the two interference light components. In fig. 21A, the interference light Hia is transmitted light, while the interference light Hib is reflected light. It is so as not to return the reflected light Hib to the semiconductor laser 10 that the Fabry-Perot interferometer FP is slanted with respect to the optical axis of the output light Ho. Note that there are other means for obtaining two complementary interference light components.

Figure 22:
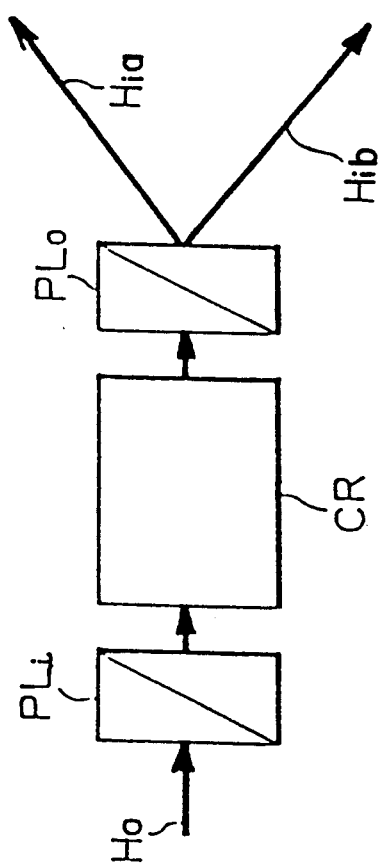
FIG. 22 illustrates another means for obtaining two complementary interference light waves.

FIG. 22 illustrates another means for obtaining two complementary interference light components. According to this means, a first polarizer PL1 and a second polarizer PL0 are provided at the input and output sides of a double-refraction crystal CR, respectively, and two complementary interference light components Hia and Hib are obtained from the output light Ho.

Hereinafter, a description will be made of an optical frequency deviation measure and control device for a laser light using the two complementary interference light components Hia and Hib which are obtained in the manner described above.

Figure 23:
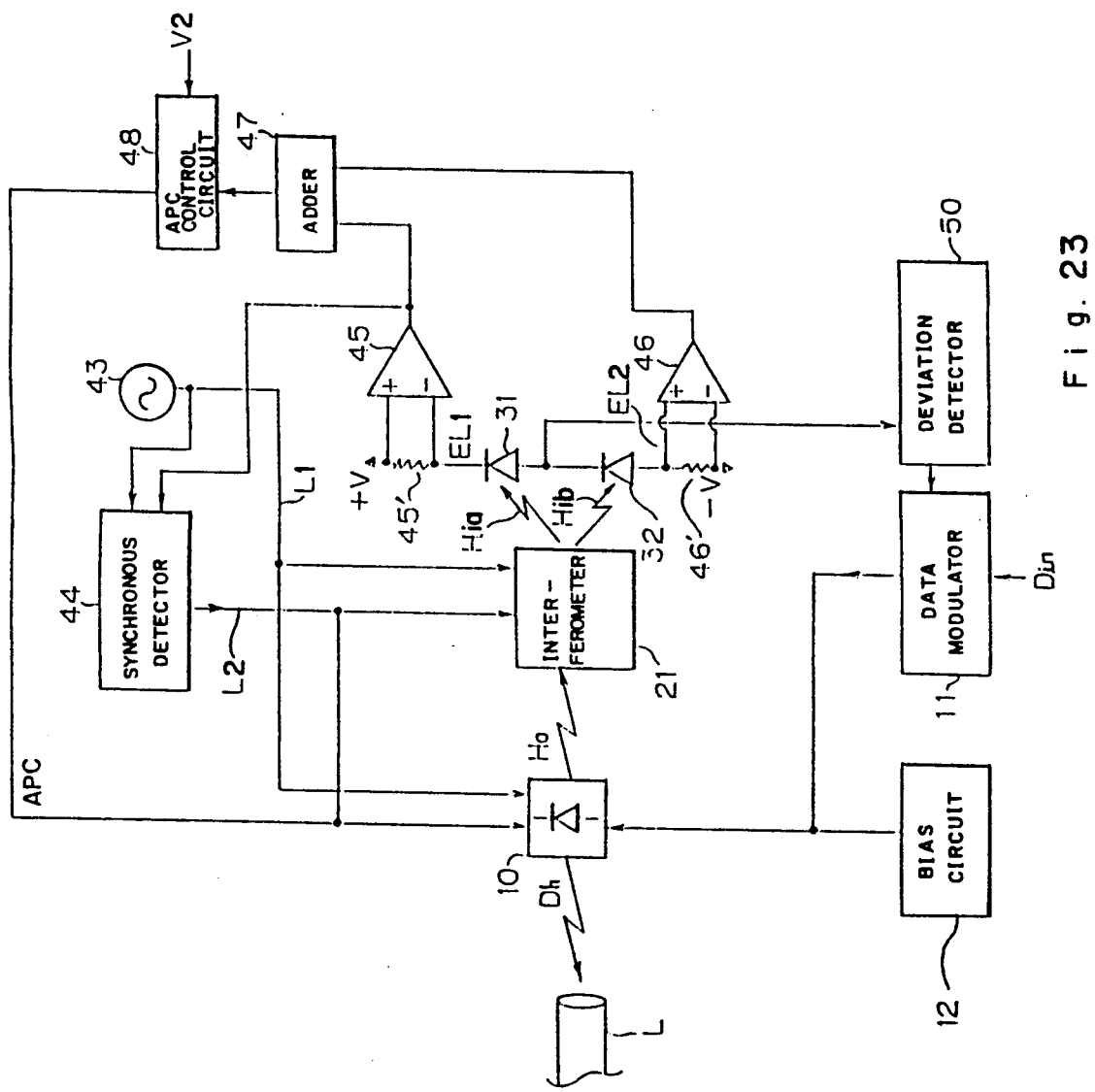
FIG. 23 is a block diagram of a second embodiment of the present invention which performs automatic light output control as well.

FIG. 23 is a block diagram of measure and control device according to a second embodiment of the present invention, which incorporates interferometer 21 (refer to FIGS. 20A, 21A and 22) which outputs two complementary interference light components Hia and Hib and two optical receivers 31 and 32 for receiving the two interference light components. Electric signals EL1 and EL2 output from the optical receivers 31 and 32 are added together in an adder 47 to produce their sum signal. The sum signal is fed back to the semiconductor laser 10, so that the light output of the semiconductor laser 10 can be kept constant at all times. In practice, voltage signals corresponding to the electric signals EL1 and EL2 are added together. For the addition of voltages, voltage detecting resistors 45' and 46' and an instrument amplifiers 45 and 46 are provided.

The reason why the APC can be performed by the output of the adder 47 will be made clear by referring to FIG. 20B. The addition of the two interference light components Hia and Hib, which are complementary to each together, will produce a flat output as indicated by a chain line in FIG. 20B. That is, the addition of the electric signals EL1 and EL2 in the adder 47 produces a flat output signal. If the feedback is made to the semiconductor laser 10 so that the level of the flat output signal will remain constant at all times, the APC will be realized. In FIG. 23, an APC control circuit 48 detects a deviation in the output of the adder 47 from a preset value V2 for feedback to the semiconductor laser 10.

In this case, as the input to the synchronous detector 44, the output of the measurement amplifier 45 or 46 is used.

In the arrangement of FIG. 23, a difference signal of the electric signals EL1 and EL2 is used as the input to the optical frequency deviation detecting means 50. The difference signal of the electric signals EL1 and EL2 is equivalent to addition of the broken curve to the solid curve with the former reversed in polarity in FIG. 3. Thus, such a signal having a greater rate of variation as shown by a dash-dotted line in FIG. 3 is obtained. In other words, it becomes possible to control the optical frequency deviation with a signal having a steep gradient. This increases the S/N ratio in the control of the optical frequency deviation.

In FIG. 3, if adjustment is made so that the optical frequency deviation at the intersection X of the solid curve (corresponding to Hia) and the broken curve (corresponding to Hib) becomes a desired optical frequency deviation, it will be obtained when the difference signal of the electric signals EL1 and EL2 become zero. That is, the deviation detecting means 50 has only to provide feedback to the data modulator 11 so that the difference signal of EL1 and EL2 always converges towards zero.

Figure 24:
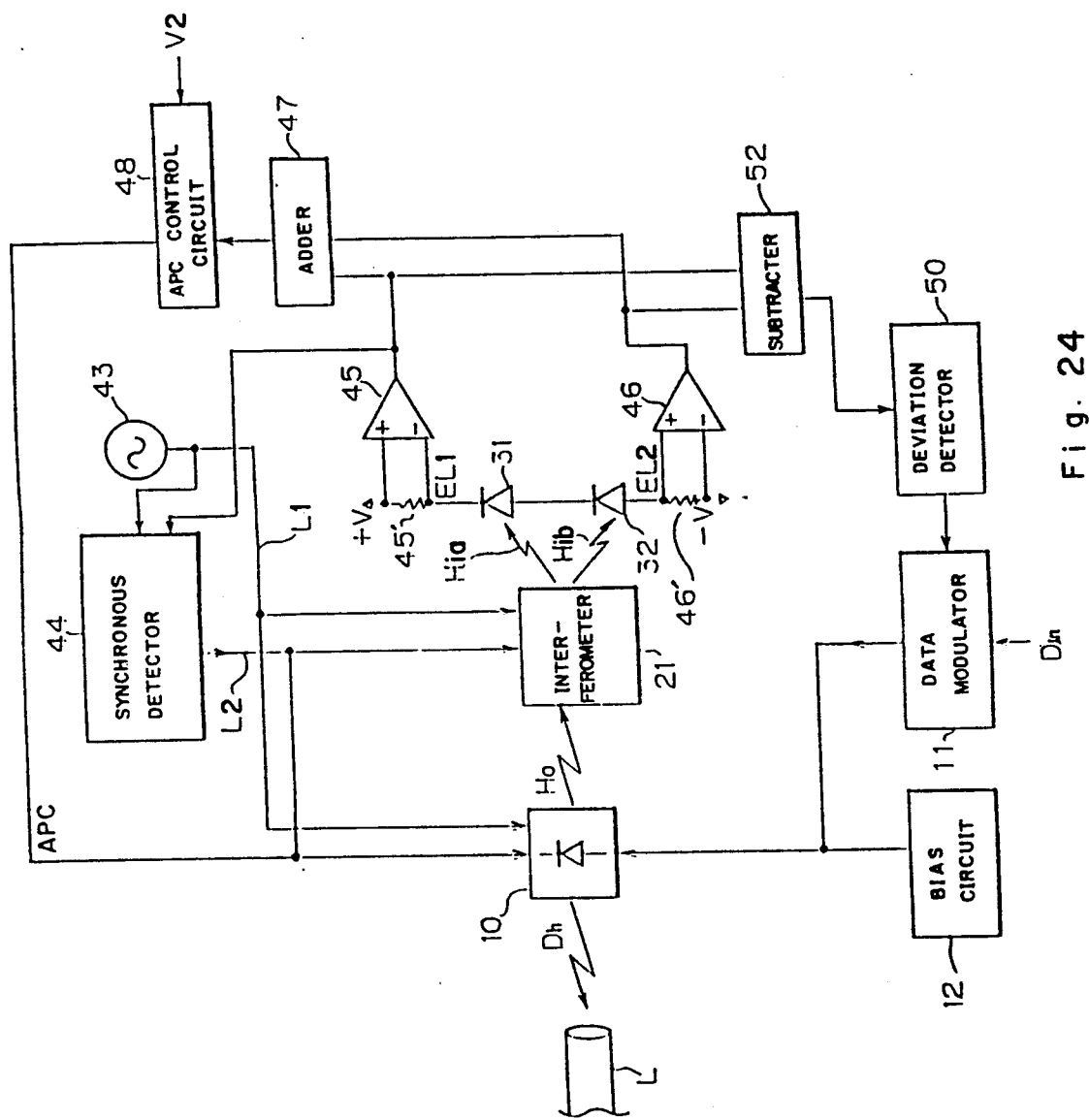
FIG. 24 illustrates a modification of the difference signal producing means of FIG. 23.

It is easy to adjust the laser light properly so that the desired optical frequency deviation can be obtained. The adjustment is realized easily by changing the free spectral range (FSR), changing the finess of the interferometer 21 and changing the relative amplification factor of the optical receivers 31 and 32, the optical coupling rate, the quantum efficiency, etc. The arrangement of FIG. 23 can be modified as shown in FIG. 24. In this case, the above adjustment can also be made by changing the relative amplification factor of the measurement amplifiers 45 and 46.

FIG. 24 illustrates a modification of means for taking the difference signal in the embodiment of FIG. 23. In this modification, the difference signal of EL1 and EL2 is obtained from a subtracter 52.

Figure 25:
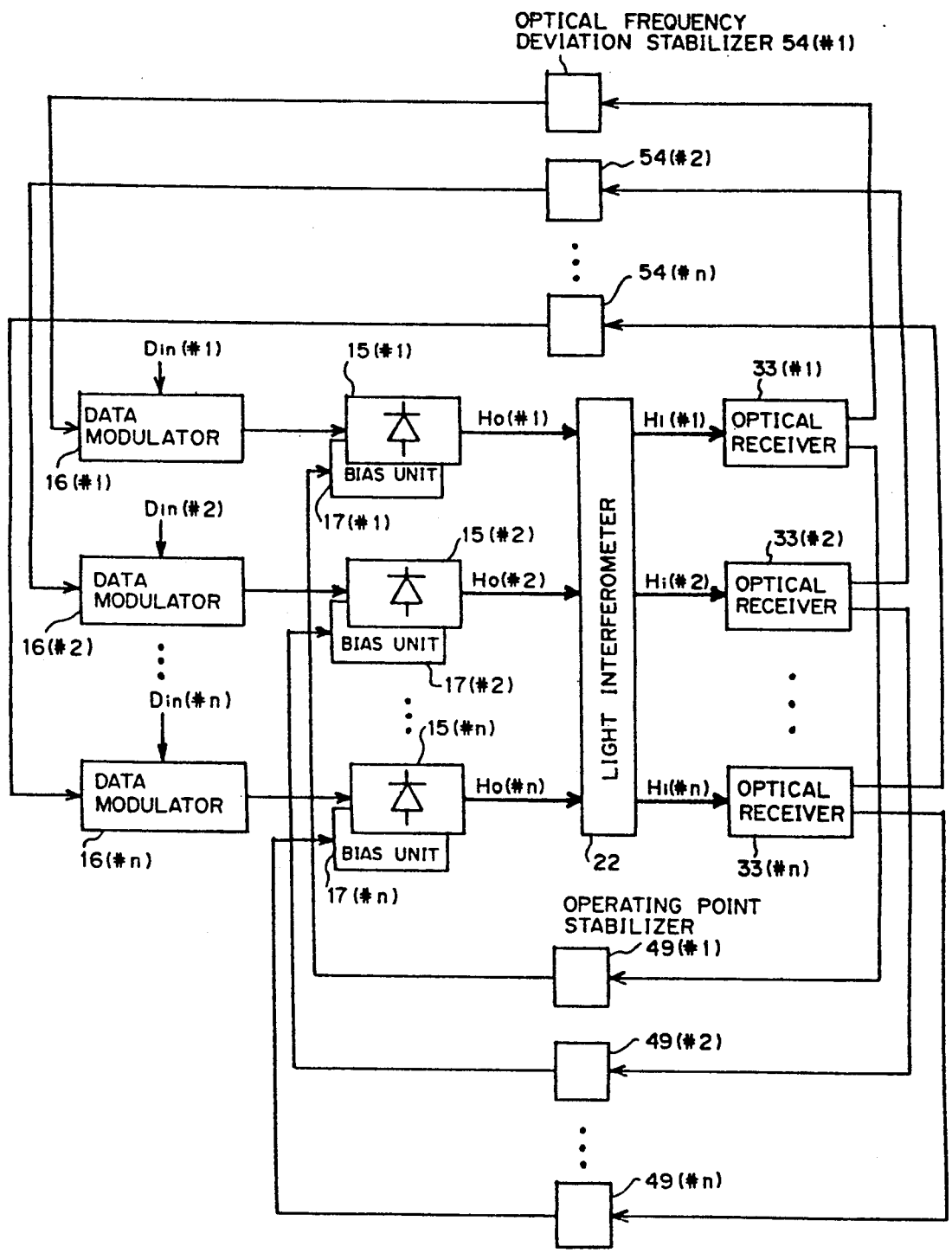
FIG. 25 is a block diagram of a third embodiment of the present invention.

FIG. 25 is a block diagram of a third embodiment of the present invention.

The embodiment is applicable to an optical frequency-division multiplex (FDM) transmission system, that is, an optical communication system for processing central optical frequency simultaneously in a single optical fiber to multiplex and transmit information of a plurality of lines.

A semiconductor laser 15, a data modulator 16, a bias unit 17, an interferometer 22, and an optical receiver 33 shown in FIG. 25 correspond to 10, 11, 12, 20, and 30 of the first embodiment shown in FIGS. 16 and 17. An operating point stabilizer 49 shown in FIG. 25 corresponds to the low frequency oscillator 43 and synchronous detecting circuit 44 shown in FIG. 17, while an optical frequency deviation stabilizer 54 shown in FIG. 25 corresponds to the comparator 51 shown in FIG. 16.

The third embodiment shown in FIG. 25 is different from the first embodiment shown in FIGS. 16 and 17 in the point that the FDM transmission system requires a plurality of central optical frequency, while each of the semiconductor laser 15, data modulator 16, bias unit 17, optical receiver 33, operating point stabilizer 49, and the optical frequency deviation stabilizer 54 comprises a plurality #1-#n of units, thereby realizing multiplexed transmission of transmission data Din of a plurality #1-#n of lines. The light interference means 22 comprises, in this embodiment, a Fabry-Perot interferometer. Each of #1-#n backward light Ho provided by each of #1-#n semiconductor laser is spatially divided by n optical fiber and led by one unit of Fabry-Perot interferometer 22, while each of interference light Hi is spatially divided by n optical fiber and led by n optical receivers 33.

The stabilizing operation of an operating point and optical frequency deviation by a semiconductor laser 15 in each of n part in #1-#n sets shown in FIG. 25 are basically the same as the first embodiment shown in FIGS. 16 and 17.

Figure 19B:
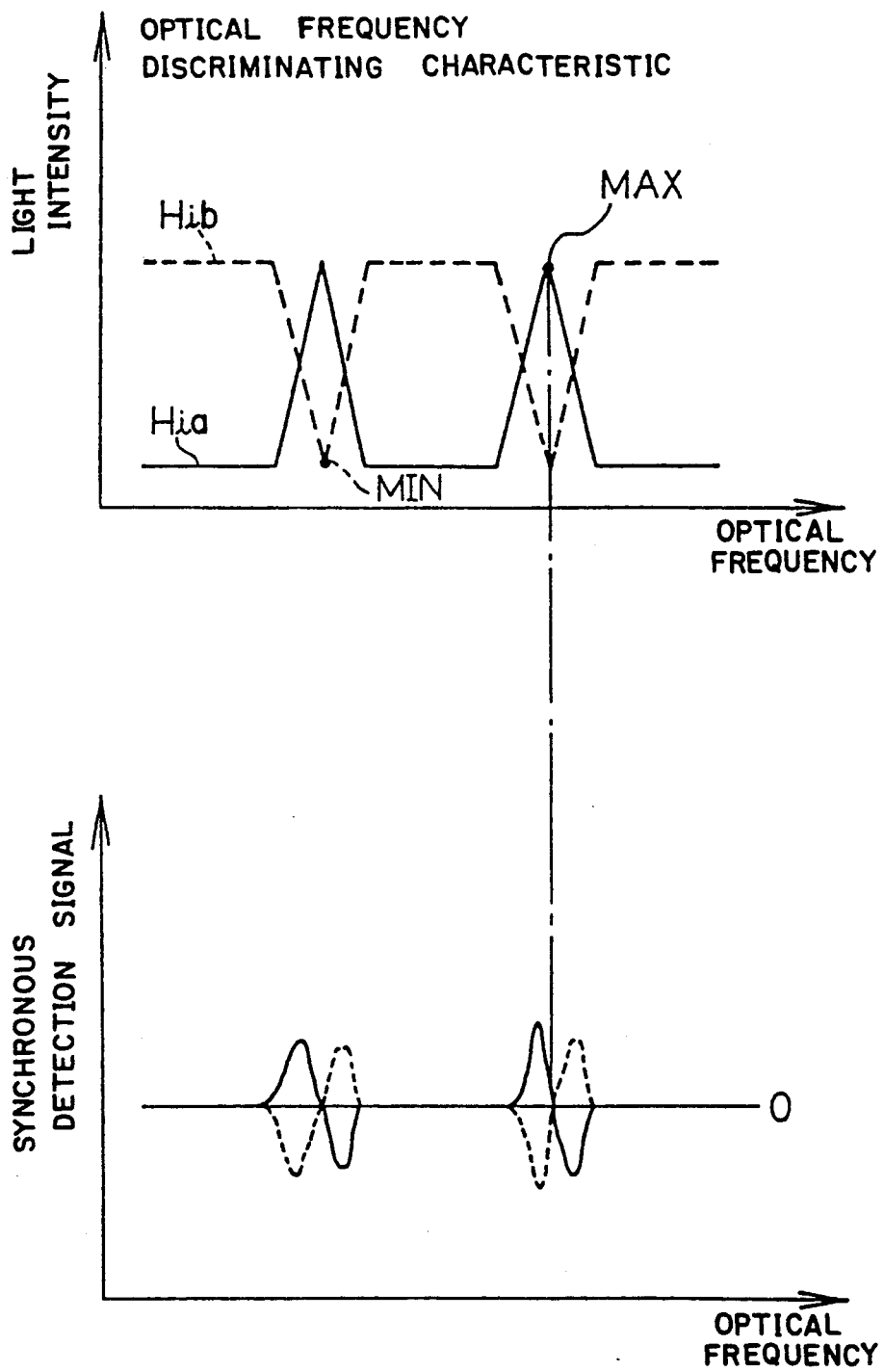
FIG. 19B is a synchronous signal waveform diagram when a Fabry-Perot interferometer is used.

However, in this embodiment, the output of each of the operating point stabilizer 49 (corresponds to the low frequency oscillator 43 and synchronous detecting circuit 44 of the first embodiment shown in FIG. 17) is superimposed and negatively fed back to the bias current in each bias unit 17 or to the control input of the temperature control element of each semiconductor laser 15. Thus, each operating point of each laser light (central optical frequency) of each semiconductor laser 15 is set to n points indicating the maximum value MAX (FIG. 19B) of the optical frequency discriminating characteristics of interferometer 22. Then, the interval of the optical frequency between adjacent maximum value points in one optical frequency discriminating characteristics is assigned a fixed value. Therefore, as a result of simultaneous realization of each automatic frequency control (AFC) on each laser light of each semiconductor laser 15 as described above, n operating points of #1-#n semiconductor laser 15 in the FDM transmission system can be positioned exactly at equal intervals in an optical frequency axis.

The optical frequency deviation can be stabilized to each predetermined value for each laser light of each semiconductor laser 15 under the above described automatic frequency control (AFC).

Further, a plurality of laser light applied to a single peak value of either the maximum or minimum value of the optical frequency discriminating characteristics enables transmission at a common frequency through different transmission lines.

Figure 26:
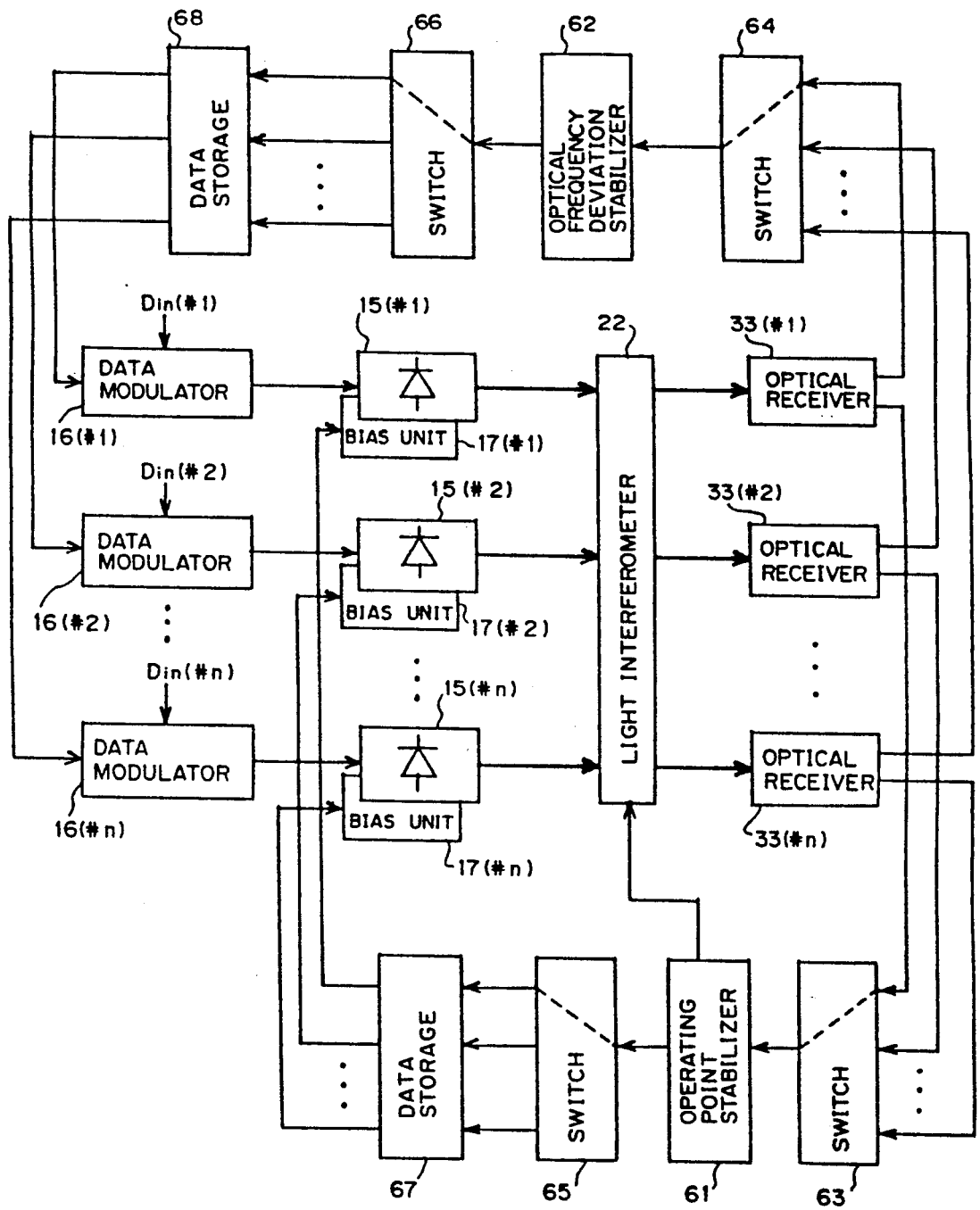
FIG. 26 is a block diagram of a fourth embodiment of the present invention.

FIG. 26 is a block diagram of a fourth embodiment of the present invention. In FIG. 26, all parts assigned the same numbers as those assigned to the third embodiment have the same functions respectively.

The fourth embodiment is different from the third embodiment in the point that an operating point stabilizer and an optical frequency deviation stabilizer are 61 and 62, each comprising a single unit, and each unit is operated in a time divisional manner.

The output provided by each of #1-#n optical receivers 33 is applied to the operating point stabilizer 49 and optical frequency deviation stabilizer 54 through switches 63 and 64. Each of control results is stored in data storages 67 and 68 through switches 65 and 66. Each of the data storages 67 and 68 negatively feed back the latest control data #1-#n at each control point simultaneously to each bias unit 17 (or a temperature control terminal of each semiconductor laser 15) and each data modulator 16, thus reducing the circuit scale in the above described configuration.

In this embodiment, the modulation output for synchronous detection provided by the operating point stabilizer 49 (corresponding to the oscillation output of the low frequency oscillator 43 in the first embodiment shown in FIG. 17) is superimposed to the interferometer 22, thereby eliminating the necessity of low frequency modulation of optical frequency of each laser light from each semiconductor laser 15. Therefore, the influence of low frequency modulation component on the modulation component corresponding to an essential communication signal of each laser light can be completely eliminated.

Figure 27:
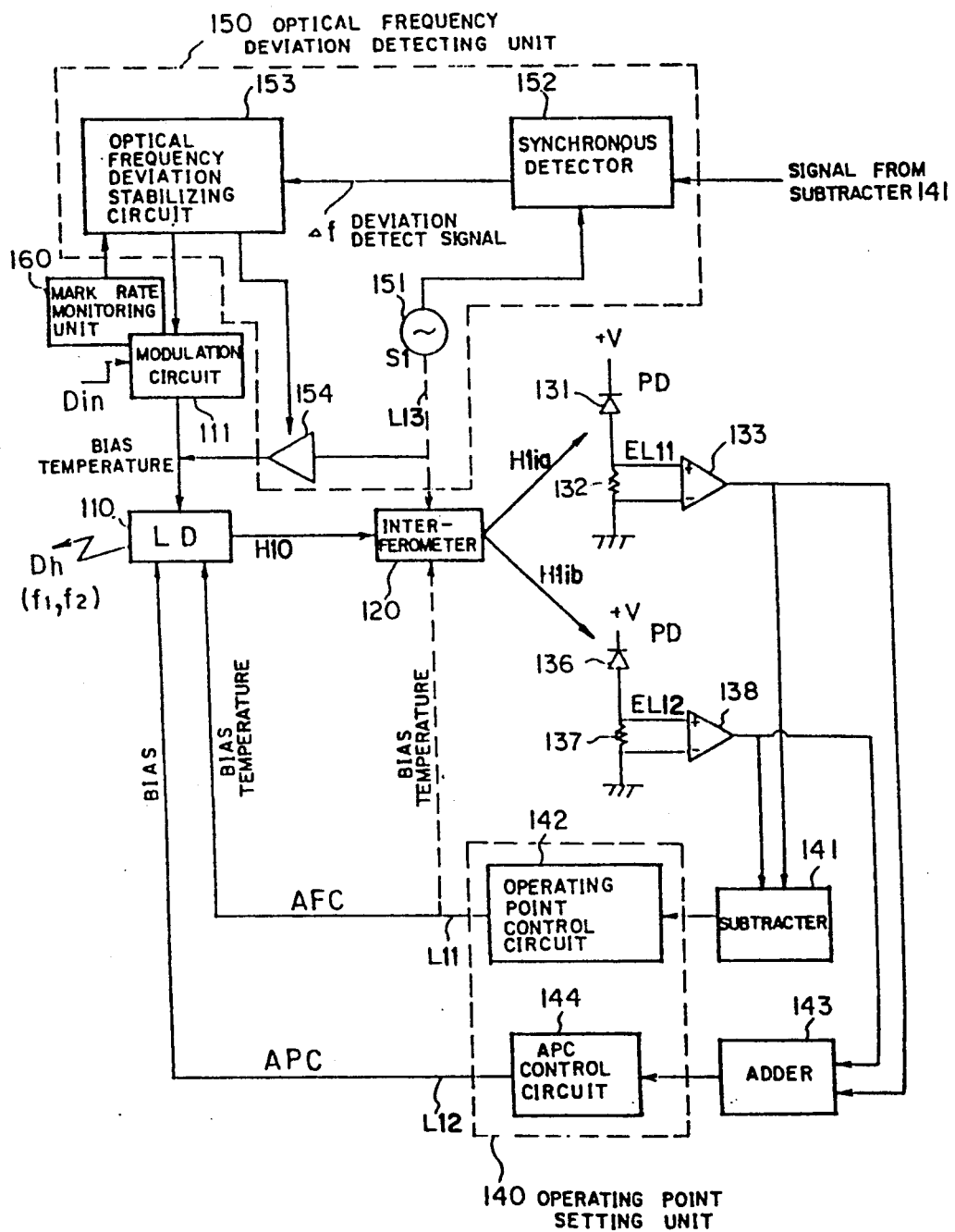
FIG. 27 is a block diagram of a fifth embodiment of the present invention.

FIG. 27 is a block diagram of a fifth embodiment of the present invention.

In the figure, forward light of semiconductor laser 110 is transmitted to a transmission line not shown as optical data Dh. A control signal may be taken from the forward light. The optical data Dh has been subjected to optical frequency modulation or phase modulation according to logic levels 1 and 0 of data Din to be transmitted. The modulation with the data Din to be transmitted is performed by a modulation circuit 111. Though not shown, a well known bias circuit is connected to the semiconductor laser 110 in order to perform the optical modulation under the optimum drive conditions.

The device of the present invention operates in response to reception of FSK modulated output light H10 from the semiconductor laser 110, which consists of backward light. Interferometer 120 receives the output light H10 from the semiconductor laser to produce two complementary interference light components H1i$a$ and H1i$b$ according to their optical frequency discriminating characteristics.

Examples of an interferometer adapted to produce two complementary interference light components are illustrated in FIGS. 20A, 21A and 22. The optical frequency discriminating characteristics of the two complementary interference light components H1i$a$ and H1i$b$ are illustrated in FIG. 6A.

Referring back to FIG. 27, two optical receivers 131 and 136 are provided for receiving the two interference light components H1i$a$ and H1i$b$. Each of the optical receivers may comprise a photodiode. The interference light components H1i$a$ and H1i$b$ are respectively converted to electric signals EL11 and EL12 which indicate their light intensity. In a subtracter 141 and an adder 143, voltage signals corresponding to the electric signals EL11 and EL12 are subjected to subtraction and addition. To this end, there are provided voltage detecting resistors 132 and 137 and instrument amplifiers 133 and 138.

The subtracter 141 outputs the difference between the electric signals EL11 and EL12 from the optical receivers 131 and 136.

The adder 143 outputs the sum of the electric signals EL11 and EL12.

In the present embodiment, the operating point setting means 140 comprises an operating point control circuit 142 and an APC control circuit 144.

The operating point control circuit 142 uses the difference signal of the electric signals EL11 and EL12 from the subtracter 141 as an operating point detecting signal and makes the operating point correspond to the median MED between the MAX and the MIN of the optical frequency discriminating characteristic at all times. The methods of shifting the operating point includes a method of providing feedback to the bias or temperature of the semiconductor laser 110 via a control line L11 to control the oscillation frequency of the semiconductor laser 10 and a method of providing feedback to the bias or temperature of the interferometer 120 via the control line L11 to control the interference characteristic of the interferometer 120. Both of the methods may be used in combination. In the case of feedback to temperature, a known Peltier device is used. Since the two interference light components H1i$a$ and H1i$b$ are complementary to each other, the difference therebetween crosses the zero point at the median MED as shown in FIG. 6B. Namely, the use of the difference signal of the electric signals EL11 and EL12, which crosses the zero point at the median MED, as the operating point detecting signal and the provision of feedback to the bias or temperature of the semiconductor laser or the bias or temperature of the interferometer permits the operating point to be stabilized at the optical frequency at which the difference signal becomes zero. In the case of feedback to the bias or temperature of the semiconductor laser, the control of the operating point frequency also permits the oscillation frequency of the output light H10 of the semiconductor laser to be controlled. Thus, the stabilization of the operating point and automatic frequency control (AFC) of the semiconductor laser can be performed at the same time.

The APC control circuit 144 uses the sum of the electric signals EL11 and EL12 from the adder 143 as an optical output detecting signal and comprises a comparator which receives at its first input the optical output detecting signal and at its second input a predetermined set voltage V11. The control circuit detects a difference between the set voltage V11 and the optical output detecting signal and provides feedback to the bias of the semiconductor laser 110 via the control line L12 so that the difference may become zero at all times. Since the two interference light components H11a and H11b are relative to each other, the addition thereof will produce a flat output as indicated by a dash-dotted line in FIG. 6A. The flat output is proportional to the light output of the semiconductor laser 110. Namely, the automatic light output control (APC) is realized by setting the voltage V11 to correspond to a flat signal obtained by addition of the electric signals EL11 and EL12 and providing feedback to the semiconductor laser 110 so that the level of the flat signal may become constant.

The optical frequency deviation detecting means 150 comprises an low-frequency oscillator 151, a synchronous detector 152, an optical frequency deviation stabilizing circuit 153 and an amplifier 154.

The low frequency oscillator 151 varies the oscillation frequency of the semiconductor laser 110 or the interference characteristic of the interferometer 120 through a control line L13 at a low frequency in order to vary the oscillation frequency at the operating point in the optical frequency discriminating characteristic. The low frequency is used herein to mean that it is low in comparison with the frequency of a data transmission rate and is, for example, 100 Hz. The operating point is varied by a low-frequency signal whose speed is higher than the response speed of the operating point setting means 140. The low-frequency signal S1 is used as a synchronous detection signal in the synchronous detector 152. By superimposing the low-frequency signal S1 on the bias or temperature of the semiconductor laser or on the bias or temperature of the interferometer 120, the oscillation frequency at the operating point is varied.

Although the operation of the low-frequency oscillator 151, like the operation of the low-frequency oscillator 43 illustlated in FIG. 17, can be explained by referring to the waveform diagram of FIG. 18, it is omitted herein. The electric signals EL11 and EL12 containing a low-frequency component are detected by the synchronous detector 152 using the low-frequency oscillator output.

It is easy to vary the bias of the interferometer 120 as in the case of the interferometer 20 described previously. The explanation thereof is omitted herein.

Referring back to FIG. 27, the synchronous detector 152 detects the difference signal component of the electric signals EL11 and EL12 from the subtracter 141 using the low-frequency signal S1 which is the synchronous detection signal from the low-frequency oscillator 151 and extracts a signal component synchronized with the synchronous detection signal. The signal component extracted by the synchronous detection is the optical frequency deviation detecting signal which is used to measure an optical frequency deviation. Hereinafter, the measurement of the optical frequency deviation $\Delta f$ in the synchronous detector 152 will be described.

When the operating point of the FSK modulated optical signal is stabilized at the median MED between the MAX and the MIN of the optical frequency discriminating characteristic of the interferometer 120 and the operating point is shifted by the low-frequency signal S1 of the synchronous detection signal, the phase and amplitude of variations of the average light output intensity vary according to the magnitude of the optical frequency deviation $\Delta f$ as shown in FIG. 8. Thus, the magnitude of optical frequency deviation $\Delta f$ can be obtained by converting the average light output intensity from the interferometer 120 to an electric signal and detecting the electric signal using the low-frequency signal S1.

A relationship between the optical frequency deviation $\Delta f$ and the synchronous detection output signal for the average light output intensity is illustrated in FIG. 9. In the figure, a deviation of the synchronous detection output signal from zero represents a deviation of the optical frequency deviation $\Delta f$ from FSR/2. When $\Delta f = FSR/2$, the synchronous detection output signal becomes zero. That is, the measurement of the synchronous detection output signal is equivalent to the measurement of $\Delta f$.

The optical frequency deviation stabilizing circuit 153 may comprise a comparator which receives at its first input a deviation detect signal obtained by the synchronous detector 152 and at its second input a preset voltage V12 and provides feedback to the modulation circuit 111 so that the difference therebetween may become zero. Thereby, the optical frequency deviation $\Delta f$ (modulation index) is kept constant.

As an input to the synchronous detector 152 use is made of the difference signal of the electric signals EL11 and EL12. The difference signal is equivalent to addition of a broken curve to a solid curve in FIG. 9 with the former reversed in polarity. In other words, the optical frequency deviation can be controlled using a signal having a steep gradient. This permits a considerable increase of the S/N ratio in the optical frequency deviation control.

The amplifier 154 is provided, in superimposing the synchronous detection signal from the low frequency oscillator 151 on the bias of the semiconductor laser 110 via the control line L13, for feeding the optical frequency deviation detect signal from the optical frequency deviation stabilizing circuit 153 back to the modulation amplitude of the low frequency signal S1 which is the synchronous detection modulation signal so that the optical frequency deviation of optical frequency modulation by the modulation signal may be made constant and the optical frequency deviation detecting means 150 may not be affected by the modulation efficiency of the light source of the semiconductor laser 110.

That is, when the FM modulation efficiency (optical frequency variation per unit bias current) becomes small because of aging change of the bias of the semiconductor laser itself, the low frequency signal S1 may not be superimposed in the worst case. Thus, the operating point may not vary as set and the synchronous detection may become impossible. To avoid this, the amplifier 154 is used to make large the amplitude of the modulation signal for synchronous detection when the FM efficiency becomes small and to make small the amplitude of the modulation signal when the FM efficiency becomes too large. That is, the low-frequency signal S1 is controlled to have substantially the same amplitude. The magnitude of the FM modulation efficiency is determined on the basis of the magnitude of the optical frequency deviation $\Delta f$.

A mark rate monitor means 160 may comprise an integrator in the modulation circuit 111. The monitor means controls the operating state of the optical frequency deviation detecting means 150 by calculating the probability that logic levels 1 and 0 will occur in data modulation in which the frequency of the output light H10 of the semiconductor laser 110 is shifted to the first and second frequencies f1 and f2 in accordance with logic levels 1 and 0 of data to be transmitted.

FIG. 7A is a graph when the mark rate is ½. When the mark rate is ¼, that is, 1s and 0s occur in the ratio of 1 to 3, the average light output intensity moves to the top right in FIG. 7A. For this reason, the graph of FIG. 9 varies with the result that the value of Δf when the synchronous detection output signal becomes zero will vary according to the magnitude of the mark rate. Thus, it is required to change the set voltage V12 of the optical frequency deviation stabilizing circuit 153 according to the mark rate. The mark rate monitor 160 calculates the mark rate of modulation signal of the modulation circuit 111 and change the set voltage V12 according to the calculated mark rate, to thereby control the operating state of the optical frequency deviation detecting means 150. That is, a mark rate monitor signal of an input modulation signal is fed back to the optical frequency deviation stabilizing circuit 153 with the result that the circuit is not affected by variation in mark rate.

Figure 28:
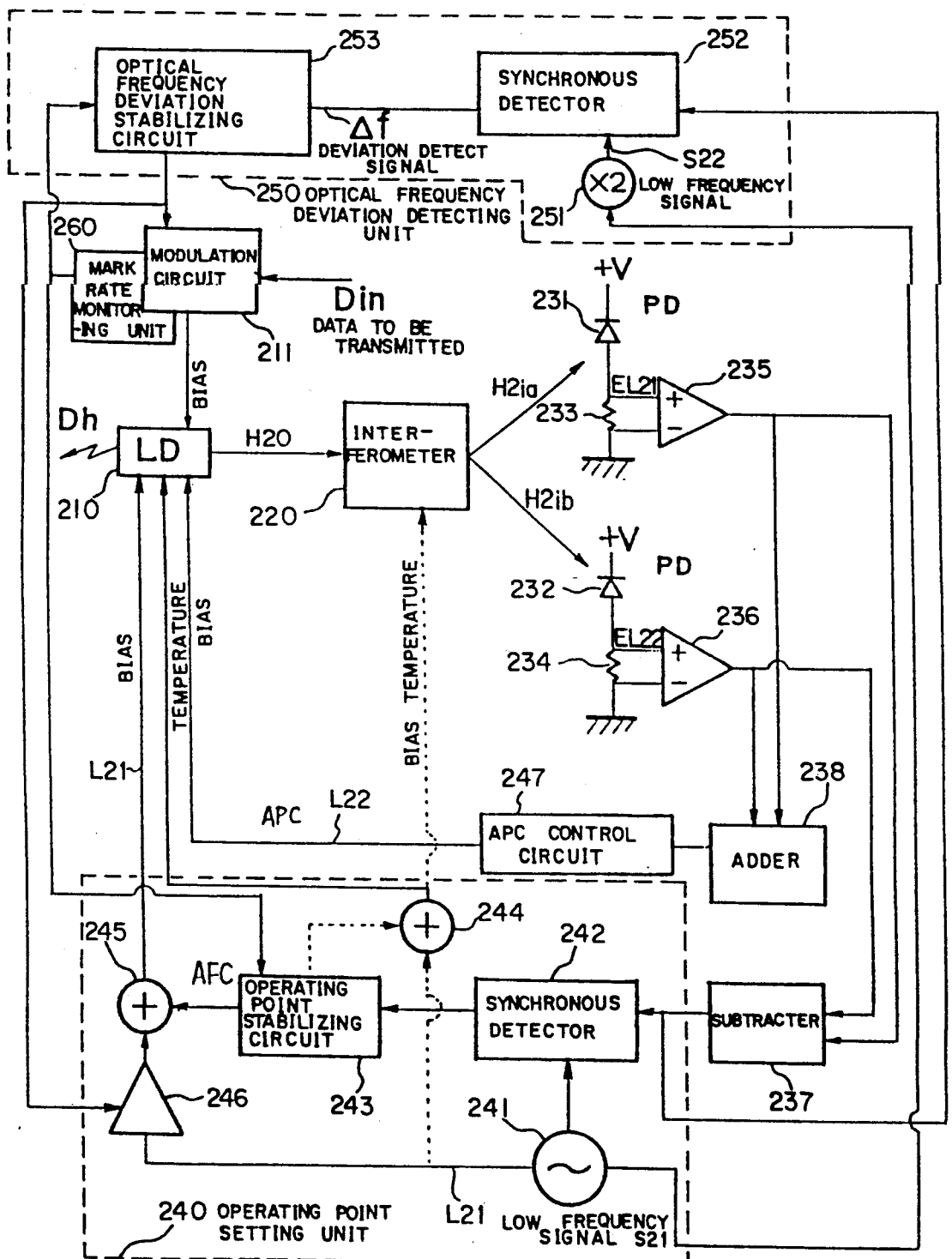
FIG. 28 is a block diagram of a sixth embodiment of the present invention.

FIG. 28 is a block diagram of a sixth embodiment of the present invention.

In the figure, forward light of a semiconductor laser 210 is transmitted to a transmission line not shown as optical data Dh. A control signal may be taken from the forward light. The optical data Dh has been subjected to optical frequency modulation or phase modulation according to logic levels 1 and 0 of data Din to be transmitted. The modulation with the data Din to be transmitted is performed by a modulation circuit 211. Though not shown, a well known bias circuit is connected to the semiconductor laser 210 in order to perform the optical modulation under the optimum drive conditions.

The device of the present invention operates in response to reception of FSK modulated output light H20 from the semiconductor laser 210, which consists of backward light. An interferometer 220 receives the output light H20 from the semiconductor laser to produce two complementary interference light components H2ia and H2ib according to their optical frequency discriminating characteristics.

Examples of an interferometer adapted to produce two complementary interference light components are illustrated in FIGS. 20A, 21A and 22. The optical frequency discriminating characteristics of the two complementary interference light components H2ia and H2ib are illustrated in FIG. 11A.

Referring back to FIG. 28, two optical receivers 231 and 232 are provided for receiving the two interference light components H2ia and H2ib, respectively. Each of the optical receivers may comprise a photodiode. The interference light components H2ia and H2ib are respectively converted to electric signals EL21 and EL22 which indicate their light intensity. In a subtracter 237 and an adder 238, voltage signals corresponding to the electric signals EL21 and EL22 are subjected to subtraction and addition. To this end, there are provided voltage detecting resistors 233 and 234 and instrument amplifiers 235 and 236.

The subtracter 237 outputs the difference between the electric signals EL21 and EL22 from the optical receivers 231 and 232.

The adder 238 outputs the sum of the electric signals EL21 and EL22.

In the present embodiment, the operating point setting means 240 comprises a low frequency oscillator 241, a synchronous detection circuit 242, an operating point stabilizing circuit 243, two adders 244 and 245 and an amplifier or attenuator 246.

The low frequency oscillator 241 produces a low-frequency signal S21 and varies the frequency at the operating point in the optical frequency discriminating characteristic at a low frequency. The methods of shifting the operating point includes a method of providing superimposition on the bias or temperature of the semiconductor laser 210 via a control line L21 to control the oscillation frequency of the semiconductor laser 210 and a method of providing superimposition on the bias or temperature of the interferometer 220 via the control line L21 to control the interference characteristic of the interferometer 220. Both of the methods may be used in combination. In the case of feedback to temperature, a known Peltier device is used. The low frequency is used herein to mean that it is low in comparison with the frequency of a data transmission rate and, for example, 100 Hz.

The synchronous detector 242 receives the difference signal component of the electric signals EL21 and EL22 from the subtracter 237, which is used as an operating point detecting signal, and the low-frequency signal S21 from the low-frequency oscillator 241 and extracts a signal component synchronized with the low frequency signal S21. The signal after the synchronous detection is equivalent to a waveform obtained by differentiating the optical frequency discriminating characteristic as described in connection with FIG. 11B. Thus, the synchronous detection signal becomes zero at the maximum value MAX and the minimum value MIN in the optical frequency discriminating characteristic. Thus, the operating point can be made to correspond to the maximum value MAX or the minimum value MIN by causing the operating point stabilizing circuit 243 to converges toward zero. That is, if feedback is provided to the bias or temperature of the semiconductor laser 210 or the bias or temperature of the interferometer 220 so that the synchronous detection signal may always become zero, the operating point will be stabilized at the optical frequency at which the synchronous detection signal becomes zero. In the case of feedback to the bias or temperature of the semiconductor laser 210, the control of the operating point frequency also permits the oscillation frequency of the semiconductor laser to be controlled. Thus, the stabilization of the operating point and automatic frequency control (AFC) of the semiconductor laser 210 can be performed at the same time.

The APC control circuit 247 uses the sum of the electric signals EL21 and EL22 from the adder 238 as an optical output detecting signal and may comprise a comparator which receives at its first input the optical output detecting signal and at its second input a predetermined set voltage V21. The APC control circuit 247 detects a difference between the set voltage V21 and the optical output detecting signal and provides feedback to the bias of the semiconductor laser 210 via the control line L22 so that the difference may become zero at all times. Since the two interference light components H2ia and H2ib are complementary to each other, the addition thereof will produce a flat output as indicated by a chain line in FIG. 11 A. The flat output is proportional to the light output of the semiconductor laser 210. Namely, the automatic light output control (APC) is realized by setting the voltage V21 to correspond to the flat signal obtained by addition of the electric signals EL21 and EL22 and providing feedback to the semiconductor laser 210 so that the level of the flat signal may become constant.

The superimposition on and the feedback to the temperature of the semiconductor laser 210 from the low frequency oscillator 241 and the operating stabilizing circuit 243 and the superimposition on and feedback to the bias or temperature of the interferometer 220 are combined in an adder 244. Also, the superimposition on and feedback to the bias of the semiconductor laser 210 from the low frequency oscillator 241 and the operating point stabilizing circuit 243 are combined in an adder 245.

Although the operation of the low-frequency oscillator 241 like the operation of the low-frequency oscillator 43 illustrated in FIG. 17, can be explained by referring to the waveform diagram of FIG. 18, it is omitted herein. The electric signals EL21 and EL22 containing a low-frequency component are detected by the synchronous detector 242 using the low-frequency oscillator output.

It is easy to vary the bias of the interferometer 220 as in the case of the interferometer 20 described previously. The explanation thereof is omitted herein.

The optical frequency deviation detecting means 250 comprises a second low frequency oscillator 251, a second synchronous detection circuit 252 and an optical frequency deviation stabilizing circuit 253. The second low frequency oscillator is a multiplier which receives a low frequency signal S21 from the first low frequency oscillator 241 and produces a low frequency signal S22 whose frequency is twice that of the signal S21.

The second synchronous detection circuit 252 receives the difference signal of the electric signals EL21 and EL22 from the subtracter 237 as an optical frequency deviation detecting signal under the condition that the operating point of the interferometer 220 is stabilized at the maximum value MAX or the minimum value MIN of the optical frequency discriminating characteristic by the operating point setting means 240. It also receives the low frequency signal S22 from the second low frequency oscillator 251 as a reference signal for synchronous detection and performs synchronous detection on the difference signal to extract the low frequency signal S22, thereby detecting an optical frequency deviation.

Having described in connection with FIG. 12, when the low frequency signal S21 from the low frequency oscillator 241 is superimposed on the bias or temperature of the semiconductor laser 210 or the interferometer 220 to shift the operating point, the low frequency signal component S22 whose frequency is twice that of the low frequency signal S21 appears most strongly in variations in the average light intensity of the interferometer 220. The amplitude of the signal S22 corresponds to the magnitude of $\Delta f$. This is based on the fact that the detect signal after the synchronous detection of an electric signal corresponding to the light intensity with the low frequency signal S22 and the optical frequency deviation $\Delta f$ have such a relationship as show in FIG. 13.

If the low frequency signal S22, whose frequency is twice that of the low frequency signal S21, of the average light output intensity of the interference light H2i which has been modulated with the low frequency signal S21 previously is extracted by synchronous detection using the low frequency signal S22, then an optical frequency deviation detecting signal will be obtained. In this case, as the optical frequency deviation detecting signal to the second synchronous detection circuit 252 the difference component of the electric signals E121 and EL22 from the subtracter 237 is used. The difference signal is doubled in amplitude as shown in FIG. 11B. The optical frequency deviation $\Delta f$ can be detected using a signal having a steep gradient. This will increase the S/N ratio in the optical frequency deviation control.

The optical frequency deviation stabilizing circuit 253 may comprise a comparator which receives at its first input a deviation detecting signal obtained by the second synchronous detector 252 and at its second input a preset voltage V22 and provides feedback to the modulation circuit 211 so that the difference therebetween may converges toward zero. The set voltage V22 corresponds to voltage V22 corresponding to a preset optical frequency deviation $\Delta f$ in the graph of FIG. 13. The set voltage V22 corresponds to the optical frequency deviation $\Delta f$ to be kept constant. The control of stabilization of the optical frequency deviation (modulation index) will also become possible.

The amplifier or attenuator 246 is provided, in superimposing the low frequency signal S21 which is a modulation signal for synchronous detection signal from the low frequency oscillator 241 on the bias of the semiconductor laser 210 via the control line L21, for feeding the optical frequency deviation detecting signal from the optical frequency deviation stabilizing circuit 253 back to the modulation amplitude of the modulation signal S21 for synchronous detection so that the optical frequency deviation of optical frequency modulation by the modulation signal may be kept constant and the operating point setting means 240 and the optical frequency deviation detecting means 250 may not be affected by the modulation efficiency of the light source of the semiconductor laser 210.

That is, when the FM modulation efficiency (optical frequency variation per unit bias current) becomes small because of aging change of the bias of the semiconductor laser 210 itself, the low frequency signal S21 may not be superimposed in the worst case. Thus, the operating point may not vary as set and the synchronous detection may become impossible. To avoid this, the amplifier or attenuator 246 is used to make the amplitude of the modulation signal for synchronous detection large when the FM efficiency becomes small and to make the amplitude of the modulation signal small when the FM efficiency becomes too large. That is, the low-frequency signal S21 is made to have substantially the same amplitude. The magnitude of the FM modulation efficiency is determined on the basis of the magnitude of the optical frequency deviation $\Delta f$.

A mark rate monitor means 260 may comprise an integrator in the modulation circuit 211. The monitor means controls the operating state of the operating point setting means 240 and the optical frequency deviation detecting means 250 by calculating the probability that logic levels 1 and 0 will occur in data modulation in which the frequency of the output light H20 of the semiconductor laser 210 is shifted to the first and second frequencies f1 and f2 in accordance with logic levels 1 and 0 of data to be transmitted for feedback to the operating stabilizing circuit 243 and the optical frequency deviation detecting means 253.

The light output intensity at the operating point in FIG. 11 varies between the case where the mark rate is $\frac{1}{2}$, namely, where the probability that a 1 will occur and the probability that a 0 will occur are in the ratio of one to one and the case where the mark rate is ¼, namely, where the probability that a 1 will occur and the probability that a 0 will occur are in the ratio of one to three. For this reason, the graph of FIG. 13 varies with the result that the value of Δf when the synchronous detection output signal becomes a preset value will vary according to the magnitude of the mark rate. Thus, it is required to change the set voltage V22 of the optical frequency deviation stabilizing circuit 253 according to the mark rate. The mark rate monitor 260 calculates the mark rate of the modulation signal of the modulation circuit 211 and change the set voltage V22 according to the calculated mark rate so that the optical frequency deviation detecting means 250 will not be affected by variation in mark rate. The operating point setting means 240 performs control so that the output of the synchronous detection circuit 242 may become zero. An offset voltage may be added to the output of the synchronous detection circuit 242 according to a variation in the mark rate to shift the operating point from the maximum value or the minimum value.

Figure 29:
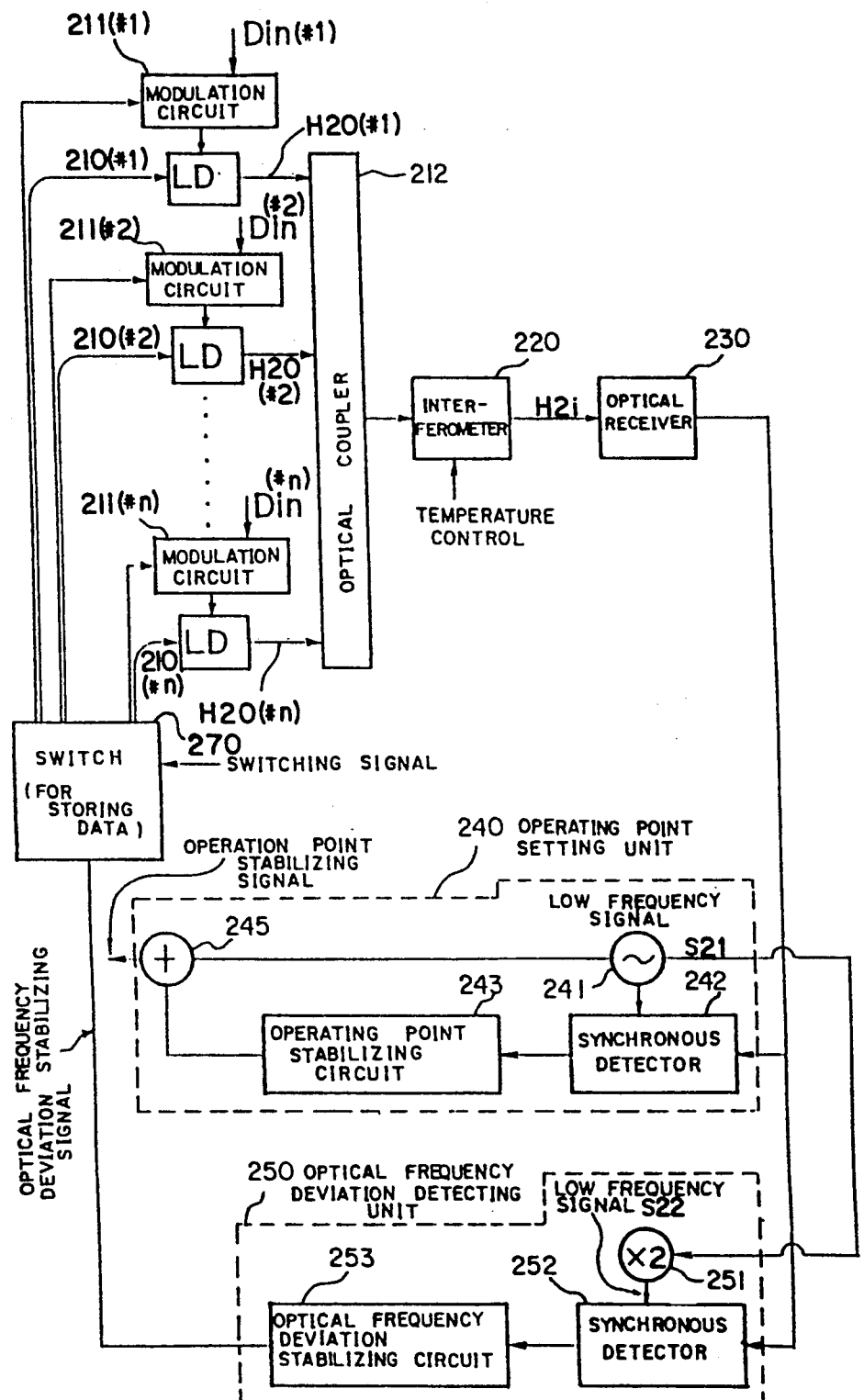
FIG. 29 is a block diagram of a seventh embodiment of the present invention.

FIG. 29 is a block diagram of a seventh embodiment of the present invention. This embodiment is directed to a measure and control device for use with FDM (frequency-division multiplex) transmission.

As shown, there are two or more semiconductor lasers 210(#1, #2,....#n) because separate optical frequencies are required in the FDM transmission. Also, there are provided two or more modulation circuits 211(#1, #2, . . . #n) for optical frequency modulating light outputs of the semiconductor lasers with datas Din(#1, #2, . . . #n) to be transmitted. FSK modulated outputs of the semiconductor lasers are input to an optical coupler 212 and then output to an interferometer 220. The optical outputs are transmitted to an optical receiver 230 as interference light H2i based on optical frequency discriminating characteristics.

The feature of the present embodiment is that a single interferometer is provided. In general, the maximum values (the minimum values) in the optical frequency discriminating characteristic of interferometers are spaced at equal intervals as is shown in FIG. 11A and 11B. In the case of FDM transmission in which more than two frequencies are required and the frequencies used need to be spaced with accuracy, particularly in the case where, like the present invention, an optical frequency deviation is measured and controlled with the operating point stabilized at the maximum value or minimum value of the optical frequency discriminating characteristic, it is convenient because the frequency spacing is determined simply by setting the operating point of each semiconductor laser at a corresponding respective maximum value in an optical frequency discriminating characteristic.

The interferometer 220, the optical receiver 230, the operating point setting means 240 comprising the low-frequency oscillator 241, the synchronous detection circuit 242 and the adder 245, and the optical frequency deviation detecting means 250 comprising the second low-frequency oscillator 251, the second synchronous detection circuit 252 and the optical frequency deviation stabilizing circuit 253 are each the same as a corresponding one in the sixth embodiment in arrangement and function and thus their description is omitted.

The present embodiment is provided with a switch circuit 270 which is responsive to application of a switching signal from a control circuit not shown to select a semiconductor laser 210(#i) which needs stabilization control of optical frequency and optical frequency deviation. This will be described below.

The principle of the operation of the present invention is summarized by stabilizing the operating point of the interferometer 220 to the maximum value or the minimum value of the optical frequency discriminating characteristic, and detecting and controlling the optical frequency deviation Δf after extraction of the low-frequency signal component S22 produced under the stabilized operating point from the electric signal by means of synchronous detection. It is therefore required to superimpose the low-frequency signal S21 for synchronous detection from the low-frequency oscillator 241 on the bias or temperature of the semiconductor laser 210. (With the seventh embodiment applied to FDM system, to keep the optical frequency discriminating characteristic fixed, the low-frequency signal S21 is not superimposed on the bias or temperature of the interferometer 220. Instead, the interferometer is subjected to different temperature control.) That is, selection is made to superimpose a modulation signal for synchronous detection on, and feed an operation point stabilizing signal and an optical frequency deviation stabilizing signal back to, a semiconductor laser 210(#i) which requires stabilization control of optical frequency and its deviation.

Specifically, n semiconductor lasers 210 (#1, #2, . . . #n are sequentially selected on a time-division basis by the switch 270 and a modulation signal for synchronous detection is superimposed on the bias or temperature of a selected semiconductor laser 210 (#i). At this point, other semiconductor lasers are operating to produce forward and backward light. The switch circuit 270 is provided with a register for storing data. The semiconductor laser 210 (#i-1), which has been selected immediately before the laser 210(#i) is selected, continues to output to a transmission line the light with an optical frequency deviation of Δf at the point of time when it was subjected to stabilization control in response to a control signal stored in the register when it was selected. After the elapse of a fixed period of time, the laser 210(#i-1) is selected again and subjected to stabilization control of optical frequency and its deviation by superimposition of a modulation signal for synchronous detection on its bias or temperature.

Though not shown, the seventh embodiment of the present invention may be modified as follows.

That is, instead of providing the switch circuit 270, two or more low-frequency oscillators and synchronous detectors may be provided for superimposing a synchronous detection low-frequency signal S21(#1, #2, . . . #n) of a different frequency on the bias or temperature of each of the semiconductor lasers 210(#1, #2, . . . #n . In this case, the semiconductor lasers need not be selected on a time-division basis. Output lights H20(#1, #2,....#n) are output from the semiconductor lasers to the optical coupler 212 simultaneously and the interferometer 220 receives the output lights at the same time. At this time, the stabilization control of optical frequency and optical frequency deviation for the semiconductor lasers are performed simultaneously. In this case, to avoid the circuitry becoming large in scale, the synchronous detector side may use a time-division system. To obtain two or more different oscillation frequencies, more than one frequency multiplier may be used for a single oscillator.

Though not shown, the seventh embodiment may be further modified as follows.

That is, the operating point setting means 240 having the low-frequency oscillator 241 and the synchronous detector 242 may perform the sequential superimposition of a modulation signal on the semiconductor lasers and the simultaneous superimposition of modulation signals of different frequencies on the lasers selectively. And, the above two methods of superimposition may be used, individually, alternatively, in one after another, in order and in composition. Namely, the sequential superimposing system used in the seventh embodiment or the different frequency superimposing system used in the modified embodiment may be used as needed.

As described above, in the seventh and its modified embodiments, stabilization control of optical frequency and optical frequency deviation of semiconductor lasers can be performed effectively in the case of optical frequency multiplex transmission in particular.

Figure 30:
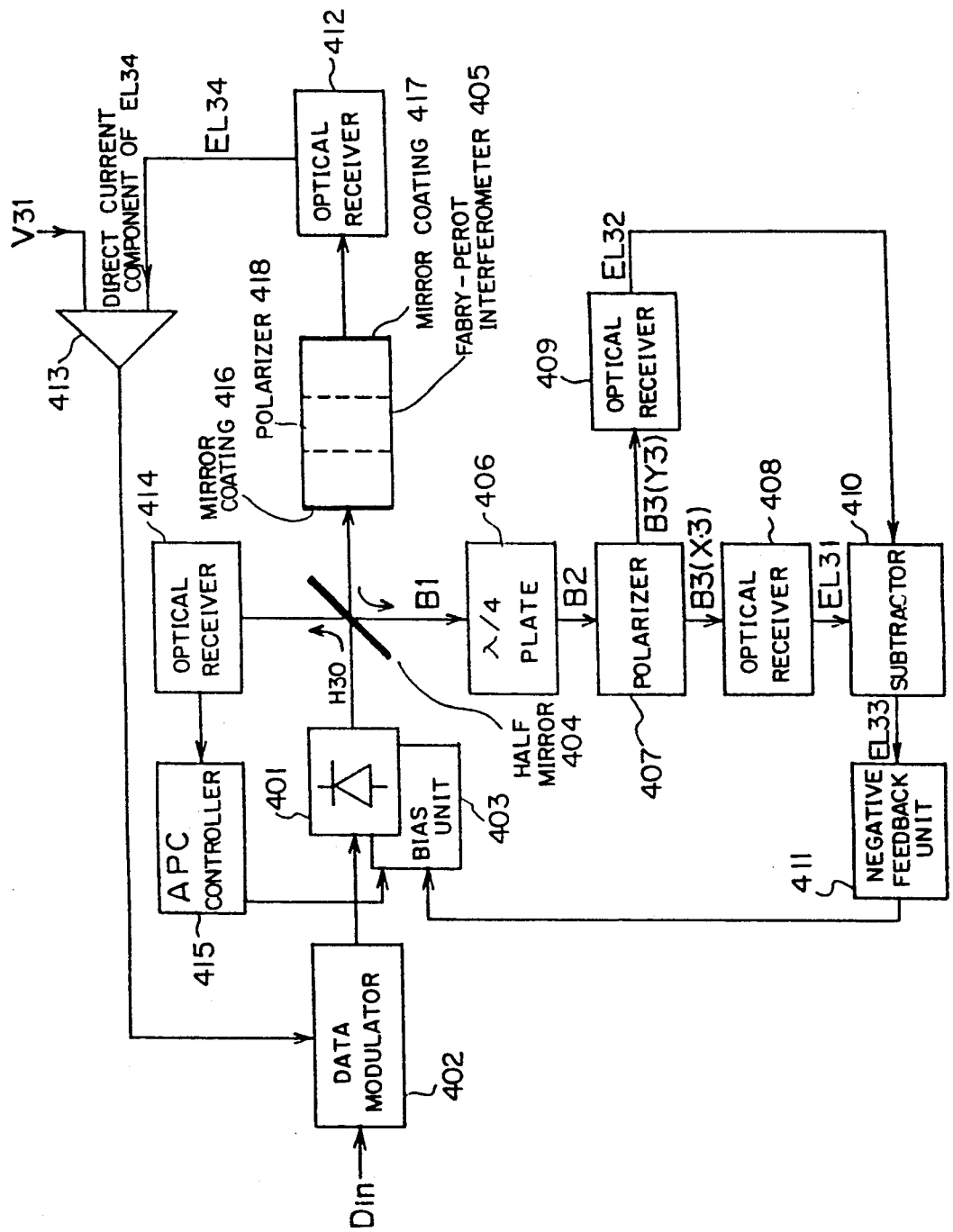
FIG. 30 is a block diagram of a eighth embodiment of the present invention.

FIG. 30 is a block diagram of a eighth embodiment of the present invention. The feature of the embodiment resides in that stabilization control of an operating point of a semiconductor laser is performed as a pre-process for stabilizing the optical frequency deviation in the semiconductor laser, not performed by the low frequency modulating operation using a low frequency oscillator and the synchronous detecting operation using a synchronous detecting circuit, but performed by the controlling operation using the reflected light from the interferometer.

In FIG. 30, the semiconductor laser 401, data modulator 402, bias unit 403, and a comparator 413 has the same function respectively as that of 10, 11, 12, and 51 shown in FIGS. 16 and 17.

The incident light H30 as linearly polarized backward light from the semiconductor laser 401 is applied to the half mirror 404.

Figure 31A:
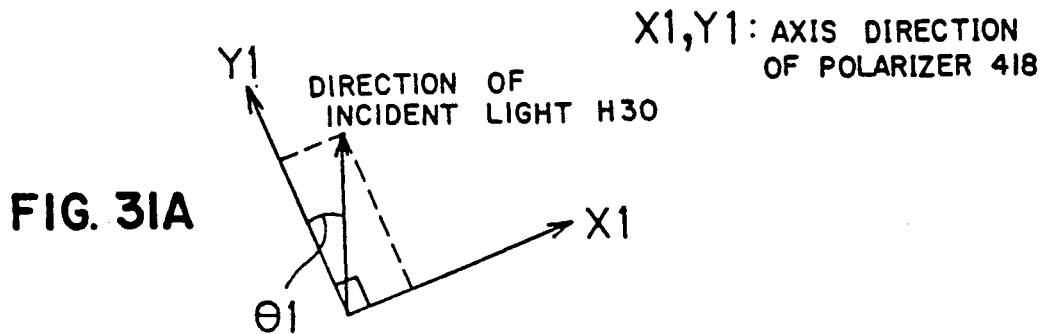
FIGS. 31(a)-31(c) are views for explaining the axis direction of $\lambda/4$ plate and polarizer in the eighth embodiment.

After passing through the half mirror 404, the laser light is inputted to a Fabry-Perot interferometer 405 which is applied with the polarizer 418 internally and mirror coating 416 and 417 on both of its right and left sides. The polarizer 418 is arranged such that its main axis (in the polarization direction of the resonating laser light) makes an angle of $\theta1$ ($0<\theta1<90°$) degrees with the polarization direction of the incident light H30 as shown in FIG. 31A.

Figure 31B:
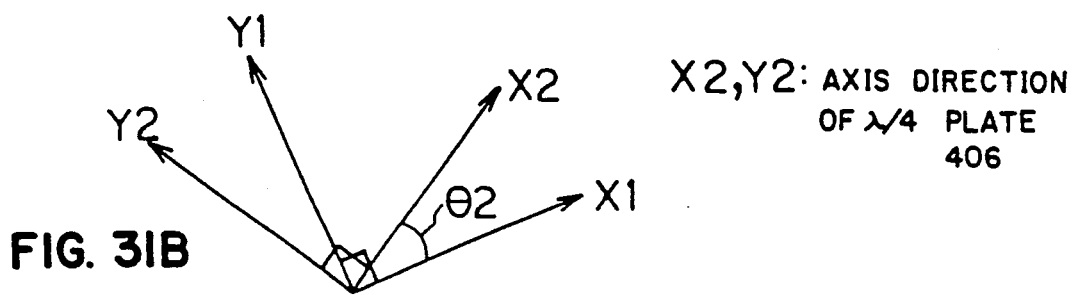
Figure 31C:
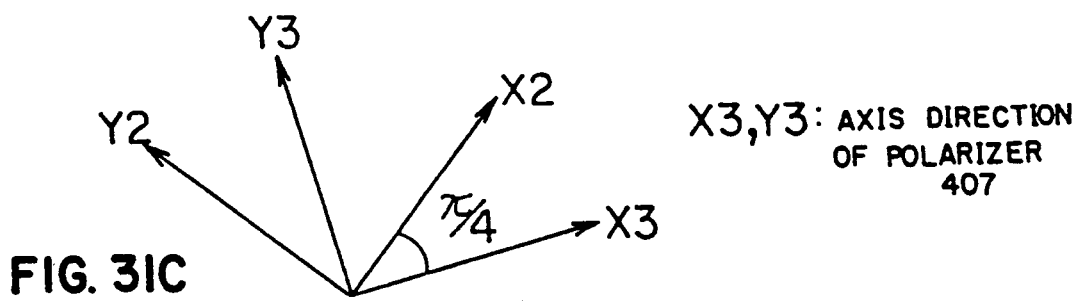

Reflected light B1 reflected in the direction of the half mirror 404 from the Fabry-Perot interferometer 405 is reflected at the half mirror 404, and then passes through a $\lambda/4$ plate 406 and a polarizer 407 with the main axis arranged at $\lambda/4$ degrees to each other as is shown in FIG. 31C.

Then, each laser light in the direction of X3 and Y3 from the polarizer 407 is received by optical receivers 408 and 409 respectively.

A subtractor 410 subtracts an output signal EL32 of the optical receiver 409 from an output signal EL31 of the optical receiver 408.

A negative feedback unit 411 applied negative feedback to the bias unit 403 according to a subtracting output EL33 from the subtractor 410, thus realizing the controlling operation such that an operating point in the semiconductor laser 401 can constantly corresponds to the optical frequency corresponding to the maximum value in the optical frequency discriminating characteristics of the Fabry-Perot interferometer 405.

On the other hand, after passing through the Fabry-Perot interferometer 405, the interference light is received by the optical receiver 412, and the direct current component in an output signal EL34 is applied to the comparator 413.

The comparator 413, like the comparator 51 in the first embodiment shown in FIGS. 16 and 17, calculates the difference between the direct component voltage from the optical receiver 412 and the predetermined voltage V31. Then, the data modulator 402 is provided with negative feedback by the difference, thus stabilizing the optical frequency deviation of the laser light of the semiconductor laser 401.

In the incident light H30 from the semiconductor laser 401, the laser light reflected at the half mirror 404 without passing through it is received by an optical receiver 414. An APC controller 415 applies negative feedback to the bias current of the bias unit 403 according to the monitoring light received by the optical receiver 414, thus realizing automatic light output control so that the output of the laser light of the semiconductor laser 401 can be kept at the predetermined level.

The feature of the sixth embodiment in the above described configuration is that it realizes the stabilization control on an operating point of the semiconductor laser 401 by controlling operation using the reflected light B1 from the Fabry-Perot interferometer 405. The description of the stabilization control on an operating point is given below.

First, the polarizer 418 in the Fabry-Perot interferometer 405 is positioned such that its main axis makes an angle of 1 (0 1 90°) degrees with the polarization direction of the incident light H30, as shown in FIG. 31A. Therefore, in the interferometer 405, only the component in the Y1 direction 1 degrees oblique to the incident light H30 resonates. The component in the X1 direction perpendicular to Y1 gets out of the interferometer 405, indicating the value of 0. On the other hand, at the mirror-coated side 416, the incident light H30 is reflected regardless of the internal polarizer 418.

Summing up, the reflected light B1 (containing X1 and Y1 components) reflected from the Fabry-Perot 405 to the half mirror 404 can be obtained as follows:

$$X1 = R^{\frac{1}{2}} \cdot \{A' \cdot \exp(i\omega t)\} \cdot \sin(\theta1) \tag{1}$$

$$Y1 = \frac{\{1 - \exp(i\theta)\} \cdot R^{\frac{1}{2}}}{1 - R \cdot \exp(i\theta)} \cdot \{A' \cdot \exp(i\omega t)\} \cdot \cos(\theta1)$$

$$\delta = \frac{4\pi n L}{\lambda}$$

where:
- $A' \cdot \exp(i\omega t)$: transmitted light passing through the half mirror 404 when $A \cdot \exp(i\omega t)$ is the incident light H30
- R: reflectance at the half mirror 404
- n: index of refraction of the polarizer 418
- L: length of resonator of the Fabry-Perot interferometer 405
- $\lambda$: wave length of the incident light H30

Next, when the direction of incident light of the reflected light B1 is arranged to make an angle of $\theta_2$ degrees with the main axis of the $\lambda/4$ plate 406 as shown in FIG. 31B, the output light from the $\lambda/4$ plate 406 (containing X2 and Y2 components) can be obtained as follows:

$$X2 = X1' \cdot \cos(0.2) + Y1' \cdot \sin(0.2)$$

$$Y2 = -X1 \cdot \sin(0.2) + Y1 \cdot \cos(0.2) \tag{2}$$

where
X1' and Y'1: signals represented with exp(i t) in X1 and Y1 in in the expression (1) substituted by exp-{i(ωt+π/2)}.

Further, as the main axes of the λ/4 plate 406 and the polarizer 407 are arranged to make an angle of π/4 degrees as shown in FIG. 31C, the output light B3 (containing X3 and Y3 components) from the polarizer 407 to the optical receivers 408 and 409 is obtained as follows:

$$X3 = X2 \cdot \cos(\pi/4) - Y2 \cdot \cos(\pi/4)$$

$$Y3 = X2 \cdot \sin(\pi/4) + Y2 \cdot \sin(\pi/4) \quad (3)$$

Therefore, the output EL31 of the optical receiver 408 and the output EL32 of the optical receiver 409 are obtained as follows:

$$E1 = (X3)(X3^*)$$

$$E2 = (Y3)(Y3^*) \quad (4)$$

Further, the output EL33 of the subtractor 410 can be obtained as follows:

$$E3 = (X3)(X3^*) - (Y3)(Y3^*) \quad (5)$$

On the other hand, as the interference light resonating in the Fabry-Perot interferometer 405 and comprising only Y1 component is outputted as shown in FIG. 31A in the direction of the Fabry-Perot interferometer 405 to the optical receiver 412, the output EL34 can be obtained as follows:

$$Y1 = \frac{1-R}{1-R \cdot \exp(i\theta)} \cdot \exp(i\omega t) \cdot \cos(\theta 1) \quad (6)$$

According to the above expressions (1)-(6), the output EL33 of the subtractor 410 shown in expression (5) show the maximum value $\theta 1 = \pi/4$, thus resulting in $\theta 1 = 0$, 90/2 indicating the value of 0. On the other hand, the output EL4 of the optical receiver 412 obtained in the expression (6) shows the maximum value when $\theta 1 = 0$, thus resulting in $\theta 1 = \pi/2$ indicating the value of 0. The above EL33 and EL34 never depend on $\theta 2$. As shown in FIG. 31C, by arranging the main axes of the λ/4 plate 406 and the polarizer 407 to make an angle of π/4 degrees, the information of the phase difference between the X1 and Y1 components of the light B1 reflected in the direction of the Fabry-Perot interferometer 405 to the half mirror 404 can be extracted as the output EL33 of the subtractor 410 shown in expression (5). That is, assuming that the phase difference between the X1 and Y1 components is φ;

$$E3 = B \cdot \sin \phi \quad (7)$$

where B shows a constant.

The phase difference φ shows 0 at the maximum value of the output EL34 of the optical receiver 412, and π at the minimum value. Therefore, the maximum and minimum points at the output EL34 corresponds to the zero point of the output EL33.

The above described characteristics are represented as follows. In expression (1), assuming that the index of refraction is n=1.5; the free spectral range of the Fabry-Perot interferometer 405 (corresponding to the optical frequency interval between maximum points in the optical frequency discriminating characteristics) is c/2nL=15 GHz (c means the speed of light); the reflectance at the half mirror 404 is R=0.9 (90%) and $\theta 1 = 90/8$ to calculate each optical frequency using the output EL33 of the subtractor 410 obtained in expression (5) and the output EL34 of the optical receiver 412 obtained in expression (6), the optical frequency characteristics can be obtained as shown in FIG. 32A and 32B.

The optical frequency characteristics of the output EL34 of the optical receiver 412 shown in FIG. 32B are the optical frequency discriminating characteristics of the Fabry-Perot interferometer 405 shown in FIG. 30. Therefore, as shown in FIG. 32A and 32B, the maximum point of the optical frequency discriminating characteristics of the Fabry-Perot interferometer 405 corresponds to the zero point of the optical frequency characteristics of the output EL33 of the subtractor 410.

According to the fact as derived above, The negative feedback unit 411 applies negative feedback to the bias unit 403 according to the output EL33 of the subtractor 410 to realize the controlling operation such that an operating point in the semiconductor laser 401 constantly corresponds to the optical frequency corresponding to the maximum value of the optical frequency discriminating characteristics in the Fabry-Perot interferometer 405.

Figure 32:
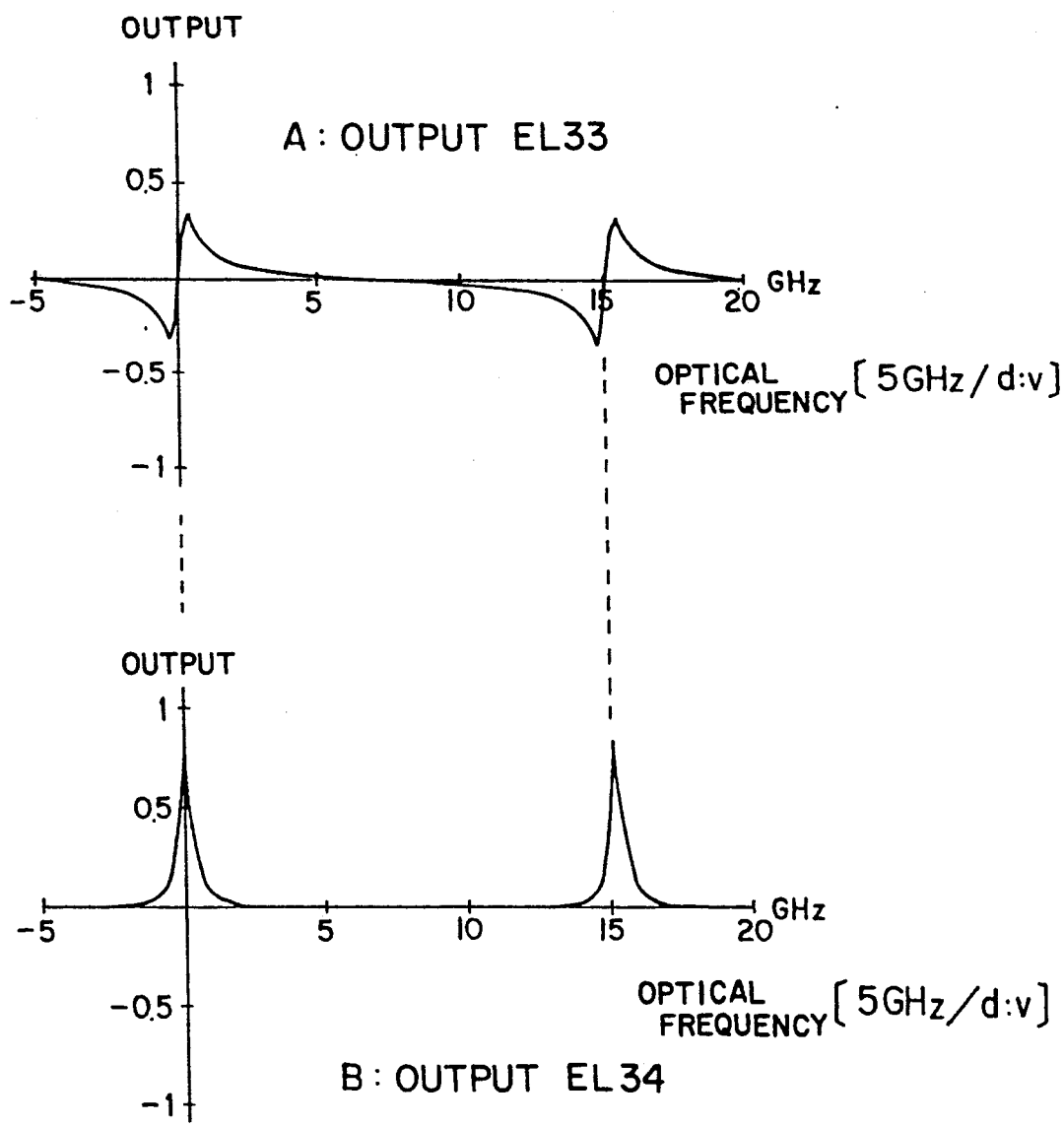
FIGS. 32(a)-32(b) are views for explaining the characteristics of optical frequency in the eighth embodiment.

In this case, as indicated by the optical frequency characteristics shown in FIG. 32, the negative feedback unit 411 applies negative feedback to the bias unit 403 to reduce the central optical frequency of the laser light in the semiconductor laser 401 when the output EL33 of the subtractor 410 shows straight polarity, that is, to reduce the bias current in the bias unit 403. On the other hand, when EL33 shows negative polarity, it applies negative feedback to increase the central optical frequency. Thus, the controlling operation can be realized such that an operating point in the semiconductor laser 401 corresponds to the optical frequency corresponding to the maximum value of the optical frequency discriminating characteristics in the Fabry-Perot interferometer 405.

Figure 33:
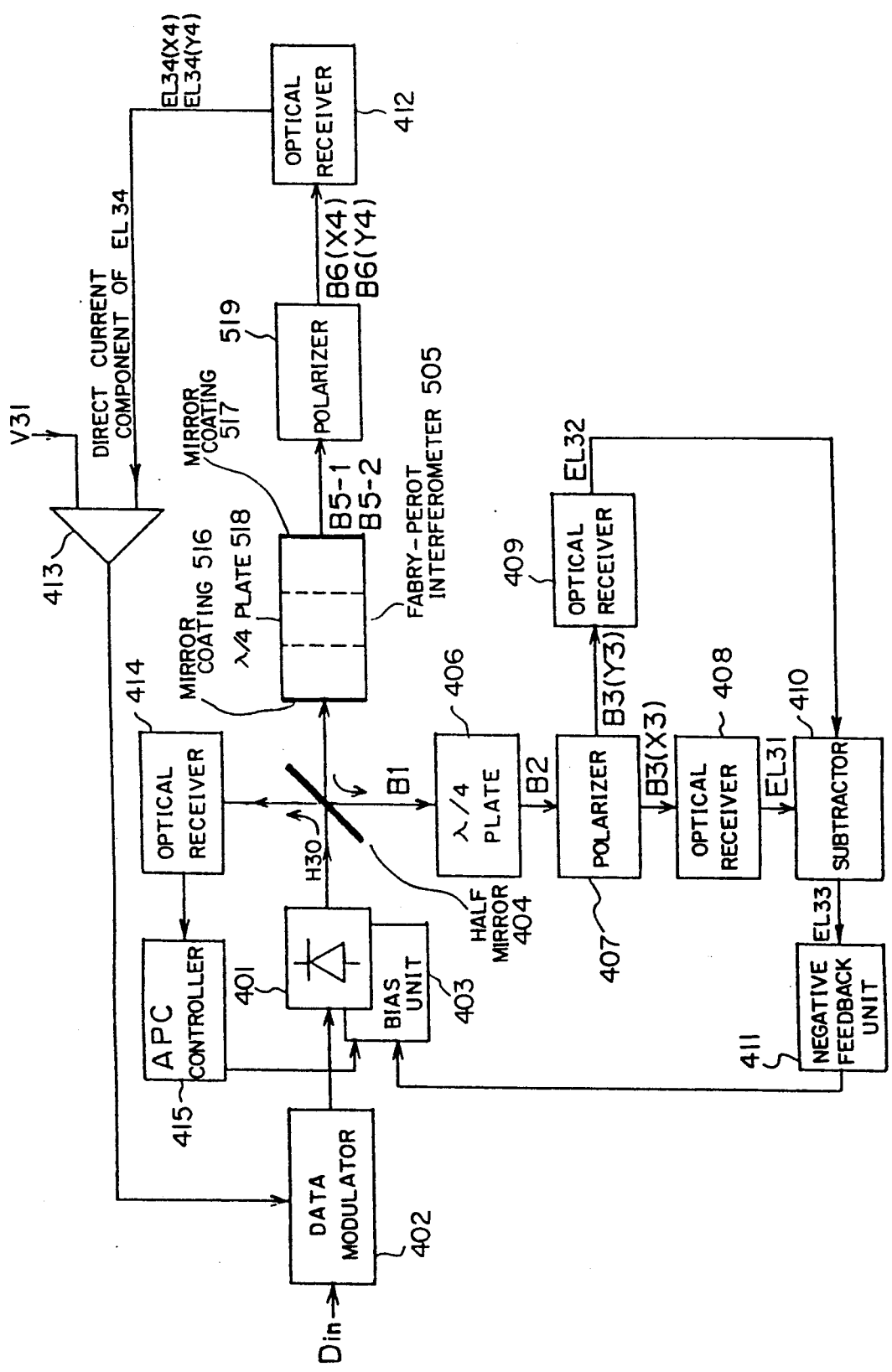
FIG. 33 is a block diagram of a ninth embodiment of the present invention.

FIG. 33 is a block diagram of a nineth embodiment of the present invention. In FIG. 33, the identical numbers to those assigned to the eighth embodiment as shown in FIG. 30 mean the same functions.

In the nineth embodiment, like in the eighth embodiment, the stabilization control on an operating point of the semiconductor laser 401 is performed by the controlling operation using the reflected light B1 from a Fabry-Perot interferomater 505. The difference between the embodiments in FIG. 30 and FIG. 33 is that the Fabry-Perot interferometer 505 in the nineth embodiment is provided internally with a λ/4 plate 18 not with a polarizer, and a polarizer 519 is adopted between the Fabry-Perot interferometer 505 and the optical receiver 412.

Figure 34:
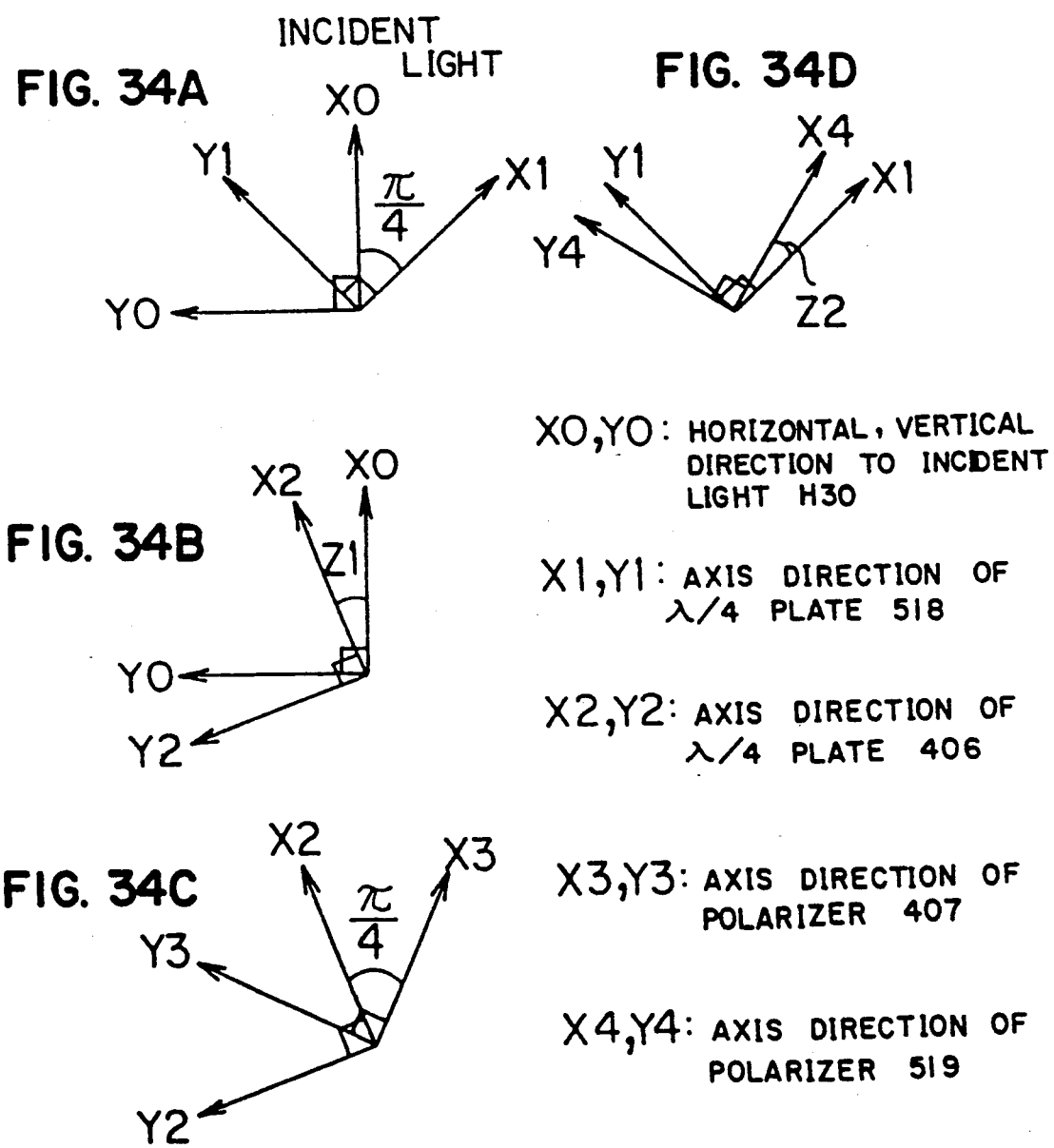
FIGS. 34(a)-34(d) are views for explaining the axis direction of $\lambda/4$ plate and polarizer in the ninth embodiment of the present invention.

The above described λ/4 plate 518 is arranged such that its main axis makes an angle of π/4 degrees with the polarization direction of the incident light H30 as shown in FIG. 34A. Accordingly, every time laser light traverses in the interferometer 505, the polarization direction of the reflected light changes alternately between in the perpendicular and horizontal directions to the polarization direction of the incident light H30.

The polarizer 519 is arranged such that its main axis makes an angle of Z2 degrees with the main axis of π/4 plate 518 as shown in FIG. 34D.

The stabilization control on an operating point of the semiconductor laser 401 in the nineth embodiment in the above configuration is explained as follows.

First, the reflected light B1 reflected in the direction of the half mirror 404 from the Fabry-Perot interferometer 505 using the $\pi/4$ plate 518 arranged such that its main axis makes an angle of $\pi/4$ degrees with the polarization direction of the incident light H30 in the Fabry-Perot interferometer 505 contains X0 component in the equal direction of the polarization direction of the incident light H30 and Y0 component in the perpendicular direction to the polarization direction of the incident light H30.

The reflected light B1 can be obtained as follows:

$$X0 = \frac{R^{\frac{1}{2}} \cdot \{1 - R \cdot \exp(2i\delta)\}}{1 - R^2 \cdot \exp(2i\delta)} \cdot \{A' \cdot \exp(i\omega t)\} \quad (8)$$

$$Y1 = -\frac{(1 - R) \cdot R^{\frac{1}{2}} \cdot \exp(i\delta)}{1 - R^2 \cdot \exp(2i\delta)} \cdot \{A' \cdot \exp(i\omega t)\}$$

$$\delta = \frac{4\pi nL}{\lambda}$$

where:
- $A' \cdot \exp(i\omega t)$: transmitted light passing through the half mirror 404 when $A \cdot \exp(i\omega t)$ is the incident light H30
- R: reflectance at the half mirror 404
- n: index of refraction of the $\pi/4$ plate 518
- L: length of the resonator of the Fabry-Perot interferomater 505
- : wave length of the incident light H30

Next, when the polarization direction of the reflected light B1 makes an angle of Z1 degrees with the main axis of the $\lambda/4$ plate 406 as shown in FIG. 34B, the output light (containing X2 and Y2 components from the $\lambda/4$ plate 406 can be obtained as follows:

$$\left. \begin{array}{l} X2 = X0' \cdot \cos(Z1) + Y0' \cdot \sin(Z1) \\ Y2 = -X0 \cdot \sin(Z1) + Y0 \cdot \cos(Z1) \end{array} \right\} \quad (9)$$

where:
X0' and Y0': signals represented with $\exp(i\omega t)$ in X0 and Y0 in expression (8) substituted by $\exp\{i(\omega t + \pi/2)\}$.

Further, as the main axes of the $\lambda/4$ plate 406 and the polarizer 407 make an angle of $\pi/4$ to each other as shown in FIG. 34C, each output light B3 (containing X3 and Y3 components) from the polarizer 407 to the optical receivers 408 and 409 can be obtained by expression (3) described in the explanation of the eighth embodiment as follows:

$$\left. \begin{array}{l} X3 = X2 \cdot \cos(\pi/4) - Y2 \cdot \cos(\pi/4) \\ Y3 = X2 \cdot \sin(\pi/4) + Y2 \cdot \sin(\pi/4) \end{array} \right\} \quad (3)$$

Thus, the output EL31 of the optical receiver 408, the output EL32 of the optical receiver 409, and the output EL33 of the subtractor 410 can be obtained by expressions (4) and (5) described in the explanation of the eighth embodiment as follows:

$$\left. \begin{array}{l} E1 = (X3)(X3^*) \\ E2 = (Y3)(Y3^*) \end{array} \right\} \quad (4)$$

$$E3 = (X3)(X3^*) - (Y3)(Y3^*) \quad (5)$$

On the other hand, in the direction of the polarizer 519 from the Fabry-Perot interferometer 505, interference light B5-1 resonating in the interferometer 505, comprising clockwise polarization to the polarization direction of the incident light H30 and obtained by the following expression (10), and interference light B5 2 comprising counterclockwise polarization and obtained by the following expression (11) are outputted.

$$\left. \begin{array}{l} X1 = \frac{1 - R}{1 - R^2 \cdot \exp(2i\delta)} \cdot \\ \qquad [A' \cdot \exp\{i(\omega t + \pi/2)\}] \cdot \cos(\pi/4) \\ Y1 = \frac{1 - R}{1 - R^2 \cdot \exp(2i\delta)} \cdot \\ \qquad \{A' \cdot \exp(i\omega t)\} \cdot \sin(\pi/4) \end{array} \right\} \quad (10)$$

$$\left. \begin{array}{l} X1 = \frac{R \cdot (1 - R) \cdot \exp(i\delta)}{1 - R^2 \cdot \exp(2i\delta)} \cdot \\ \qquad [A' \cdot \exp\{i(\omega t + 3\pi/2)\}] \cdot \cos(\pi/4) \\ Y1 = \frac{R \cdot (1 - R) \cdot \exp(i\delta)}{1 - R^2 \cdot \exp(2i\delta)} \cdot \\ \qquad \{A' \cdot \exp(i\omega t)\} \cdot \sin(\pi/4) \end{array} \right\} \quad (11)$$

Therefore, the interference light applied to the polarizer 519 shown in FIG. 33 can be obtained by adding the interference light B5-1 obtained by expression (10) and the interference light B5-2 obtained by expression (11) separately for X1 component and Y1 component. Assuming that components of the resultant light are X1 and Y1 respectively, light B6 (containing X4 and Y4 components) passing through the polarizer 519 can be obtained as follows:

$$\left. \begin{array}{l} X4 = X1 \cdot \cos(Z2) + Y1 \cdot \sin(Z2) \\ Y4 = -X1 \cdot \sin(Z2) + Y1 \cdot \cos(Z2) \end{array} \right\} \quad (12)$$

where assuming that the Y4 component is received by the optical receiver 412 in two components X4 and Y4 of the output light B6 from the polarizer 519, the output EL34 of the optical receiver 412 can be obtained as follows:

$$EL34 = (Y4)(Y4^*) \quad (13)$$

According to the above expressions (3), (4), (5), (8), (9), and (13), the output EL33 of the subtractor 410 shown in FIG. 33 and represented in expression (5) indicates the maximum value when the main axis of the $\lambda/4$ plate 518 makes an angle of $\pi/4$ degrees with the polarization direction of the incident light H30 as shown in FIG. 34A. Neither the EL33 nor the EL34 exists for the angle of Z1. The information of the phase difference between X0 and Y0 components in the reflected light B1 reflected in the half mirror 404 from the Fabry-Perot interferometer 505 represented in expression (8) can be extracted as the output EL33 of the subtractor 410 represented in expression (5) by arranging the λ/4 plate 406 and the polarizer 407 such that their main axes makes an angle of π/4 degrees to each other as shown in FIG. 34C.

That is, assuming that the phase difference between X0 and Y0 components is φ, the following expression exists:

$$EL33 = B \cdot \sin\phi \qquad (7)$$

where B shows a constant. The phase difference indicates 0 at the maximum point and π at the minimum point of the output EL34 of the optical receiver 412, in expression (8), like in the eighth embodiment. Therefore, the maximum or minimum point of the output EL34 corresponds to zero point of the output EL33.

Figure 35:
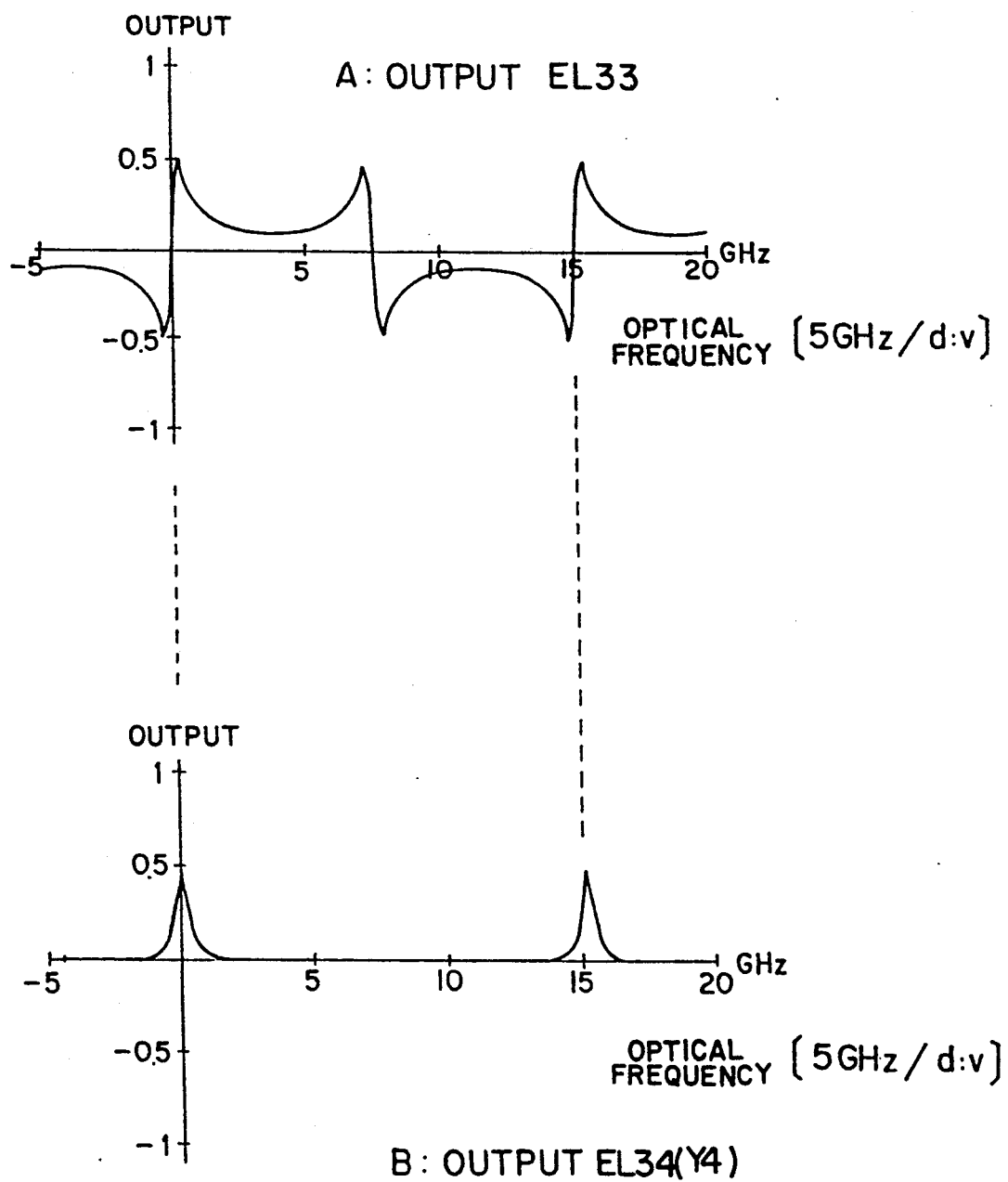
FIGS. 35(a)-35(b) are views for explaining the characteristic of optical frequency in the ninth embodiment.

Assuming that the index of refraction is n=1.5; the free spectral range of the Fabry-Perot interferometer 505 is c/2nL=15 GHz (c means the speed of light); the reflectance at the half mirror 404 is R=0.9 (90%) and Z2=0 to calculate each optical frequency using the output EL33 of the subtractor 410 obtained in expression (5) and the output EL34 of the optical receiver 412 obtained in expression (13), the optical frequency characteristics can be obtained as shown in FIGS. 35A and 35B.

As a result, as shown in FIG. 32 relating to the eighth embodiment, the maximum point of the optical frequency discriminating characteristics of the Fabry-Perot interferometer 505 corresponds to the zero point of the optical frequency characteristics of the output EL33 of the subtractor 410. Therefore, like in the eighth embodiment, the negative feedback unit 411 applies negative feedback to the bias unit 403 according to the output E3 of the subtractor 410, thereby realizing the stabilization control on an operating point of the semiconductor laser 401.

In this case, as indicated by the optical frequency characteristics shown in FIG. 35A, like in the eighth embodiment, the negative feedback unit 411 applies negative feedback to the bias unit 403 to reduce the central optical frequency of the laser light in the semiconductor laser 401 when the output EL33 of the subtractor 410 shows straight polarity, that is, to reduce the bias current in the bias unit 403. On the other hand, when EL33 shows negative polarity, it applies negative feedback to increase the central optical frequency.

In the above described eighth embodiment, as shown in FIG. 32A, when the negative feedback unit 411 applies negative feedback to the bias unit 403 according to the output EL33, the value of the output EL33 gets closer to zero as an operating point of the semiconductor laser 401 reaches as closely as possible to the central point of the optical frequency between the adjacent maximum points. Therefore, it becomes more difficult to converge stably to the target maximum point of the above described operating point when the operating point gets the closer to the above mentioned central point, and there is a possibility that the operating point may be converged to the adjacent maximum point. Conversely, in the nineth embodiment as shown in FIG. 35A, the value of the output EL33 shows a relatively large numeral having reversed polarity from the central frequency point toward both ends. Therefore, the operating point can be stably converged to the target maximum point even though the operating point gets the closer to the above described central point.

Thus, the nineth embodiment can reserve a larger lock-in -range of a n opera ting point of the semiconductor laser 401 than the eighth embodiment.

As described above, the controlling operation in the nineth embodiment can be realized such that an operating point of the semiconductor laser 401 corresponds to the optical frequency corresponding to the maximum value of the optical frequency discriminating characteristics in the Fabry-Perot interferometer 505.

Figure 36:
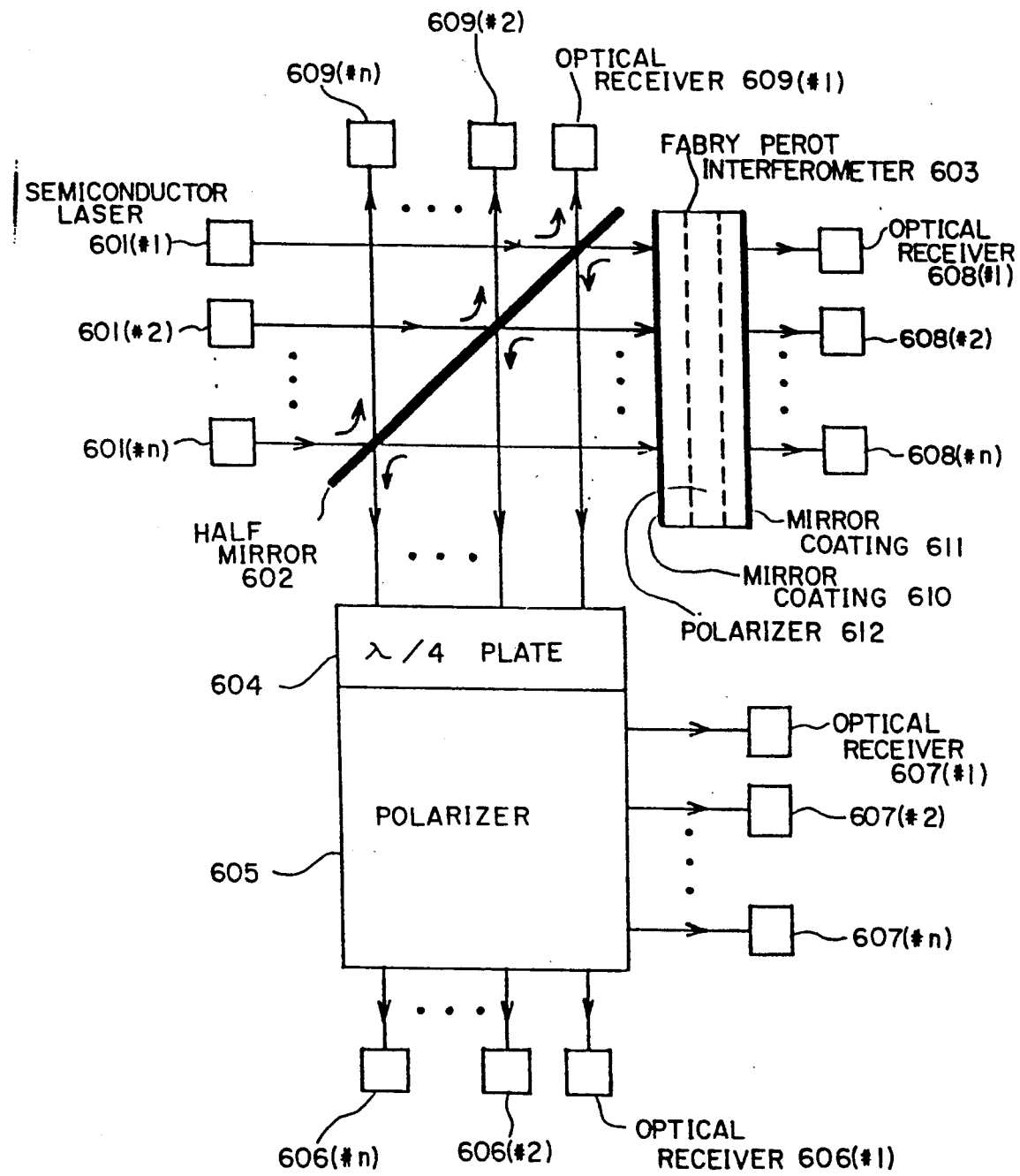
FIG. 36 is a block diagram of a tenth embodiment of the present invention.

Next, FIG. 36 is a block diagram of a tenth embodiment of the present invention. The embodiment has an extended configuration of the eighth configuration shown in FIG. 30 to allowing an FDM transmission system or a plurality processes of transmission at the same optical frequency.

In FIG. 36, a semiconductor laser 601 and optical receivers 606, 607, 608, and 609 correspond respectively to 401, 408, 409, 412, and 414 shown in the eighth embodiment shown in FIG. 30.

The tenth embodiment shown in FIG. 36 is different from the eighth embodiment shown in FIG. 30 in the point that it comprises a plurality #1-#n of the semiconductor lasers 601 and the optical receivers 606, 607, 608, and 609 because a plurality of central optical frequencies are required in the FDM transmission system. In this configuration, a plurality #1-#n of lines of transmission data are multiplexed and transmitted.

On the other hand, each of a half mirror 602, a Fabry-Perot interferometer 603 applied with a polarizer 612 internally and mirror coating 610 and 611 on both sides, a λ/4 plate 604, and a polarizer 605 are provided as in the case of the eighth embodiment shown in FIG. 30. Each backward.light from each semiconductor laser 601 (#1-#n) is spatially divided by n strings of optical fiber, thereby performing an optical treatment for each backward light using a set of above described optical system like in the case of the eighth embodiment.

Though skipped in FIG. 36, n units each of devices corresponding to the data modulator 402, bias unit 403, subtractor 410, negative feedback unit 411, comparator 413, and APC controller 415 of the eighth embodiment shown in FIG. 30 are provided.

In the above configuration, without the low frequency modulating operation using a low frequency oscillator or the synchronous detecting operation using a synchronous detecting circuit, each operating point of each laser light (central optical frequency) of each semiconductor laser 601 can be set at n points of maximum values at equal intervals in one optical frequency characteristics using one unit of the Fabry-Perot interferometer 603, or all laser light operation can be synchronized to one maximum value. This technology can be applicable to the operation of the interferometer in the nineth embodiment.

The above described automatic frequency control (AFC) enables the stabilization of the optical frequency deviation to a predetermined value for each laser light of each semiconductor laser 601.

Figure 37:
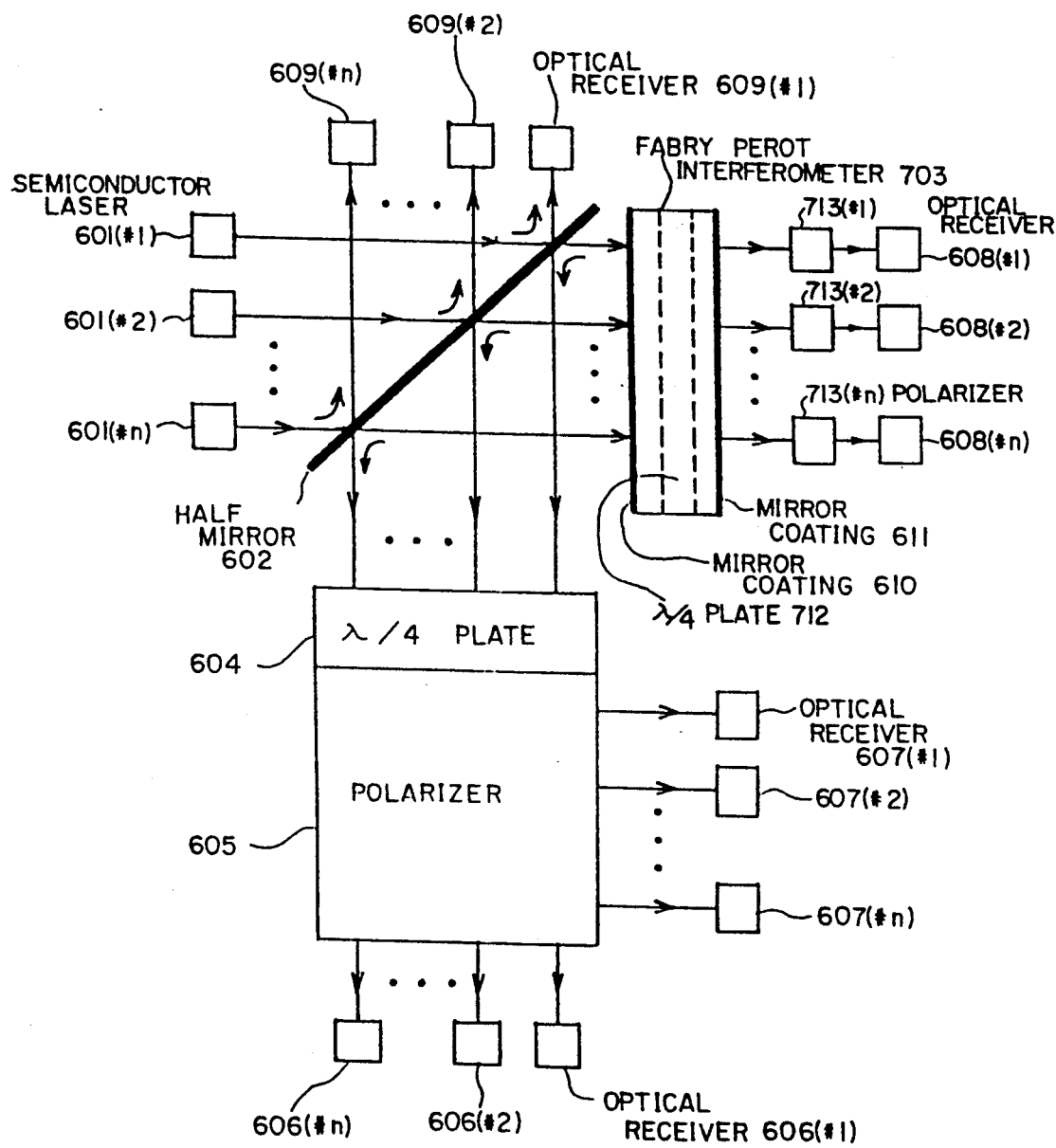
FIG. 37 is a block diagram of a eleventh embodiment of the present invention.

Finally, FIG. 37 shows a block diagram of a eleventh embodiment of the present invention. In FIG. 37, all parts assigned the same numbers as those assigned to the tenth embodiment shown in FIG. 36 have the same functions respectively.

This embodiment has an extended configuration of the ninth embodiment shown in FIG. 33 for use in the FDM transmission system or in a plurality of transmission processes at the same optical frequency.

The eleventh embodiment is different from the tenth embodiment in the point that the polarizer 612 is replaced with the λ/4 plate 712 in the Fabry-Perot interferometer 703, and that a plurality #1-#n of polarizers 713 are provided between the Fabry-Perot interferometer 703 and a plurality #1-#n on optical receiver 608. In the eleventh embodiment, like in the theth embodiment, transmission data of a plurality #1 -#n of transmission lines are multiplexed and transmitted.

What is claimed is:

1. An optical frequency deviation measure and control device for a laser light for measuring and controlling the deviations of the optical frequency of a laser light source emitting light subjected to frequency or phase modulation according to an inputted modulation signal, said device comprising:
    a light interference means responsive to laser light subjected to frequency or phase modulation according to inputted data, for outputting interference light dependent on optical frequency discriminating characteristics;
    an optical receiving means responsive to said interference light for converting light intensity to an electrical signal;
    an operating point stabilizing means responsive to said electrical signal for causing an operating point of said laser light to correspond to the optical frequency corresponding to the maximum or minimum value of said optical frequency discriminating characteristics; and
    an optical frequency deviation measuring means for detecting the deviation of an optical frequency from an average value of light intensity of said interference light obtained from an electrical signal from said optical receiving means under the stabilization control of an operating point of said laser light by said operating point stabilizing means, or an optical frequency deviation stabilizing means for calculating an error value between said average value and a predetermined value and feeding back said error value to the modulation factor of said laser light.

2. An optical frequency deviation measure and control device for laser light according to claim 1, wherein said operating point stabilizing means comprises:
    an operating point detecting means for detecting the difference between the maximum or minimum value of frequency discriminating characteristics and an operating point of said laser light based on the electrical signal provided by said optical receiving means; and
    an operating point controlling means for applying feedback to the oscillation frequency of said laser light or the interference characteristics of said light interference means such that the operating point of said laser light corresponds to the optical frequency corresponding to the maximum or minimum value of said optical frequency discriminating characteristics based on to the output of said operating point detecting means.

3. An optical frequency deviation measure and control device for laser light according to claim 2, wherein said operating point detecting means comprises:
    a low frequency oscillating means for modifying the oscillation frequency of said laser light or the interference characteristics of said light interference means in a low frequency; and
    a synchronous detecting means for performing synchronous detection based on the oscillation output from said low frequency oscillating means and the electrical signal from said optical receiving means.

4. An optical frequency deviation measure and control device for laser light according to claim 2, wherein said operating point controlling means modifies a bias or temperature of a laser generating said laser light to vary the oscillation frequency of said laser light; or modifies a bias or temperature of said light interference means to vary the optical frequency discriminating characteristics such that the operating point of said laser light corresponds to the optical frequency corresponding to the maximum or minimum value of said optical frequency discriminating characteristics based on a synchronous detecting signal from said operating point detecting means.

5. An optical frequency deviation measure and control device for laser light according to claim 4, wherein When an oscillation frequency of said laser light is modified by said low frequency oscillating means, the variable width of the oscillation frequency is controlled by said error value obtained by said optical frequency deviation measuring means.

6. An optical frequency deviation measure and control device for laser light according to claim 2, wherein said operating point controlling means performs automatic frequency control on said laser light by applying bias or temperature feed back to the laser generating said laser light.

7. An optical frequency deviation measure and control means for laser light according to claim 2, wherein
    a marking rate motoring means measures a mark rate of said inputted data; and
    a mark rate obtained by said marking rate monitoring means is fed back to said operating point stabilizing means and said optical frequency deviation measuring means or said optical frequency deviation stabilizing means.

8. An optical frequency deviation measure and control device for laser light according to claim 1, wherein
    said laser light comprises a plurality of laser lights;
    said light interference means outputs an interference light in response to each of said laser lights;
    said optical receiving means responsive to each of said interference light converts each light intensity to an electrical signal;
    said operating point detecting means modifies the oscillation frequency of each of said laser light by varying the bias or temperature of each laser generating each of said laser light and performs synchronous detection of an electrical signal corresponding to each of said laser light;
    said operating point controlling means controls the bias or temperature of each laser generating each of said laser light such that each operating point of each said laser light corresponds to various maximum or minimum values of said optical frequency discriminating characteristics based on the detection results of said operating point detecting means; and
    said optical frequency deviation measuring means measures the deviation of the optical frequency of each laser light from an average value of light intensities of each of said interference light obtained from each electrical signal provided by said optical receiving means;

said optical frequency deviation stabilizing means calculates each error value between said average value and a predetermined value, and feeds back each of said error value to the modulation factor of each of said laser light.

9. An optical frequency deviation measure and control device for laser light according to claim 1, wherein
said laser light comprise a plurality of laser lights;
said light interference means outputs an interference light in response to each of said laser light;
said optical receiving means responsive to each of said interference light converts each light intensity to an electrical signal;
said operating point detecting means modifies the interference characteristics of said light interference means by varying the bias or temperature of said light interference means, and performs a synchronous detection of the electrical signal corresponding to each of said laser light;
said operating point controlling means controls a bias or temperature of each laser generating each of said laser light such that each operating point of each of said laser light corresponds to various maximum or minimum values of said optical frequency discriminating characteristics based on the detection results of said operating point detecting means; and
said optical frequency deviation measuring means measures the deviation of the optical frequency of each laser light from an average value of light intensities of each of said interference light obtained from each electrical signal provided by said optical receiving means;
said optical frequency deviation stabilizing means calculates each error value between said average value and a predetermined value, and feeds back each of said error value to the modulation factor of each of said laser light.

10. An optical frequency deviation measure and control device for laser light according to claim 9, wherein
said light interference means parallelly responsive to each of said spatially divided laser light outputs each of corresponding interference light; and
said optical receiving means comprises a plurality of optical receiving means parallelly responsive to each of said interference light parallelly outputted by said light interference means for converting each light's intensity to an electrical signal in a parallel manner.

11. An optical frequency deviation measure and control device for laser light according to any one of claims 8 or 9, wherein
said operating point detecting means, said operating point controlling means, and said optical frequency deviation stabilizing means perform controlling operation in response to each of said laser light according to each electrical signal provided by a plurality of said optical receiving means in a time divisional manner.

12. An optical frequency deviation measure and control device for laser light according to claim 1, wherein
said light interference means outputs two types of interference light, each having complementary optical frequency discriminating characteristics;
said optical receiving means comprises two units of optical receiving means responsive to each of said interference light for converting each light intensity to an electrical signal; and
said operating point stabilizing means and said optical frequency deviation measuring means or said optical frequency deviation stabilizing means are controlled by a difference signal of each electrical signals provided by each of said optical receiving means.

13. An optical frequency deviation measure and control device for a laser light according to any of claim 1, wherein
said light interference means outputs two types of interference light each having complementary optical frequency discriminating characteristics;
said optical receiving means comprises two units of optical receiving means responsive to each of said interference light for converting each light intensity to an electrical signal; and
an automatic light output controlling means is provided for feeding back the oscillation output of said laser light such that the oscillation output of said laser light is measured or stabilized to a predetermined value according to a sum signal of electrical signal of electrical signals provided by each of said optical receiving means.

14. An optical frequency deviation measure and control device for a laser light which measures an optical frequency deviation of a semiconductor laser producing light frequency-modulated or phase-modulated with an input modulating signal or controls the optical frequency deviation, comprising:
interferometer means responsive to application of output light from said semiconductor laser for outputting interference light depending on its optical frequency discriminating characteristic;
optical receiver means responsive to application of said interference light for converting its light intensity to an electric signal;
operating point setting means responsive to application of said electric signal for setting an operating point of said interferometer to correspond to an optical frequency corresponding to a maximum value or a minimum value of said optical frequency discriminating characteristic; and
optical frequency deviation detecting means for extracting a low-frequency component of the average light output intensity of said interference light which has been low-frequency modulated beforehand at said operating point by means of a synchronous detection and detecting an optical frequency deviation.

15. A device according to claim 14. in which said operating point setting means receives two complementary interference light components output from said interferometer by the use of two optical receivers and uses a difference component of output signals of said optical receivers as an operating point detecting signal and a sum component of the output signals of said optical receivers as a light output detecting signal for detecting light output of said semiconductor laser.

16. A device according to claim 15, in which said operating point setting means uses a difference component of output signals of said optical receivers as an operating point detecting signal, and the operating point detecting signal is fed back to a bias or temperature of said semiconductor laser to thereby perform stabilization of the operating point and the oscillation frequency of said semiconductor laser.

17. A device according to claim 15, in which said operating point setting means uses a difference component of output signals of said optical receivers as an operating point detecting signal and the operating point detecting signal is fed back to a bias or temperature of said interferometer to thereby perform stabilization of the operating point.

18. A device according to claim 14, in which said operating point setting means uses a sum component of output signals of said optical receivers as a light output detecting signal of said semiconductor laser and a difference signal between said light output detecting signal and a set value is fed back to a bias or temperature of said semiconductor laser to thereby perform stabilization of a light output of said semiconductor laser.

19. A device according to claim 14, in which said optical frequency deviation detecting means feeds a modulation signal for synchronous detection back to a bias or temperature of said interferometer.

20. A device according to claim 14, in which said optical frequency deviation detecting means feeds a modulation signal for synchronous detection back to a bias or temperature of said semiconductor laser.

21. A device according to claim 20, in which said optical frequency deviation detecting means feeds a modulation signal for a synchronous detection back to a bias or temperature of said semiconductor laser and feeds an optical frequency deviation detecting signal back to a modulation amplitude of the modulation signal, whereby an optical frequency deviation of an optical FM modulation by the modulation signal is kept constant and said optical frequency deviation detecting means is not affected by the variation efficiency of said semiconductor laser.

22. A device according to claim 14, further comprising a mark rate monitoring means for feeding a mark rate monitoring signal back to said optical frequency deviation detecting means so that it is not affected by a variation in mark rate in an input modulation signal.

23. An optical frequency deviation measure and control device for a laser light which measures an optical frequency deviation of a semiconductor laser producing light frequency-modulated or phase-modulated with an input modulating signal or controls the optical frequency deviation, comprising:
 interferometer means responsive to application of an output light from said semiconductor laser for outputting an interference light depending on its optical frequency discriminating characteristic;
 optical receiver means responsive to an application of said interference light for converting its light intensity to an electric signal;
 operating point setting means for detecting the operating point of said interferometer by extracting a low-frequency signal of said interference light which is low-frequency modulated by a bias of said semiconductor laser from said electric signal by means of synchronous detection and setting said operating point to correspond to an optical frequency corresponding to a maximum value or a minimum value of said optical frequency discriminating characteristic; and
 optical frequency deviation detecting means for extracting a low-frequency signal component produced at said operating point by means of synchronous detection and detecting an optical frequency deviation.

24. A device according to claim 23, in which two complementary interference light components output from said interferometer means are received by optical receivers and an operating point detecting signal and an optical frequency deviation detecting signal are extracted from a difference component of output signals of said receivers.

25. A device according to claim 24, in which a difference component of output signals of said receivers is used as an operating point detecting signal, and the operating point detecting signal is fed back to a bias or temperature of said semiconductor laser to thereby perform stabilization of the operating point and oscillation frequency of said semiconductor laser.

26. A device according to claim 24, in which a difference component of output signals of said receivers is used as an operating point detecting signal, and the operating point detecting signal is fed back to a bias or temperature of said interferometer to thereby perform stabilization of the operating point.

27. A device according to claim 23, in which two complementary interference light components output from said interferometer means are received by optical receivers, and a sum component of output signals of said receivers is used as a light output detecting signal of said semiconductor laser.

28. A device according to claim 27, in which a sum component of output signals of said receivers is used as a light output detecting signal of said semiconductor laser, and the light output detecting signal is fed back to a bias of said semiconductor laser to thereby perform stabilization of light output of said semiconductor laser.

29. A device according to claim 23, in which said operating point setting means superimposes a modulation signal for synchronous detection on a bias or temperature of said semiconductor laser.

30. A device according to claim 23, in which said operating point setting means superimposes modulation signals for synchronous detection on two or more semiconductor lasers to thereby perform stabilization control of an optical frequency and an optical frequency deviation on said semiconductor lasers in optical frequency-division multiplex transmission.

31. A device according to claim 30, in which said operating point setting means superimposes modulation signals for synchronous detection on two or more semiconductor laser in sequence to thereby perform stabilization control of optical frequency and optical frequency control on said semiconductor lasers.

32. A device according to claim 30, in which said operating point setting means superimposes modulation signals of different frequencies for synchronous detection on two or more semiconductor lasers to thereby perform simultaneous stabilization control of optical frequency and optical frequency control on said semiconductor lasers in a total manner.

33. A device according to claim 23, in which said operating point setting means superimposes a modulation signal for synchronous detection on a bias of said semiconductor laser and feeds an optical frequency deviation detecting signal back to modulation amplitude of the modulation signal, whereby an optical frequency deviation of optical FM modulation by the modulation signal is kept constant and said operating point setting means and said optical frequency deviation detecting means is not affected by the modulation efficiency of said semiconductor laser.

34. A device according to claim 23, in which said operating point setting means superimposes a modulation signal for synchronous detection on a bias or temperature of said interferometer 35. A device according to claim 23, further comprising mark rate monitor means for feeding a mark rate monitor signal back to said operating point setting means and said optical frequency deviation detecting means so that they are not affected by a variation in mark rate in a signal to be transmitted.

36. A device according to claim 23, in which said optical frequency deviation detecting means extracts a signal whose frequency is twice that of the low-frequency signal of said interference light which has been low-frequency modulated beforehand by means of synchronous detection and detects an optical frequency deviation.

37. An optical frequency deviation measure and control device for a laser light for measuring and controlling the deviation of optical frequency of a laser light source emitting light subject to frequency or phase modulation according to an inputted modulation signal, said device comprising:

an optical interference means responsive to the laser light subjected to frequency or phase modulation according to input data and provided internally with a first polarizer for outputting interference light dependent on optical frequency discriminating characteristics;

a first λ/4 plate and second polarizer sequentially arranged responsive to reflected light from said interference means;

a first and second optical receiving means responsive to two types of light from said second polarizer for converting each light intensity to an electrical signal;

a feedback means for applying feedback, according to the information obtained by the difference between electrical signals of said first and second optical receiving means, to the oscillating frequency of said laser light or to the interference characteristics of said optical interference means such that an operating point of said laser light corresponds to the optical frequency corresponding to the maximum or minimum value of said optical frequency characteristics;

a third optical receiving means responsive to transmitted light from said optical interference means for converting the light intensity to an electrical signal;

an optical frequency deviation measuring means for detecting the deviation of optical frequency from an average value of light intensity of said transmitted light obtained according to an electrical signal provided by said third optical receiving means during the stabilization control of an operating point of said laser light by said feedback means; and an optical frequency deviation stabilizing means for calculating the difference between said average value and a predetermined value to feedback said difference to the modulation factor of said laser light.

38. A modulation control device for a semiconductor laser according to claim 37, wherein said laser light is a plurality of laser light;

said optical interference means outputs interference light in response to each of said laser light;

said first λ/4 plate and second polarizer receives each of reflected light corresponding to each of said laser light from said optical interference means;

said first and second optical receiving means respectively receive light corresponding to each of said two types of laser light from said second polarizer and convert each of light intensity to an electrical signal;

said feedback means performs automatic frequency control of each of said laser light by controlling the bias of each laser generating each of said laser light or the temperature, according to the information obtained by the difference between electrical signals provided by said first and second optical receiving means, such that an operating point of each of said laser light corresponds to the maximum or minimum value of optical frequency discriminating characteristics;

said third optical receiving means receives transmitted light corresponding to each of said laser light from said optical interference means and converts each light intensity to an electrical signal;

said optical frequency deviation measuring means measures the deviation of optical frequency from an average value of light intensity of each of said transmitted light obtained according to each of electrical signals provided by said third optical receiving means; and said optical frequency stabilizing means calculates each of differences between said average value and predetermined value and feeds back each of said differences to the modulation factor of each of said laser light.

39. An optical frequency deviation measure and control device for a laser light for measuring and controlling the deviation of optical frequency of a laser light source emitting light subject to frequency or phase modulation according to an inputted modulation signal, said device comprising:

an optical interference means responsive to laser light subjected to frequency or phase modulation according to input data and internally provided with a second λ/4 plate for outputting interference light dependent on optical frequency discriminating characteristics;

a first λ/4 plate and second polarizer sequentially arranged in response to reflected light from said optical interference means;

a first and second optical receiving means for converting each of light intensity to an electrical signal in response to each of two types of light from said second polarizer;

a feedback means for applying feedback, according to the information obtained by the difference between electrical signals of said first and second optical receiving means, to the oscillating frequency of said laser light or to the interference characteristics of said optical interference means such that an operating point of said laser light corresponds to the optical frequency corresponding to the maximum or minimum value of said optical frequency characteristics;

a third polarizer responsive to transmitted light from said light interference means;

a third optical receiving means for converting light intensity to an electrical signal in response to at least one type of light from said third polarizer;

an optical frequency deviation measuring means for detecting the deviation of optical frequency from an average value of light intensity of said transmitted light obtained according to an electrical signal provided by said third optical receiving means during the stabilization control of an operating point of said laser light by said feedback means; and an optical frequency deviation stabilizing means for calculating the difference between said average value and a predetermined value to feedback said difference to the modulation factor of said laser light.

40. A modulation control device for a semiconductor laser according to claim 39, wherein said laser light is a plurality of laser light;

said light interference means outputs interference light in response to each of said laser light;

said first λ/4 and second polarizer receive each of reflected light corresponding to each of said laser light from said light interference means;

said first and second optical receiving means receive light corresponding to two types of each of laser light from said second polarizer and convert each light intensity to an electrical signal;

said feedback means performs automatic frequency control of each of said laser light by controlling the bias of each laser generating each of said laser light or the temperature, according to the information obtained by the difference between electrical signals provided by said first and second optical receiving means, such that an operating point of each of said laser light corresponds to the maximum or minimum value of optical frequency discriminating characteristics;

said third polarizer receives each of transmitted light corresponding to each of said laser light from said light interference means;

said third optical receiving means receives light corresponding to at least one type of each of said laser light from said third polarizer and converts each light intensity to an electrical signal;

said optical frequency deviation measuring means measures the deviation of optical frequency from an average value of light intensity of each of said transmitted light obtained according to each of electrical signals provided by said third optical receiving means; and said optical frequency stabilizing means calculates each of differences between said average value and predetermined value and feeds back each of said differences to the modulation factor of each of said laser light.

41. An optical frequency deviation measure and control device for a laser light according to claims 40 comprising:

an automatic light output control means for applying feedback to the oscillating output of said laser light according to a part of said laser light or an electrical signal provided by said third optical receiving means such that the oscillating output of said laser light can be stabilized to a predetermined value.

* * * * *

UNITED STATES PATENT AND TRADEMARK OFFICE
CERTIFICATE OF CORRECTION

PATENT NO. : 5,200,967
DATED : APRIL 6, 1993
INVENTOR(S) : HIDEYUKI MIYATA ET AL.

It is certified that error appears in the above-identified patent and that said Letters Patent is hereby corrected as shown below:

On the Title Page, Item [56];
    Col. 2, line 14, "Sep. 1981" should be --Sep. 1987--.

Col. 32, line 44 (formula (1)), "$\exp(i\theta)\}$" should be --$\exp(i\delta)\}$--;

line 45, (formula (1)), "$\exp(i\theta)$" should be --$\exp(i\delta)$--.

Col. 33, line 35, (formula (6)), "$\cos(\theta 1)$" should be --$\cos(\delta 1)$--;

line 36, (formula (6)), "$\exp(i\theta)$" should be --$\exp(i\delta)$--.

Signed and Sealed this

Twelfth Day of July, 1994

Attest:

BRUCE LEHMAN

Attesting Officer      *Commissioner of Patents and Trademarks*